United States Patent
Onodera

(10) Patent No.: US 8,504,332 B2
(45) Date of Patent: Aug. 6, 2013

(54) COMPUTER PRODUCT, DESIGN SUPPORT APPARATUS, AND DESIGN SUPPORT METHOD

(75) Inventor: Mitsuru Onodera, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 561 days.

(21) Appl. No.: 12/792,979

(22) Filed: Jun. 3, 2010

(65) Prior Publication Data

US 2010/0318341 A1 Dec. 16, 2010

(30) Foreign Application Priority Data

Jun. 15, 2009 (JP) .................................. 2009-142693

(51) Int. Cl.
*G06F 17/50* (2006.01)
*H01L 21/82* (2006.01)

(52) U.S. Cl.
USPC ...... 703/2; 703/13; 703/17; 703/19; 716/106; 716/108; 716/113

(58) Field of Classification Search
USPC ..................... 703/2, 14, 18, 19; 716/108, 113, 716/4, 6, 106
See application file for complete search history.

(56) References Cited

U.S. PATENT DOCUMENTS

| | | | | |
|---|---|---|---|---|
| 5,371,801 A | * | 12/1994 | Powers et al. ............... | 381/71.13 |
| 6,158,022 A | * | 12/2000 | Avidan ............................ | 714/33 |
| 6,622,291 B1 | * | 9/2003 | Ginetti ........................... | 716/108 |
| 7,043,709 B2 | * | 5/2006 | Levy ............................... | 716/113 |
| 8,302,046 B1 | * | 10/2012 | Keller et al. ................... | 716/108 |
| 2002/0188915 A1 | * | 12/2002 | Hayes ............................... | 716/4 |
| 2004/0060019 A1 | * | 3/2004 | Secatch et al. .................... | 716/6 |
| 2004/0268276 A1 | * | 12/2004 | Sheehan ........................... | 716/4 |
| 2008/0071506 A1 | * | 3/2008 | Friedman et al. ................. | 703/5 |

FOREIGN PATENT DOCUMENTS

| | | |
|---|---|---|
| JP | 9-257880 A | 10/1997 |
| JP | 10-198720 A | 7/1998 |
| JP | 2000-276501 A | 10/2000 |

* cited by examiner

*Primary Examiner* — Thai Phan
(74) *Attorney, Agent, or Firm* — Fujitsu Patent Center

(57) ABSTRACT

A non-transitory computer-readable recording medium stores therein a program that causes a processor to execute inputting a driving capability value, a lumped-constant capacitance value, and an input capacitance value included in the lumped-constant capacitance value, respectively defined in a circuit model, and further inputting a first delay time of the circuit model, based on the driving capability value and the lumped-constant capacitance value; setting in the circuit model, the driving capability value, the lumped-constant capacitance value, and the input capacitance value; acquiring a second delay time of the circuit model, by providing to a simulator, the circuit model having values set therein; calculating a relative evaluation value for the first delay time and the second delay time; and storing to a storage apparatus and as a delay time correcting coefficient, the relative evaluation value correlated with the driving capability value, the lumped-constant capacitance value, and the input capacitance value.

16 Claims, 41 Drawing Sheets

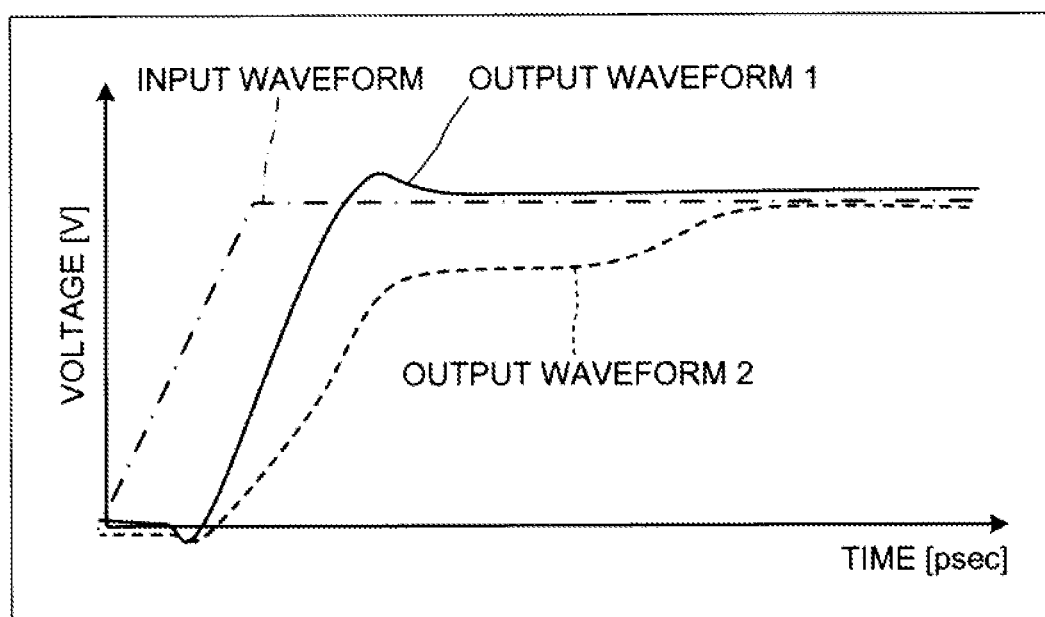

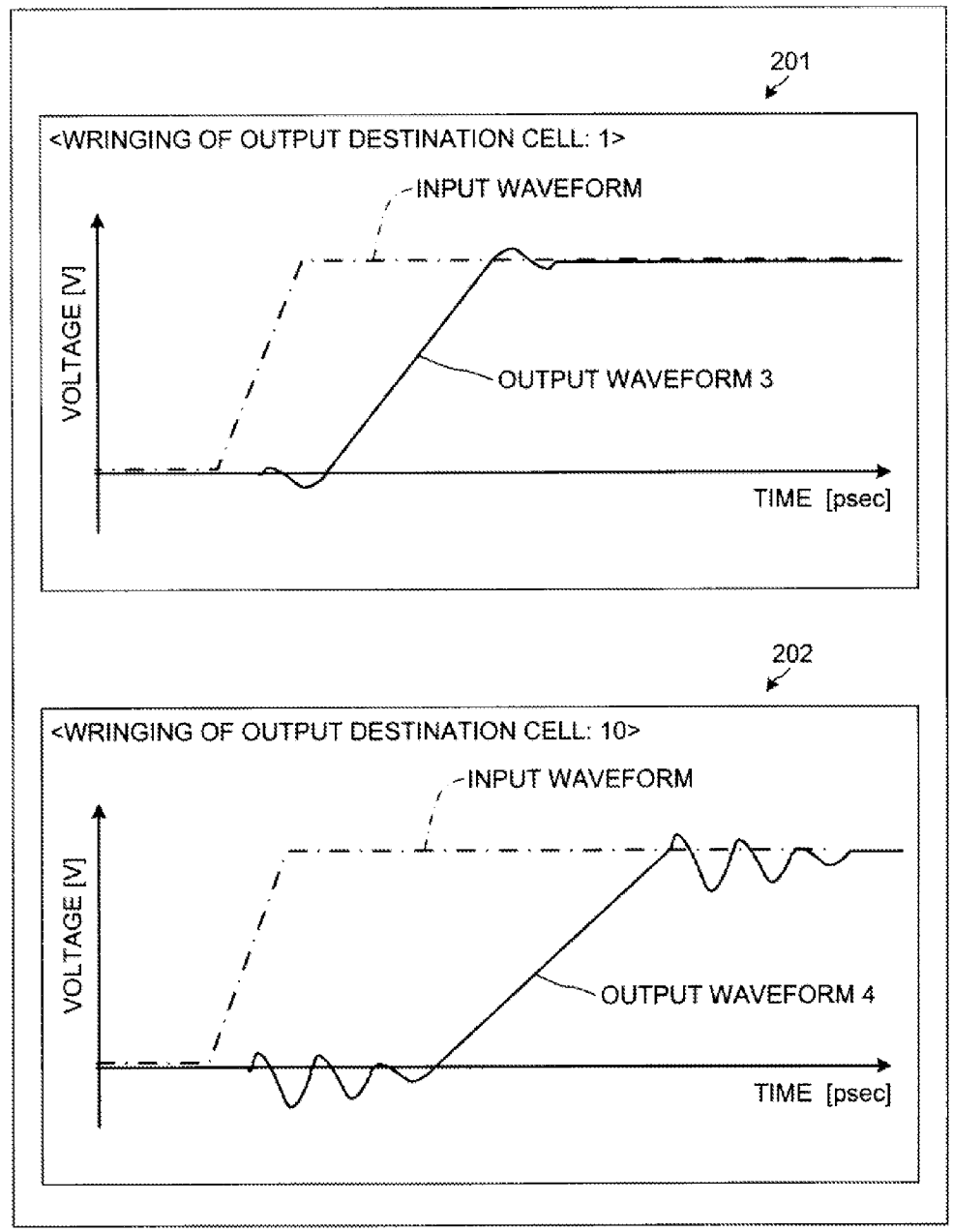

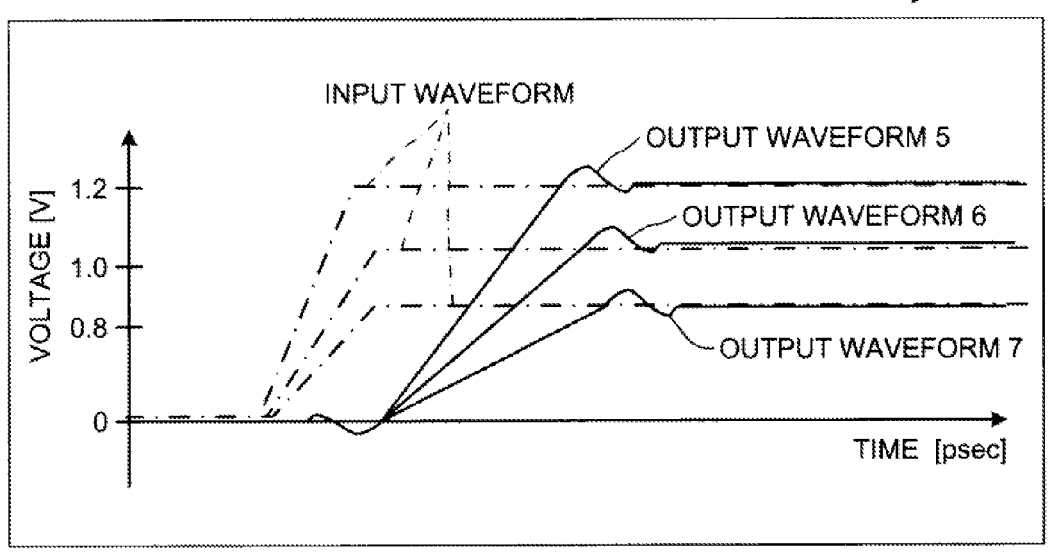

| INPUT CAPACITANCE | LUMPED-CONSTANT CAPACITANCE | LINE CAPACITANCE |
|---|---|---|
| 2 | 8 | 6 |
| 2 | 16 | 14 |
| 2 | 32 | 30 |
| 2 | 64 | 62 |
| 2 | 128 | 126 |
| 4 | 8 | 4 |
| 4 | 16 | 12 |
| 4 | 32 | 28 |
| 4 | 64 | 60 |
| 4 | 128 | 124 |
| 8 | 8 | 0 |
| 8 | 16 | 8 |
| 8 | 32 | 24 |
| 8 | 64 | 56 |
| 8 | 128 | 120 |
| 16 | 8 | 0 |
| 16 | 16 | 0 |
| 16 | 32 | 16 |
| 16 | 64 | 48 |
| 16 | 128 | 112 |
| 32 | 8 | 0 |
| 32 | 16 | 0 |
| 32 | 32 | 0 |
| 32 | 64 | 32 |
| 32 | 128 | 96 |

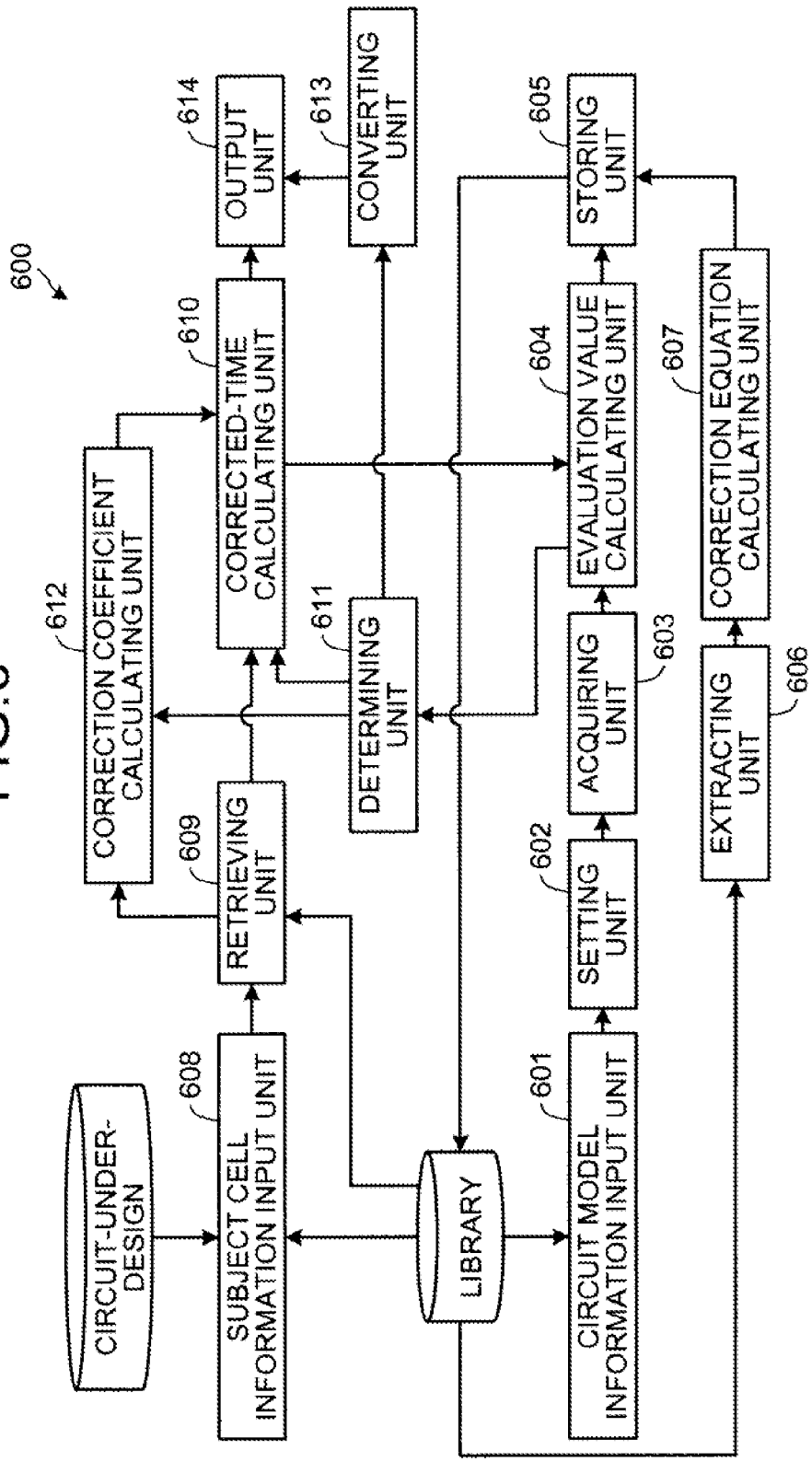

FIG.7A

<FIRST DELAY TIME> 700

| DRIVING CAPABILITY VALUE | INPUT WAVE-FORM | PTV CONDI-TION | INPUT-THROUGH TIME [psec] | Ctotal [fF] | | | | |
|---|---|---|---|---|---|---|---|---|
| | | | | 8 | 16 | 32 | 64 | 128 |
| 8 | RIS-ING | FAST CONDI-TION | 0.6 | 48 | 82 | 150 | 286 | 557 |
| | | | 6 | 49 | 83 | 151 | 287 | 558 |
| | | | 60 | 56 | 89 | 157 | 293 | 564 |
| | | | 600 | 54 | 90 | 160 | 296 | 567 |
| | | SLOW CONDI-TION | 0.6 | 395 | 653 | 1168 | 2199 | 4260 |
| | | | 6 | 398 | 656 | 1171 | 2201 | 4262 |
| | | | 60 | 428 | 686 | 1201 | 2231 | 4292 |
| | | | 600 | 723 | 982 | 1497 | 2528 | 4589 |
| | | TYP CONDI-TION | 0.6 | 88 | 148 | 268 | 508 | 988 |
| | | | 6 | 90 | 150 | 270 | 510 | 990 |
| | | | 60 | 107 | 168 | 288 | 528 | 1007 |
| | | | 600 | 159 | 219 | 339 | 579 | 1059 |

<SECOND DELAY TIME> 701

| DRIVING CAPABILITY VALUE | INPUT WAVE-FORM | PTV CONDI-TION | INPUT-THROUGH TIME [psec] | Ctotal [fF] (Ctr = 16 fF) | | | | |
|---|---|---|---|---|---|---|---|---|
| | | | | 8 | 16 | 32 | 64 | 128 |
| 8 | RIS-ING | FAST CONDI-TION | 0.6 | 49 | 89 | 172 | 335 | 706 |
| | | | 6 | 51 | 90 | 173 | 336 | 707 |
| | | | 60 | 57 | 96 | 179 | 342 | 713 |
| | | | 600 | 58 | 99 | 183 | 346 | 716 |
| | | SLOW CONDI-TION | 0.6 | 336 | 518 | 889 | 1648 | 3208 |
| | | | 6 | 338 | 521 | 892 | 1651 | 3211 |
| | | | 60 | 369 | 551 | 922 | 1681 | 3241 |
| | | | 600 | 664 | 847 | 1218 | 1978 | 3537 |
| | | TYP CONDI-TION | 0.6 | 81 | 134 | 254 | 535 | 1097 |
| | | | 6 | 83 | 135 | 256 | 536 | 1098 |
| | | | 60 | 100 | 153 | 274 | 554 | 1116 |
| | | | 600 | 153 | 205 | 325 | 606 | 1167 |

<DELAY TIME CORRECTING COEFFICIENT> 702

| DRIVING CAPABILITY VALUE | INPUT WAVE-FORM | PTV CONDI-TION | INPUT-THROUGH TIME [psec] | Ctotal [fF] (Ctr = 16 fF) | | | | |
|---|---|---|---|---|---|---|---|---|
| | | | | 8 | 16 | 32 | 64 | 128 |
| 8 | RIS-ING | FAST CONDI-TION | 0.6 | 1.02 | 1.08 | 1.14 | 1.17 | 1.27 |
| | | | 6 | 1.02 | 1.08 | 1.14 | 1.17 | 1.27 |
| | | | 60 | 1.02 | 1.07 | 1.14 | 1.17 | 1.26 |
| | | | 600 | 1.06 | 1.10 | 1.14 | 1.17 | 1.26 |
| | | SLOW CONDI-TION | 0.6 | 0.85 | 0.79 | 0.76 | 0.75 | 0.75 |
| | | | 6 | 0.85 | 0.79 | 0.76 | 0.75 | 0.75 |
| | | | 60 | 0.86 | 0.80 | 0.77 | 0.75 | 0.76 |
| | | | 600 | 0.92 | 0.86 | 0.81 | 0.78 | 0.77 |
| | | TYP CONDI-TION | 0.6 | 0.92 | 0.90 | 0.95 | 1.05 | 1.11 |
| | | | 6 | 0.92 | 0.90 | 0.95 | 1.05 | 1.11 |
| | | | 60 | 0.93 | 0.91 | 0.95 | 1.05 | 1.11 |
| | | | 600 | 0.96 | 0.93 | 0.96 | 1.05 | 1.10 |

FIG.7B

<FIRST OUTPUT-THROUGH TIME> 703

| DRIVING CAPABILITY VALUE | INPUT WAVE-FORM | PTV CONDI-TION | INPUT-THROUGH TIME [psec] | Ctotal [fF] | | | | |
|---|---|---|---|---|---|---|---|---|
| | | | | 8 | 16 | 32 | 64 | 128 |
| 8 | RIS-ING | FAST CONDI-TION | 0.6 | 54 | 102 | 198 | 391 | 777 |
| | | | 6 | 54 | 102 | 198 | 391 | 777 |
| | | | 60 | 54 | 102 | 198 | 391 | 777 |
| | | | 600 | 67 | 112 | 206 | 395 | 778 |
| | | SLOW CONDI-TION | 0.6 | 419 | 786 | 1519 | 2985 | 5917 |
| | | | 6 | 419 | 786 | 1519 | 2985 | 5917 |
| | | | 60 | 419 | 786 | 1519 | 2985 | 5917 |
| | | | 600 | 420 | 786 | 1519 | 2985 | 5917 |
| | | TYP CONDI-TION | 0.6 | 98 | 185 | 358 | 706 | 1401 |
| | | | 6 | 98 | 185 | 358 | 706 | 1401 |
| | | | 60 | 98 | 185 | 358 | 706 | 1401 |
| | | | 600 | 102 | 187 | 360 | 706 | 1401 |

<SECOND OUTPUT-THROUGH TIME> 704

| DRIVING CAPABILITY VALUE | INPUT WAVE-FORM | PTV CONDI-TION | INPUT-THROUGH TIME [psec] | Ctotal [fF] (Ctr = 16 fF) | | | | |
|---|---|---|---|---|---|---|---|---|
| | | | | 8 | 16 | 32 | 64 | 128 |
| 8 | RIS-ING | FAST CONDI-TION | 0.6 | 76 | 136 | 258 | 500 | 984 |
| | | | 6 | 76 | 137 | 258 | 500 | 984 |
| | | | 60 | 76 | 137 | 258 | 500 | 984 |
| | | | 600 | 92 | 149 | 267 | 505 | 986 |
| | | SLOW CONDI-TION | 0.6 | 550 | 1035 | 2027 | 3829 | 7397 |
| | | | 6 | 550 | 1035 | 2027 | 3829 | 7397 |
| | | | 60 | 550 | 1035 | 2027 | 3829 | 7397 |
| | | | 600 | 550 | 1035 | 2027 | 3829 | 7397 |
| | | TYP CONDI-TION | 0.6 | 140 | 248 | 464 | 896 | 1759 |
| | | | 6 | 140 | 248 | 464 | 896 | 1759 |
| | | | 60 | 140 | 248 | 464 | 896 | 1759 |
| | | | 600 | 145 | 251 | 466 | 896 | 1759 |

<OUTPUT-THROUGH TIME CORRECTING COEFFICIENT> 705

| DRIVING CAPABILITY VALUE | INPUT WAVE-FORM | PTV CONDI-TION | INPUT-THROUGH TIME [psec] | Ctotal [fF] (Ctr = 16 fF) | | | | |
|---|---|---|---|---|---|---|---|---|
| | | | | 8 | 16 | 32 | 64 | 128 |
| 8 | RIS-ING | FAST CONDI-TION | 0.6 | 1.42 | 1.34 | 1.30 | 1.28 | 1.27 |
| | | | 6 | 1.41 | 1.34 | 1.30 | 1.28 | 1.27 |
| | | | 60 | 1.41 | 1.34 | 1.30 | 1.28 | 1.27 |
| | | | 600 | 1.37 | 1.33 | 1.30 | 1.28 | 1.27 |
| | | SLOW CONDI-TION | 0.6 | 1.31 | 1.32 | 1.33 | 1.28 | 1.25 |
| | | | 6 | 1.31 | 1.32 | 1.33 | 1.28 | 1.25 |
| | | | 60 | 1.31 | 1.32 | 1.33 | 1.28 | 1.25 |
| | | | 600 | 1.31 | 1.32 | 1.33 | 1.28 | 1.25 |
| | | TYP CONDI-TION | 0.6 | 1.43 | 1.34 | 1.29 | 1.27 | 1.26 |
| | | | 6 | 1.43 | 1.34 | 1.29 | 1.27 | 1.26 |
| | | | 60 | 1.43 | 1.34 | 1.29 | 1.27 | 1.26 |
| | | | 600 | 1.43 | 1.34 | 1.29 | 1.27 | 1.26 |

FIG.15

| FUNCTION 1501 | CELL NAME 1502 | DRIVING CAPACITANCE VALUE 1503 | INPUT CAPACITANCE VALUE Ctr 1504 |
|---|---|---|---|
| BUFFER | BUFFER1 | 1 | 5 |
| | BUFFER2 | 2 | 10 |
| | BUFFER4 | 4 | 20 |
| | BUFFER8 | 8 | 30 |
| | BUFFER16 | 16 | 30 |
| | BUFFER32 | 32 | 30 |
| AND | AND1 | 1 | 5 |
| | AND2 | 2 | 10 |
| | AND4 | 4 | 20 |
| | AND8 | 8 | 30 |
| | AND16 | 16 | 30 |
| | AND32 | 32 | 30 |
| OR | OR1 | 1 | 5 |
| | OR2 | 2 | 10 |
| | OR4 | 4 | 20 |
| | OR8 | 8 | 30 |
| | OR16 | 16 | 30 |
| | OR32 | 32 | 30 |
| EXOR | EXOR1 | 1 | 5 |
| | EXOR2 | 2 | 10 |
| | EXOR4 | 4 | 20 |
| | EXOR8 | 8 | 30 |
| | EXOR16 | 16 | 30 |
| | EXOR32 | 32 | 30 |
| INVERTER | INVERTER1 | 1 | 5 |
| | INVERTER2 | 2 | 10 |
| | INVERTER4 | 4 | 20 |
| | INVERTER8 | 8 | 30 |
| | INVERTER16 | 16 | 30 |
| | INVERTER32 | 32 | 30 |
| MULTIPLEXER | MULTIPLEXER1 | 1 | 5 |
| | MULTIPLEXER2 | 2 | 10 |
| | MULTIPLEXER4 | 4 | 20 |
| | MULTIPLEXER8 | 8 | 30 |
| | MULTIPLEXER16 | 16 | 30 |
| | MULTIPLEXER32 | 32 | 30 |
| NAND | NAND1 | 1 | 5 |
| | NAND2 | 2 | 10 |
| | NAND4 | 4 | 20 |
| | NAND8 | 8 | 30 |
| | NAND16 | 16 | 30 |
| | NAND32 | 32 | 30 |
| NOR | NOR1 | 1 | 5 |
| | NOR2 | 2 | 10 |
| | NOR4 | 4 | 20 |
| | NOR8 | 8 | 30 |
| | NOR16 | 16 | 30 |
| | NOR32 | 32 | 30 |

1500

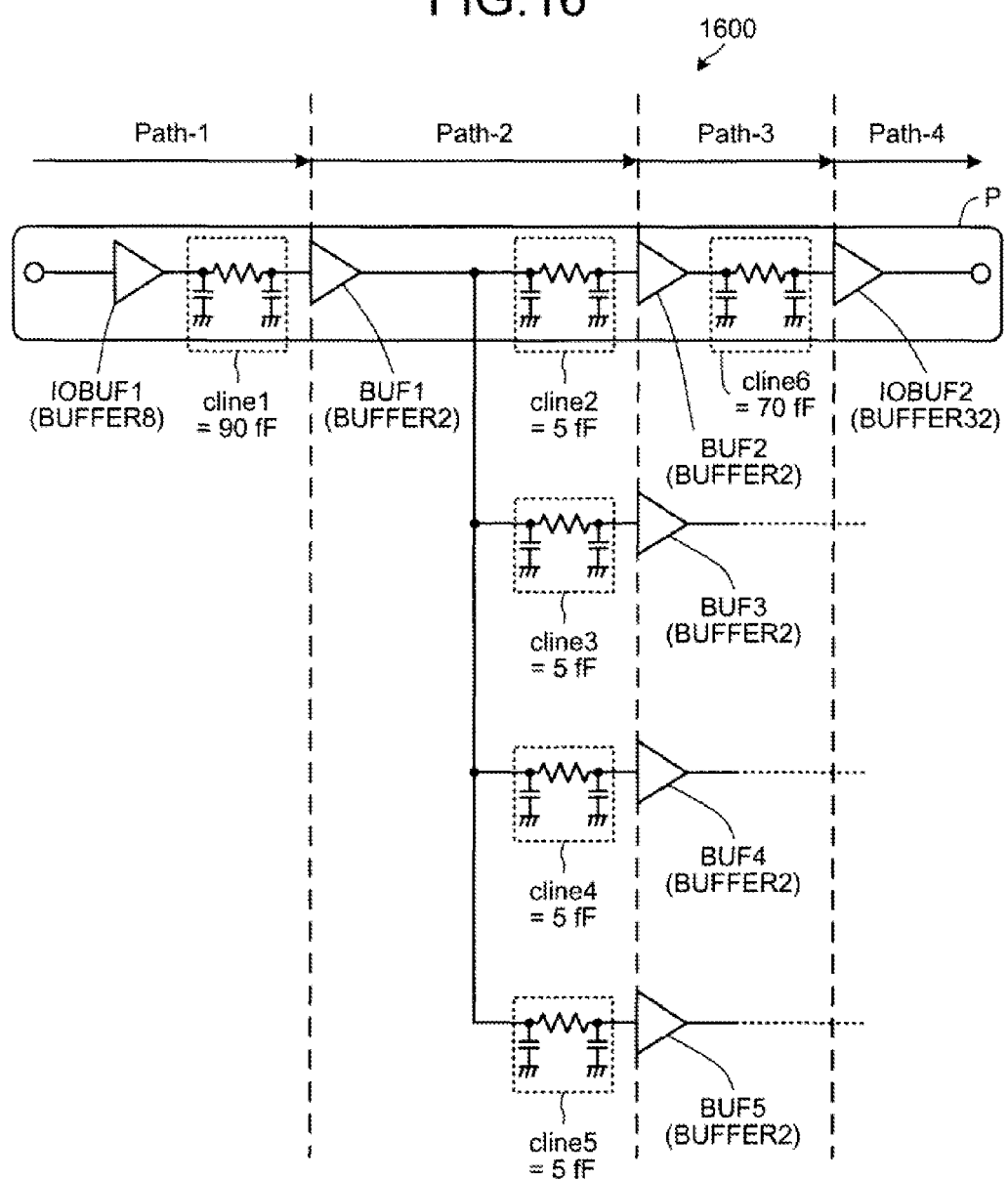

FIG.17A

| PTV CONDITION | PROCESS | TEMPERATURE [°C] | VOLTAGE [V] |
|---|---|---|---|
| TYP CONDITION | TYP | 25 | 1.2 |
| FAST CONDITION | FAST | -40 | 1.3 |
| SLOW CONDITION | SLOW | 120 | 1.1 |

FIG.17B

| | |
|---|---|
| EXTERNAL INPUT-THROUGH TIME | 100 psec |
| EXTERNAL LOAD CAPACITANCE VALUE | 100 fF |
| OPERATING FREQUENCY INFORMATION | 2 GHz, 1 GHz, 100 MHz, 10 MHz |

FIG.18A

| CELL NAME | TYP CONDITION | | | | FAST CONDITION | | | | SLOW CONDITION | | | |
|---|---|---|---|---|---|---|---|---|---|---|---|---|
| | | | | unit [psec] | | | | unit [psec] | | | | unit [psec] |
| BUFFER2 | INPUT-THROUGH TIME [psec] | Ctotal [fF] | | | INPUT-THROUGH TIME [psec] | Ctotal [fF] | | | INPUT-THROUGH TIME [psec] | Ctotal [fF] | | |
| | | 1.00 | 10.00 | 100.00 | | 1.00 | 10.00 | 100.00 | | 1.00 | 10.00 | 100.00 |
| | 1.00 | 160.00 | 185.00 | 280.00 | 1.00 | 133.33 | 154.17 | 233.33 | 1.00 | 192.00 | 222.00 | 336.00 |
| | 10.00 | 180.00 | 195.00 | 290.00 | 10.00 | 150.00 | 162.50 | 241.67 | 10.00 | 216.00 | 234.00 | 348.00 |
| | 100.00 | 185.00 | 200.00 | 295.00 | 100.00 | 154.17 | 166.67 | 245.83 | 100.00 | 222.00 | 240.00 | 354.00 |
| BUFFER4 | INPUT-THROUGH TIME [psec] | Ctotal [fF] | | | INPUT-THROUGH TIME [psec] | Ctotal [fF] | | | INPUT-THROUGH TIME [psec] | Ctotal [fF] | | |
| | | 1.00 | 10.00 | 100.00 | | 1.00 | 10.00 | 100.00 | | 1.00 | 10.00 | 100.00 |
| | 1.00 | 100.00 | 125.00 | 220.00 | 1.00 | 83.33 | 104.17 | 183.33 | 1.00 | 120.00 | 150.00 | 264.00 |
| | 10.00 | 120.00 | 135.00 | 230.00 | 10.00 | 100.00 | 112.50 | 191.67 | 10.00 | 144.00 | 162.00 | 276.00 |
| | 100.00 | 125.00 | 140.00 | 235.00 | 100.00 | 104.17 | 116.67 | 195.83 | 100.00 | 150.00 | 168.00 | 282.00 |
| BUFFER8 | INPUT-THROUGH TIME [psec] | Ctotal [fF] | | | INPUT-THROUGH TIME [psec] | Ctotal [fF] | | | INPUT-THROUGH TIME [psec] | Ctotal [fF] | | |
| | | 1.00 | 10.00 | 100.00 | | 1.00 | 10.00 | 100.00 | | 1.00 | 10.00 | 100.00 |
| | 1.00 | 60.00 | 85.00 | 180.00 | 1.00 | 50.00 | 70.83 | 150.00 | 1.00 | 72.00 | 102.00 | 216.00 |
| | 10.00 | 80.00 | 95.00 | 190.00 | 10.00 | 66.67 | 79.17 | 158.33 | 10.00 | 96.00 | 114.00 | 228.00 |
| | 100.00 | 85.00 | 100.00 | 195.00 | 100.00 | 70.83 | 83.33 | 162.50 | 100.00 | 102.00 | 120.00 | 234.00 |
| BUFFER32 | INPUT-THROUGH TIME [psec] | Ctotal [fF] | | | INPUT-THROUGH TIME [psec] | Ctotal [fF] | | | INPUT-THROUGH TIME [psec] | Ctotal [fF] | | |
| | | 1.00 | 10.00 | 100.00 | | 1.00 | 10.00 | 100.00 | | 1.00 | 10.00 | 100.00 |
| | 1.00 | 20.00 | 30.00 | 60.00 | 1.00 | 16.67 | 25.00 | 50.00 | 1.00 | 24.00 | 36.00 | 72.00 |
| | 10.00 | 30.00 | 40.00 | 50.00 | 10.00 | 25.00 | 33.33 | 41.67 | 10.00 | 36.00 | 48.00 | 60.00 |
| | 100.00 | 40.00 | 50.00 | 60.00 | 100.00 | 33.33 | 41.67 | 50.00 | 100.00 | 48.00 | 60.00 | 72.00 |

| CELL NAME | TYP CONDITION | | | | FAST CONDITION | | | | SLOW CONDITION | | | |
|---|---|---|---|---|---|---|---|---|---|---|---|---|
| | INPUT-THROUGH TIME [psec] | Ctotal [fF] unit [psec] | | | INPUT-THROUGH TIME [psec] | Ctotal [fF] unit [psec] | | | INPUT-THROUGH TIME [psec] | Ctotal [fF] unit [psec] | | |
| | | 1.00 | 10.00 | 100.00 | | 1.00 | 10.00 | 100.00 | | 1.00 | 10.00 | 100.00 |
| BUFFER2 | 1.00 | 70.00 | 80.00 | 150.00 | 1.00 | 58.33 | 66.67 | 125.00 | 1.00 | 84.00 | 96.00 | 180.00 |
| | 10.00 | 75.00 | 85.00 | 160.00 | 10.00 | 62.50 | 70.83 | 133.33 | 10.00 | 90.00 | 102.00 | 192.00 |
| | 100.00 | 80.00 | 95.00 | 170.00 | 100.00 | 66.67 | 79.17 | 141.67 | 100.00 | 96.00 | 114.00 | 204.00 |
| BUFFER4 | 1.00 | 50.00 | 60.00 | 140.00 | 1.00 | 41.67 | 50.00 | 116.67 | 1.00 | 60.00 | 72.00 | 168.00 |
| | 10.00 | 60.00 | 70.00 | 150.00 | 10.00 | 50.00 | 58.33 | 125.00 | 10.00 | 72.00 | 84.00 | 180.00 |
| | 100.00 | 65.00 | 75.00 | 155.00 | 100.00 | 54.17 | 62.50 | 129.17 | 100.00 | 78.00 | 90.00 | 186.00 |
| BUFFER8 | 1.00 | 10.00 | 20.00 | 100.00 | 1.00 | 8.33 | 16.67 | 83.33 | 1.00 | 12.00 | 24.00 | 120.00 |
| | 10.00 | 20.00 | 30.00 | 110.00 | 10.00 | 16.67 | 25.00 | 91.67 | 10.00 | 24.00 | 36.00 | 132.00 |
| | 100.00 | 30.00 | 40.00 | 120.00 | 100.00 | 25.00 | 33.33 | 100.00 | 100.00 | 36.00 | 48.00 | 144.00 |
| BUFFER32 | 1.00 | 10.00 | 20.00 | 40.00 | 1.00 | 8.33 | 16.67 | 33.33 | 1.00 | 12.00 | 24.00 | 48.00 |
| | 10.00 | 20.00 | 30.00 | 60.00 | 10.00 | 16.67 | 25.00 | 50.00 | 10.00 | 24.00 | 36.00 | 72.00 |
| | 100.00 | 30.00 | 40.00 | 80.00 | 100.00 | 25.00 | 33.33 | 66.67 | 100.00 | 36.00 | 48.00 | 96.00 |

TYP CONDITION, DRIVING CAPABILITY VALUE: δ

<DELAY TIME CORRECTING COEFFICIENT TABLE>

| INPUT CAPACITANCE [fF] | INPUT-THROUGH TIME [psec] | Ctotal [fF] | | |
|---|---|---|---|---|
| | | 1 | 10 | 100 |
| 1 | 1 | 1.2 | 1.3 | 1.4 |
| | 10 | 1.25 | 1.35 | 1.45 |
| | 100 | 1.3 | 1.4 | 1.5 |
| 10 | 1 | 1.25 | 1.35 | 1.45 |
| | 10 | 1.3 | 1.4 | 1.5 |
| | 100 | 1.35 | 1.45 | 1.55 |
| 20 | 1 | 1.3 | 1.4 | 1.5 |
| | 10 | 1.35 | 1.45 | 1.55 |
| | 100 | 1.4 | 1.5 | 1.6 |
| 40 | 1 | 1.35 | 1.35 | 1.55 |
| | 10 | 1.4 | 1.5 | 1.6 |
| | 100 | 1.45 | 1.55 | 1.65 |
| 60 | 1 | 1.4 | 1.5 | 1.6 |
| | 10 | 1.45 | 1.55 | 1.65 |
| | 100 | 1.5 | 1.6 | 1.7 |
| 80 | 1 | 1.45 | 1.55 | 1.65 |
| | 10 | 1.5 | 1.6 | 1.7 |
| | 100 | 1.55 | 1.65 | 1.75 |

<OUTPUT-THROUGH TIME CORRECTING COEFFICIENT TABLE>

| INPUT CAPACITANCE [fF] | INPUT-THROUGH TIME [psec] | Ctotal [fF] | | |
|---|---|---|---|---|
| | | 1 | 10 | 100 |
| 1 | 1 | 1.6 | 1.75 | 1.9 |
| | 10 | 1.65 | 1.8 | 1.95 |
| | 100 | 1.7 | 1.85 | 2 |
| 10 | 1 | 1.65 | 1.8 | 1.95 |
| | 10 | 1.7 | 1.85 | 2 |
| | 100 | 1.75 | 1.9 | 2.05 |
| 20 | 1 | 1.7 | 1.85 | 2 |
| | 10 | 1.75 | 1.9 | 2.05 |
| | 100 | 1.8 | 1.95 | 2.1 |
| 40 | 1 | 1.75 | 1.9 | 2.05 |
| | 10 | 1.8 | 1.95 | 2.1 |
| | 100 | 1.85 | 2 | 2.15 |
| 60 | 1 | 1.8 | 1.95 | 2.1 |
| | 10 | 1.85 | 2 | 2.15 |
| | 100 | 1.9 | 2.05 | 2.2 |
| 80 | 1 | 1.85 | 2 | 2.15 |
| | 10 | 1.9 | 2.05 | 2.2 |
| | 100 | 1.95 | 2.1 | 2.25 |

FIG.21

| OPERATING FREQUENCY [MHz] (2101) | REFERENCE VALUE (2102) |
|---|---|
| 10 | 1 |
| 100 | 1 |
| 1000 | 1 |
| 2000 | 1 |

(2100)

| OPERATING FREQUENCY [MHz] (2104) | DETERMINATION ITEM (2105) | REFERENCE VALUE (2106) |
|---|---|---|
| 10 | CORRECTION UNNECESSARY | 0.5 |
| | CORRECTION EQUATION | 1 |
| 100 | CORRECTION UNNECESSARY | 0.5 |
| | CORRECTION EQUATION | 1 |
| 1000 | CORRECTION UNNECESSARY | 0.5 |
| | CORRECTION EQUATION | 1 |
| 2000 | CORRECTION UNNECESSARY | 0.5 |
| | CORRECTION EQUATION | 1 |

(2103)

| OPERATING FREQUENCY [MHz] (2108) | DETERMINATION ITEM (2109) | REFERENCE VALUE (2110) |
|---|---|---|
| 10 | CORRECTION UNNECESSARY | 0.5 |
| | CORRECTION EQUATION | 1 |
| | TABLE | 20 |
| 100 | CORRECTION UNNECESSARY | 0.5 |
| | CORRECTION EQUATION | 1 |
| | TABLE | 20 |
| 1000 | CORRECTION UNNECESSARY | 0.5 |
| | CORRECTION EQUATION | 1 |
| | TABLE | 20 |
| 2000 | CORRECTION UNNECESSARY | 0.5 |
| | CORRECTION EQUATION | 1 |
| | TABLE | 20 |

<OUTPUT-THROUGH TIMES OF IOBUF 1>

| INPUT-THROUGH TIME [psec] | Ctotal [fF] | | |
|---|---|---|---|
| | 1 | 10 | 100 |
| 1 | 10 | 20 | 180 |
| 10 | 20 | 30 | 190 |
| 100 | 30 | 40 | 195 |

<OUTPUT-THROUGH TIME CORRECTING COEFFICIENTS>

| INPUT CAPACI-TANCE [fF] | INPUT-THROUGH TIME [psec] | Ctotal [fF] | | |
|---|---|---|---|---|
| | | 1 | 10 | 100 |
| 10 | 1 | 1.65 | 1.8 | 1.95 |
| | 10 | 1.7 | 1.85 | 2 |
| | 100 | 1.75 | 1.9 | 2.05 |

MULTIPLICATION ⇩

<CORRECTED OUTPUT-THROUGH TIMES OF IOBUF 1>

| INPUT-THROUGH TIME [psec] | Ctotal [fF] | | |
|---|---|---|---|
| | 1 | 10 | 100 |
| 1 | 16.5 | 36 | 195 |
| 10 | 34 | 55.5 | 220 |
| 100 | 52.5 | 76 | 246 |

COMPUTER PRODUCT, DESIGN SUPPORT APPARATUS, AND DESIGN SUPPORT METHOD

CROSS REFERENCE TO RELATED APPLICATIONS

This application is based upon and claims the benefit of priority of the prior Japanese Patent Application No. 2009-142693, filed on Jun. 15, 2009, the entire contents of which are incorporated herein by reference.

FIELD

The embodiments discussed herein are related to calculation of delay of a circuit-under-design.

BACKGROUND

It is conventionally known that delay in a path of a circuit-under-design is calculated based on delay of cells making up the path, and that the delay of a cell is calculated based on conditions of process (P), temperature (P), and power voltage (V) (hereinafter "PTV condition").

According to a conventionally known technique of calculating the delay of a cell, resistance and capacitance associated with a line connecting the cell to a cell immediately downstream are substituted by a single line capacitance value. Another conventionally known simulation technique involves simulation of an analog circuit by a simulator, such as SPICE, using a circuit model in which a line capacitance value and the input capacitance of a cell receiving output from the circuit are uniquely substituted by a load capacitance (lumped-constant capacitance value). According to yet another conventionally known simulation technique, the time required for a rise (or fall) in a waveform input to a cell (hereinafter "input-through time") and a time required for a rise (or fall) in the waveform output from the cell (hereinafter "output-through time") are included in the delay time of the cell (hereinafter "first conventional technique") (see, e.g., Japanese Laid-Open Patent Publication Nos. H10-198720 and 2000-276501).

According to yet another conventionally known simulation technique, line resistance and line capacitance are extracted from layout data after layout design to carry out simulation based on an extraction result to improve the accuracy of the delay time (hereinafter "second conventional technique") (see. e.g., Japanese Laid-Open Patent Publication No. H09-257880).

Although the waveform output from a cell is conventionally linear, a nonlinear output waveform, such as an output waveform having a stepped portion has been observed in recent years. The phenomenon of the nonlinear output waveform is caused by microprocessing and lower voltage. For example, (1) to (3) below are causes of such a phenomenon.

(1) Microprocessing reduces the thickness of the gate oxide film forming a transistor, thus leading to an increase in leak current. As a result, overshooting (or undershooting) occurs on the waveform output from a cell because of leak current from a cell immediately downstream or parasitic capacitance. In addition, the frequency and amplitude of wringing of the output waveform vary based on the gate size of the cell immediately downstream. (2) The ratio of vibration amplitude of wringing to the entire output waveform increases as operation voltage becomes lower. (3) The switching speed of a transistor drops in a type of cell having a low driving capability or under a PTV condition that lowers the driving capability, so that the maximum amplitude does not appear in wringing.

According to the first conventional technique, simulation is carried out using only the lumped-constant capacitance value. Consequently, multiple cells in the circuit-under-design each exhibit the same delay time even if the gate size of the respective cells immediately downstream differs with respect to one another. This poses a problem in that delay cannot be calculated respectively for each cell in the circuit-under-design. As a result, whether an output waveform is nonlinear cannot be reflected in the simulation, which leads to a problem of reduced accuracy of the estimated delay time.

According to the second conventional technique, a layout is designed without carrying out timing verification, and following the design layout, characteristics, such as line capacitance, are extracted from layout data to verify timing. This brings about a need for redesign of the layout. The characteristics are, therefore, extracted each time the layout is redesigned, making design troublesome and the convergence of timing impossible to cause estimation of the delay time of a cell to be difficult.

SUMMARY

According to an aspect of an embodiment, a non-transitory computer-readable recording medium stores therein a design support program that causes a processor, which as has access to a simulator simulating a circuit model, to execute a process that includes inputting a driving capability value, a lumped-constant capacitance value, and an input capacitance value that is part of the lumped-constant capacitance value, each value being defined in the circuit model, and further inputting a first delay time of the circuit model, based on the driving capability value and the lumped-constant capacitance value; setting in the circuit model, the driving capability value, the lumped-constant capacitance value, and the input capacitance value that are input at the inputting; acquiring from the simulator, a second delay time of the circuit model resulting from simulation by the simulator, by providing to the simulator, the circuit model having values set therein at the setting; calculating a relative evaluation value for the first delay time input at the inputting and the second delay time acquired at the acquiring; and storing to a storage apparatus, the calculated relative evaluation value as a delay time correcting coefficient, the calculated relative evaluation value being correlated with the driving capability value, the lumped-constant capacitance value, and the input capacitance value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is an explanatory diagram of an example of nonlinear output waveforms;

FIG. 2B depicts an explanatory diagram of an example of a change in wringing caused by the gate size of a cell immediately downstream;

FIG. 2C is an explanatory diagram of an example of an increase in the rate of wringing according to the applied voltage;

FIG. 6 is a block diagram of a functional configuration of the design support apparatus;

FIG. 7A is an explanatory diagram of an example of first delay times, second delay times, and delay time correcting coefficients;

FIG. 7B is an explanatory diagram of an example of first output-through times, second output-through times, and output-through time correcting coefficients;

FIG. 15 is an explanatory diagram of an example of cell-related information;

FIG. 16 is an explanatory diagram of an example of circuit information of a circuit-under-design;

FIG. 17A is an explanatory diagram of an example of a PTV condition;

FIG. 17B is an explanatory diagram of an example of a constraint condition other than the PTV condition;

FIG. 18A is an explanatory diagram of an example of a delay time table;

FIG. 18B is an explanatory diagram of an example of an output-through time table;

FIG. 20 is an explanatory diagram of an example of table 1901;

FIG. 21 is an explanatory diagram of an example of a reference value;

FIG. 28 is an explanatory diagram of an example of corrected output-through times;

DESCRIPTION OF EMBODIMENTS

Embodiments of the present invention will be explained with reference to the accompanying drawings.

Figure 1:
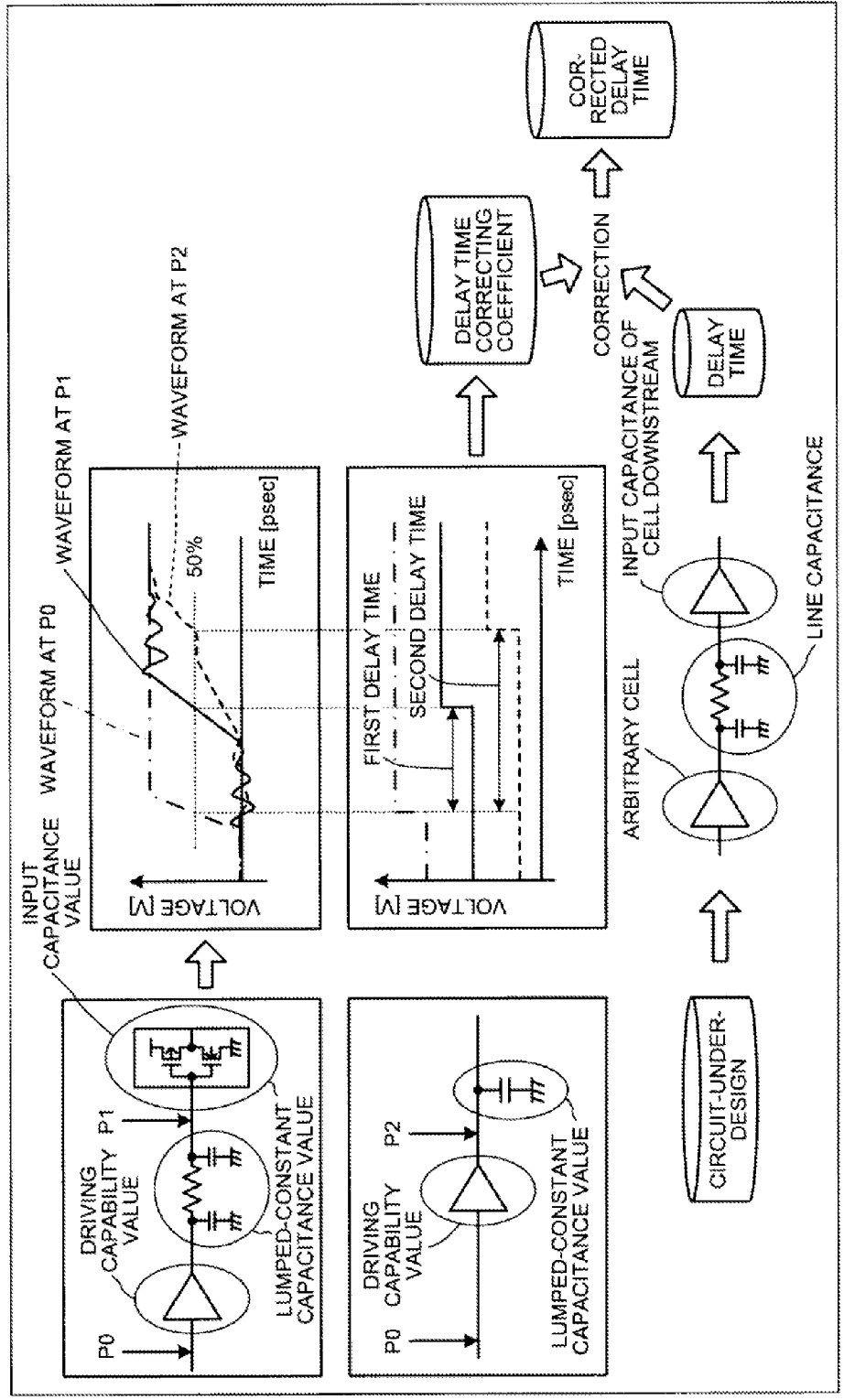
FIG. 1 is an explanatory diagram of an example of the present embodiments.

FIG. 1 is an explanatory diagram of an example of the present embodiments. According to the disclosed technique of the present embodiments, an arbitrary driving capability value, an arbitrary lumped-constant capacitance value, an arbitrary input capacitance value that is part of the lumped-constant capacitance value, and a first delay time based on the driving capability value and the lumped-constant capacitance value are input. The input arbitrary driving capability value, arbitrary lumped-constant capacitance value, and input capacitance value are set for a circuit model, which is provided to a simulator that simulates an analog circuit. Subsequently, the difference between a second delay time of the circuit model simulated by the simulator and a first delay time is calculated as a delay time correcting coefficient. The calculated delay time correcting coefficient is then correlated with the driving capability value, the lumped-constant and stored to a storage apparatus.

Circuit information of the circuit-under-design is read from the storage apparatus, and an arbitrary cell is selected as a subject cell from the circuit-under-design. A delay time correcting coefficient is then acquired from the storage apparatus, based on driving capacitance of the subject cell, line capacitance of a line connected to the subject cell, and input capacitance of a cell receiving output from the subject cell, to correct the delay time of the subject cell.

Hence, a delay time correcting coefficient for correcting the delay time into a proper delay time is calculated automatically. A user, therefore, corrects the delay time of the cell in the circuit-under-design using the delay time correcting coefficient. This allows the user to correct the delay time of the cell into a proper delay time according to the driving capability of the cell and a cell immediately downstream and improves the accuracy of delay time estimation. The user is also able to verify a nonlinear output waveform and thus, verification accuracy is improved.

FIG. 2A is an explanatory diagram of an example of non-linear output waveforms. A graph 200 with the vertical axis representing voltage [V] and the horizontal axis representing time [psec] depicts an output waveform 1 and an output waveform 2 that result when an input waveform is input to a cell. In this example, the cell is a buffer. The graph 200 depicts the output waveforms that result when the input waveform is a waveform representing a rise in voltage. The input waveform represents a rise in voltage from 0 [V] to 0.8 [V].

Although the output waveform 1 rises linearly from 0 [V] to 0.8 [V] as the input waveform does, the output waveform 2 rises in a stepped manner from 0 [V] to 0.8 [V], i.e., does not rise linearly. The output waveform 2 is, therefore, a nonlinear output waveform. The effect of the gate size of a cell immediately downstream as described above is depicted in FIG. 2B.

FIG. 2B depicts an explanatory diagram of an example of a change in wringing caused by the gate size of a cell immediately downstream. Graphs 201 and 202 depict output waveforms from a buffer, which is the same buffer that outputs the waveform in the graph 201 as well as the waveform in the graph 202. When a channel width representing the gate size of a cell immediately downstream from the buffer outputting the waveform in the graph 201 is 1, a channel width representing the gate size of the cell immediately downstream from the buffer outputting the waveform in the graph 202 is 10 times 1. As a result, the output waveform in the graph 202 has greater waveform distortion (wringing), compared to the output waveform in the graph 201. Because gate input capacitance changes according to channel width W, output waveforms from the buffer vary depending on the input capacitance of the cell immediately downstream even if the output waveforms are output from the same buffer.

FIG. 2C is an explanatory diagram of an example of an increase in the rate of wringing according to the applied voltage. A graph 203 depicts an output waveform 5 that results when an input waveform rises from 0 V to 1.2 V, an output waveform 6 that results when the input waveform rises from 0 V to 1.0 V, and an output waveform 7 that results when the input waveform rises from 0 V to 0.8 V. In this example, each of the cells is a buffer. As wringing is occurring similarly on each of the output waveforms 5, 6, and 7, the rate of wringing is greater on the waveform 7, compared to the waveforms 5 and 6. This leads to a conclusion that the effect of wringing is greater when the input voltage is low.

Figure 2D:
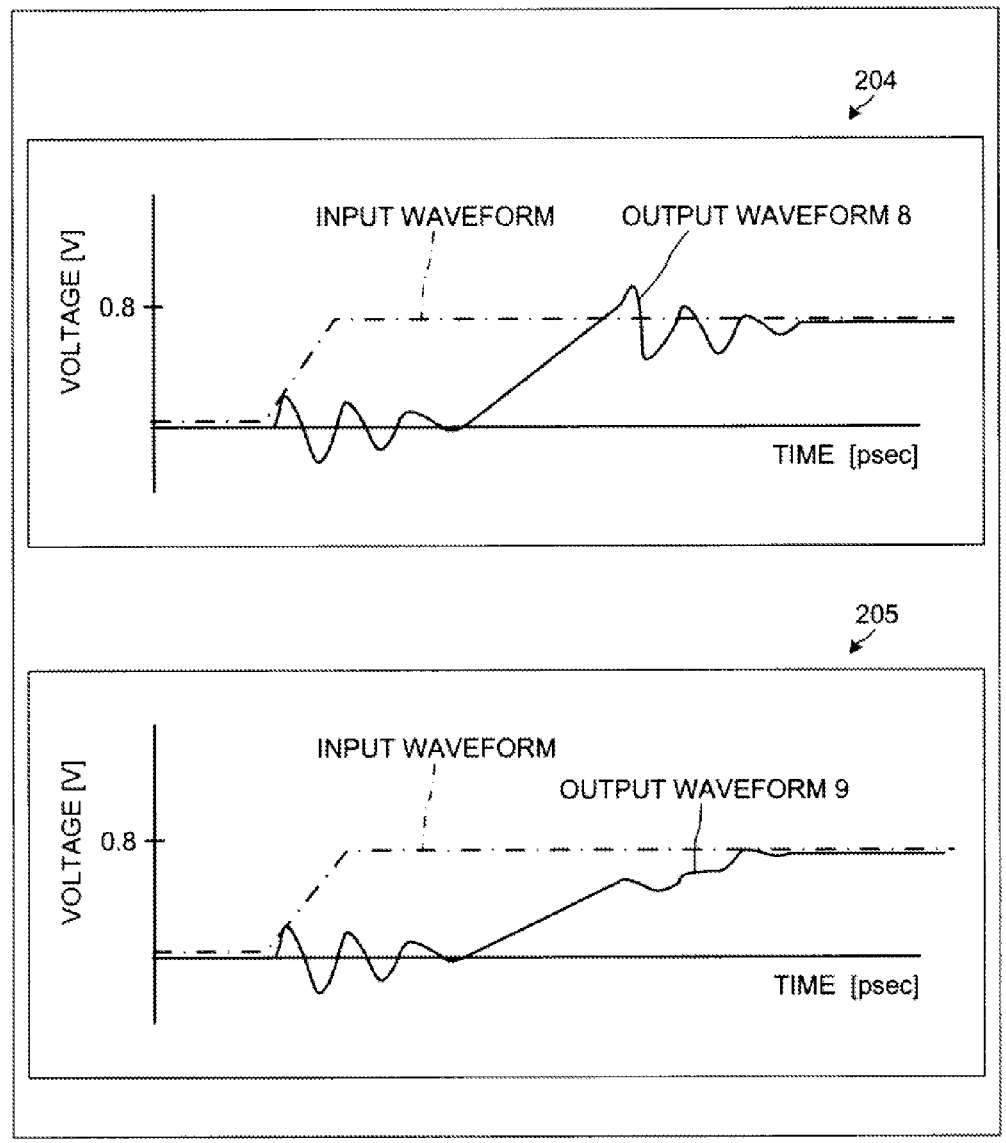
FIG. 2D is an explanatory diagram of an example of the effect of driving capability on an output waveform.

FIG. 2D is an explanatory diagram of an example of the effect of driving capability on an output waveform. A buffer that outputs an output waveform 8 in a graph 204 has a driving capability higher than that of a buffer that outputs an output waveform 9 in a graph 205. While wringing accompanying vibration amplitude appears on the output waveform 8, wringing does not accompany vibration amplitude on the output waveform 9, which makes the output waveform 9 a nonlinear waveform. Driving capability may drop depending on a PTV condition. Even an output waveform from the same buffer, therefore, may become nonlinear depending on a PTV condition as in the case of the output waveform 9.

This means that an output waveform from an arbitrary cell in the circuit-under-design becomes nonlinear depending on an input capacitance value of a cell immediately downstream from the arbitrary cell, a driving capability value of the arbitrary cell, and a PTV condition. According to the disclosed technique of the present embodiments, correction coefficients for correcting a delay time and an output-through time into a proper delay time and an output-through time are provided for each cell in the circuit-under-design before a delay time of the circuit-under-design is calculated. This enables correction of the delay time and output-through time of the cell into a proper delay time and output-through time. An input capacitance value, a driving capability value, and a PTV condition that cause an output waveform to become nonlinear are set for a circuit model for calculating the correction coefficient, enabling verification of an output waveform becoming nonlinear.

In first and second embodiments, an example of calculation of a delay time correcting coefficient and an output-through time correcting coefficient will be described. In third to eighth embodiments, an example of correcting a delay time or an output-through time of a cell in the circuit-under-design into a proper delay time or a proper output-through time using a calculated delay time correcting coefficient and an output-through time correcting coefficient will be described.

The first embodiment relates to an example of automatically generating a delay time correcting coefficient table and an output-through time correcting coefficient table.

Figure 3:
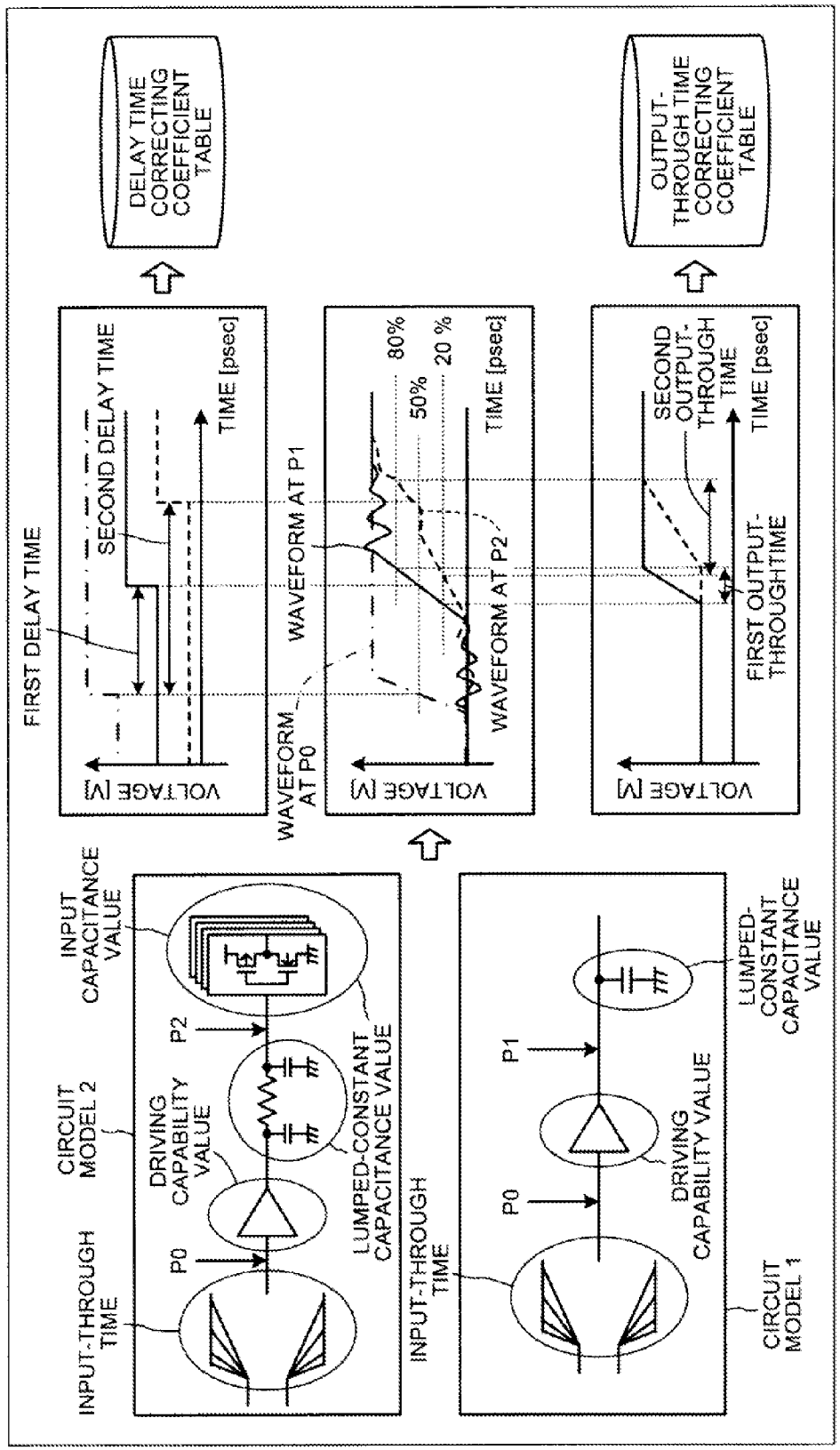
FIG. 3 is an explanatory diagram of an example of a first embodiment.

FIG. 3 is an explanatory diagram of an example of the first embodiment. In the first embodiment, an arbitrary input-through time, an arbitrary driving capability value, an arbitrary lumped-constant capacitance value are set for a circuit model 1, which is provided to a simulator that simulates an analog circuit (hereinafter "simulator"). A first delay time and a first output-through time of the circuit model 1 resulting from simulation by the simulator are then obtained. The first delay time, for example, is the time between a point at which the voltage of a waveform at P0 is 50% and a point at which the voltage of a waveform at P1 is 50%. The first output-through time, for example, is the time between a point at which the voltage of the waveform at P1 is 20% and a point at which the voltage of the waveform at P1 is 80%.

The input-through time, the driving capability value, the lumped-constant capacitance value, and an input capacitance value that is part of the lumped-constant capacitance value are set for a circuit model 2, which is provided to the simulator. A second delay time and a second output-through time of the circuit model 2 resulting from simulation by the simulator are then obtained. The second delay time, for example, is the time between a point at which the voltage of the waveform at P0 is 50% and a point at which the voltage of the waveform at P2 is 50%. The second output-through time, for example, is the time between a point at which the voltage of the waveform at P2 is 20% and a point at which the voltage of the waveform at P2 is 80%.

A relative evaluation value for the first delay time and the second delay time is determined to be a delay time correcting coefficient, which is correlated with the input-through time, the driving capability value, the lumped-constant capacitance value and the input capacitance value, is tabled, and then stored as part of a library in the storage apparatus. A relative evaluation value for the first output-through time and the second output-through time is determined to be an output-through time correcting coefficient, which is correlated with the input-through time, the driving capability value, the lumped-constant capacitance value, and the input capacitance value, is tabled, and then stored as part of the library in the storage apparatus. Because the circuit model 1 belongs to a conventional technique, the circuit model 1 is not described further and the first delay time and first output-through time obtained by the use of the circuit model 1 are assumed to be stored in advance in the storage apparatus.

Details concerning the circuit model 2 will be described. A driving capability value of a buffer, an input-through time, a lumped-constant capacitance value representing a load capacitance value, and an input capacitance value that is part of the lumped-constant capacitance value may be set for the circuit model 2. An input waveform and a PTV condition may also be set for the circuit model 2. While a buffer is used in the circuit model 2 in the first embodiment, a cell having a function other than that of a buffer may be used.

The following is an example of values for the driving capability, the input-through time, the lumped-constant capacitance representing the load capacitance, the input capacitance that is part of the lumped-constant capacitance, and the PTV condition that are set for the circuit model 2.

Driving capability value: 1, 2, 4, 8, 16, 32
Input waveform: rise/fall
PTV condition: TYPICAL condition (hereinafter "TYP condition"), FAST condition, SLOW condition
Input-through time [psec]: 0.6, 6, 60, 600
Lumped-constant capacitance value [fF]: 8, 16, 32, 64, 128
Input capacitance value [fF]: 2, 4, 8, 16, 32
The driving capability has 6 values, yielding 6 conditions; the input waveform has 2 types, yielding 2 conditions; the PTV condition has 3 types, yielding 3 conditions; the input-through time has 4 values, yielding 4 conditions; the lumped-constant capacitance has 5 values, yielding 5 conditions; and the input capacitance has 5 values, yielding 5 conditions. A second delay time is calculated for each combination of these values, which consequently yields 3600 conditions in total.

A driving capability value will be described in detail. A buffer is described in the circuit model 2, in which the model of the buffer is changed when a driving capability value is set in the circuit model 2. Plural buffers are stored in the same library, and when the driving capability of the buffer lowest in driving capability among buffers is 1, the driving capability value of each buffer is determined based on how many times each buffer is greater in driving capability than the buffer having the lowest driving capability of 1. For example, setting 2 as a driving capability value defined in the circuit model 2 means that a buffer two times greater in driving capability than the buffer lowest in driving capability is set in the circuit model 2. While a buffer is used in the circuit model 2, a cell having a function other than that of a buffer may be used.

An input capacitance value means an input capacitance value of a cell immediately downstream. A specific example of a PTV condition will be described hereinafter. The relative relation between a lumped-constant capacitance value and an input capacitance value is depicted in FIG. 4.

Figure 4:
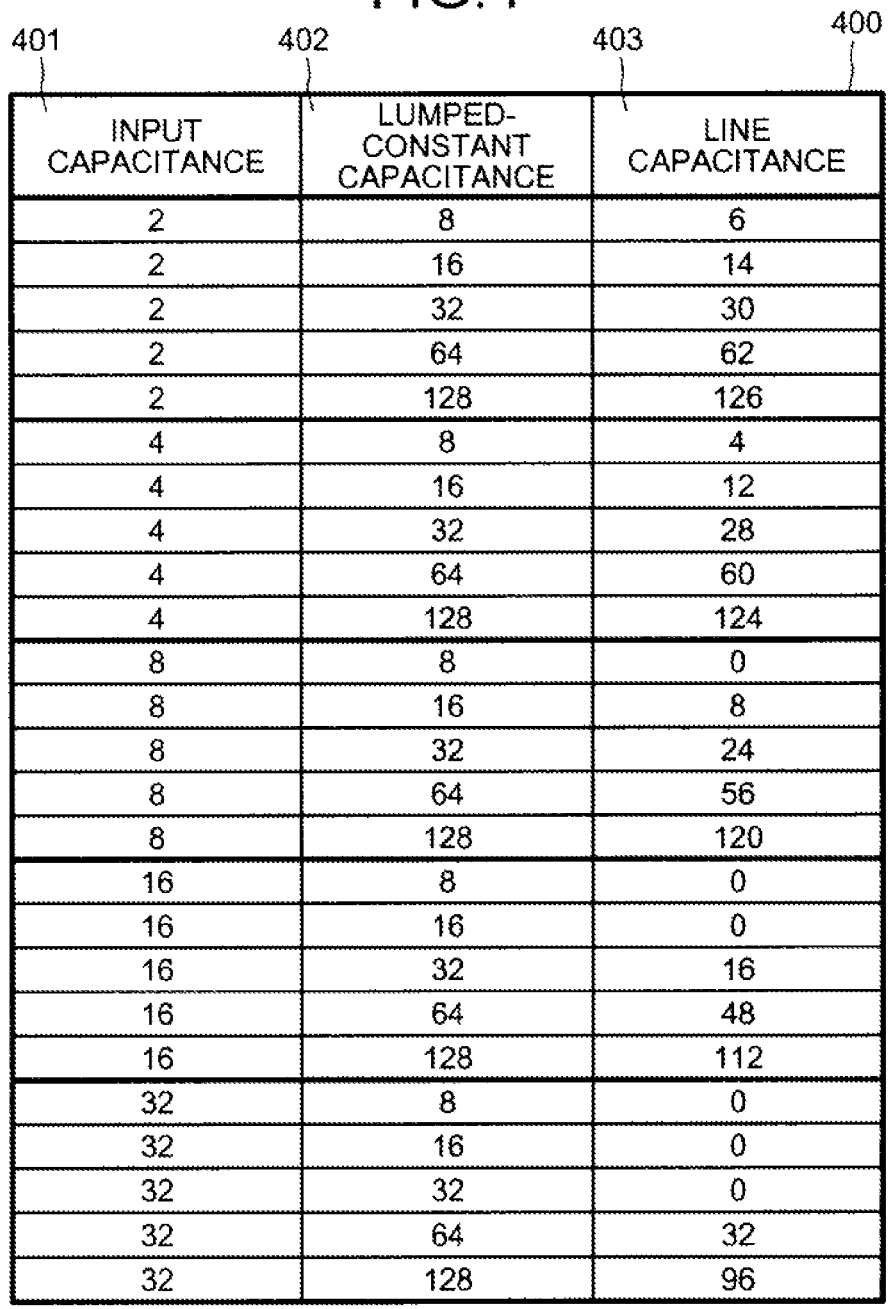
FIG. 4 is an explanatory diagram of an example of a lumped-constant capacitance value and an input capacitance value.

FIG. 4 is an explanatory diagram of an example of a lumped-constant capacitance value and an input capacitance value. A table 400 includes fields of input capacitance 401, lumped-constant capacitance 402, and line capacitance 403. The field of input capacitance 401 includes values for input capacitance that is part of lumped-constant capacitance, the field of lumped-constant capacitance 402 includes values for lumped-constant capacitance, and the field of line capacitance 403 includes values for line capacitance that is part of the lumped-constant capacitance. For example, when the input capacitance 401 is 2 and the lumped-constant capacitance 402 is 16, the line capacitance 403 is determined to be 14. Hence, a line capacitance value is read out from the table 400 based on a lumped-constant capacitance value and an input capacitance value, and is set in the circuit model 2. Values for the input capacitance 401 and the lumped-constant capacitance 402 depicted in FIG. 4 are one example, and are not limited to the contents of the table 400.

Figure 5:
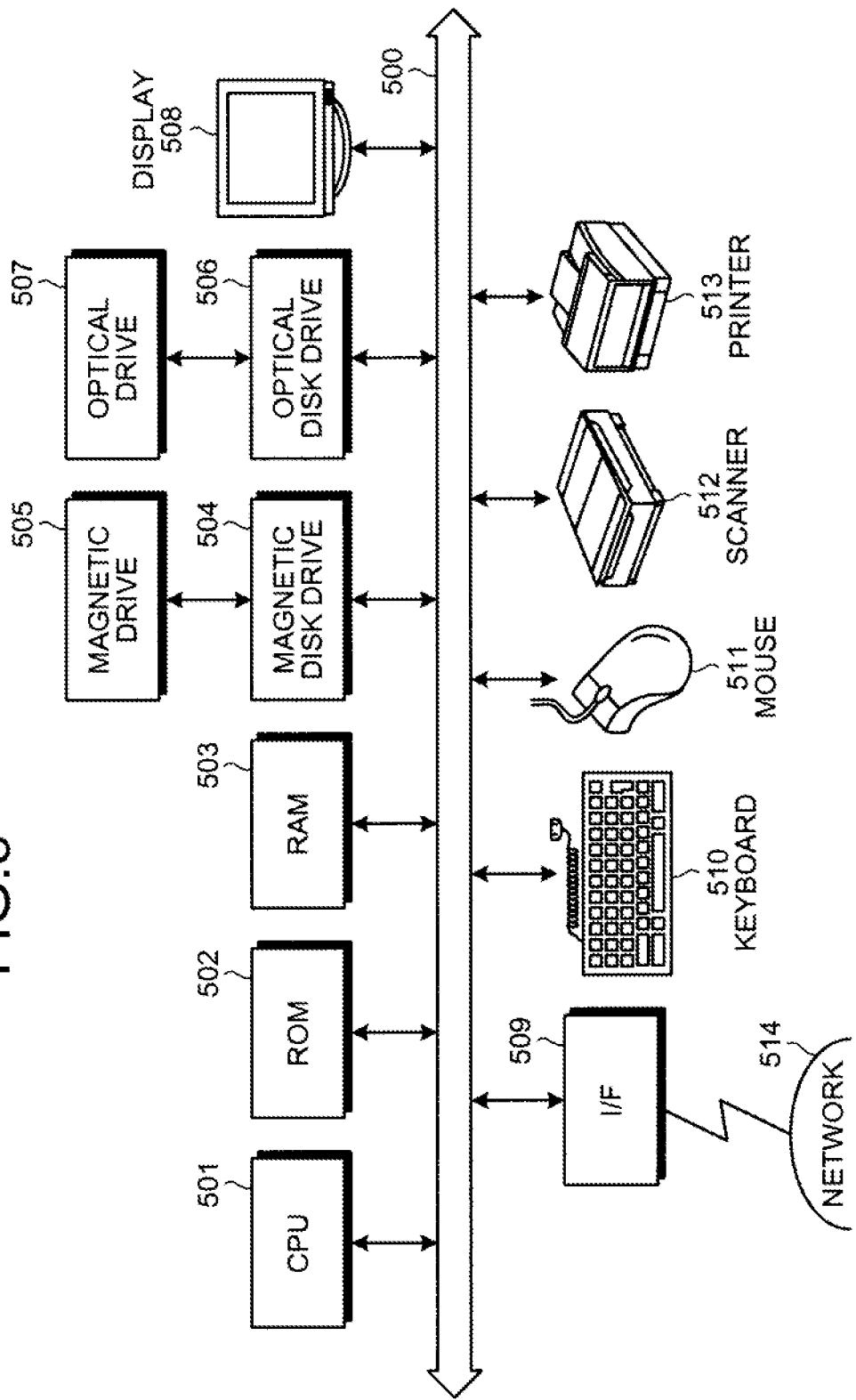
FIG. 5 is a block diagram of a hardware configuration of a design support apparatus according to the embodiments.

FIG. 5 is a block diagram of a hardware configuration of a design support apparatus according to the embodiments. As depicted in FIG. 5, the design support apparatus includes a central processing unit (CPU) 501, a read-only memory (ROM) 502, a random access memory (RAM) 503, a magnetic disk drive 504, a magnetic disk 505, an optical disk drive 506, an optical disk 507, a display 508, an interface (I/F) 509, a keyboard 510, a mouse 511, a scanner 512, and a printer 513, respectively connected by a bus 500.

The CPU 501 governs overall control of the design support apparatus. The ROM 502 stores therein programs such as a boot program. The RAM 503 is used as a work area of the CPU 501. The magnetic disk drive 504, under the control of the CPU 501, controls the reading and writing of data with respect to the magnetic disk 505. The magnetic disk 505 stores therein data written under control of the magnetic disk drive 504.

The optical disk drive 506, under the control of the CPU 501, controls the reading and writing of data with respect to the optical disk 507. The optical disk 507 stores therein data written under control of the optical disk drive 506, the data being read by a computer.

The display 508 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 508.

The I/F 509 is connected to a network 514 such as a local area network (LAN), a wide area network (WAN), and the Internet through a communication line and is connected to other apparatuses through the network 514. The I/F 509 administers an internal interface with the network 514 and controls the input/output of data from/to external apparatuses. For example, a modem or a LAN adaptor may be employed as the I/F 509.

The keyboard 510 includes, for example, keys for inputting letters, numerals, and various instructions and performs the input of data. Alternatively, a touch-panel-type input pad or numeric keypad, etc. may be adopted. The mouse 511 is used to move the cursor, select a region, or move and change the size of windows. A track ball or a joy stick may be adopted provided each respectively has a function similar to a pointing device.

The scanner 512 optically reads an image and takes in the image data into the design support apparatus. The scanner 512 may have an optical character recognition (OCR) function as well. The printer 513 prints image data and text data. The printer 513 may be, for example, a laser printer or an ink jet printer.

FIG. 6 is a block diagram of a functional configuration of the design support apparatus. The design support apparatus 600 includes a circuit model information input unit 601, a setting unit 602, an acquiring unit 603, an evaluation value calculating unit 604, a storing unit 605, an extracting unit 606, a correction equation calculating unit 607, a subject cell information input unit 608, a retrieving unit 609, a corrected-time calculating unit 610, a determining unit 611, a correction coefficient calculating unit 612, a converting unit 613, and an output unit 614. Each of the functional units (circuit model information input unit 601 to output unit 614), is implemented, for example, by the I/F 509 or by an execution of a program stored in a storage apparatus, such as the ROM 502, ROM 503, magnetic disk 505, and optical disk 507 depicted in FIG. 5, the program being executed the CPU 501.

The circuit model information input unit 601 has a function of inputting a driving capability value defined in a circuit model, a lumped-constant capacitance value, and an input capacitance value that is part of the lumped-constant capacitance value and a further function of inputting a first delay time of the circuit model, based on the driving capability value and the lumped-constant capacitance value. Specifically, for example, a user inputs the driving capability value, the lumped-constant capacitance value, and the input capacitance value that is part of the lumped-constant capacitance value, and then inputs the first delay time based on the driving capability value and the lumped-constant capacitance value and a first input-through time.

More specifically, for example, the user (designer, verifier, or library maker) inputs an arbitrary driving capability value selected from among the above driving capability values, an arbitrary lumped-constant capacitance value selected from the above lumped-constant capacitance values, and an arbitrary input capacitance value selected from among the above input capacitance values. The user also inputs input waveform information of a rising waveform or a falling waveform, an arbitrary PTV condition selected from among the above PTV conditions, and an arbitrary input-through time selected from among the above input-through times. The CPU 501 receives the input of the driving capability value, the lumped-constant capacitance value, the input waveform information, the PTV condition, and the input through time.

In another example, the user inputs plural driving capability values, plural lumped-constant capacitance values, plural input capacitance values, input waveform information for plural input waveforms, plural PTV conditions, and plural input-through times. The CPU 501, for example, receives the input of the driving capability values, the lumped-constant capacitance values, the input capacitance values, the input waveform information, the PTV conditions, and the input-through times. The CPU 501 then successively selects an arbitrary driving capability value, an arbitrary lumped-constant capacitance value, an arbitrary input capacitance value, arbitrary input waveform information, an arbitrary PTV condition, and an arbitrary input-through time.

When the first delay time acquired by a conventional technique is stored as library data in the storage apparatus, the CPU 501 may read the first delay time out of the storage apparatus, based on a condition input.

The setting unit 602 has a function of setting in the circuit model, the driving capability value, the lumped-constant capacitance value, and the input capacitance value that are input by the circuit model information input unit 601. Specifically, for example, when inputting the driving capability value, the lumped-constant capacitance value, the input capacitance value, the input waveform information, the PTV condition, and the input-through time, the CPU 501 sets these input values and conditions in the circuit model 2. The circuit model 2 having input values set therein is stored to a storage apparatus, such as the RAM 503 and the magnetic disk 505.

The acquiring unit 603 has a function of providing the circuit model having the input values set therein by the setting unit 602 to the simulator to acquire from the simulator, a second delay time of the circuit model obtained from the simulation. The acquiring unit 603 has a further function of providing the circuit model having the input values set therein by the setting unit 602 to the simulator to acquire from the simulator, a second output-through time of the circuit model obtained from the simulation.

For example, the CPU 501 accesses the simulator to acquire the second delay time and the second output-through time of the circuit model 2, obtained by simulation of the circuit model 2 by the simulator. In another example, the CPU 501 accesses the storage apparatus to read out the second delay time and the second output-through time of the circuit model 2, the second delay time and the second output-through time being stored to the storage apparatus by the simulator.

The evaluation value calculating unit 604 has a function of calculating a relative evaluation value for the first delay time input by the circuit model information input unit 601 and the second delay time acquired by the acquiring unit 603. The evaluation value calculating unit 604 has a further function of calculating a relative evaluation value for the first output-through time input by the circuit model information input unit 601 and the second output-through time acquired by the acquiring unit 603.

Specifically, for example, the CPU 501 calculates the ratio between the first delay time and the second delay time and determines the ratio to be the evaluation value. Equation 1 represents a delay time difference.

$$\text{Delay time evaluation value} = \text{second delay time/first delay time} \quad (1)$$

Specifically, for example, the CPU 501 calculates the ratio between the first output-through time and the second output-through time and determines the ratio to be the evaluation value. Equation 2 represents an output-through time evaluation value.

$$\text{Output-through time evaluation value} = \text{second output-through time/first output-through time} \quad (2)$$

Evaluation values calculated by the ratios between first delay times and second delay times are depicted in FIG. 7A, and evaluation values calculated by the ratios between first output-through times and second output-through times are depicted in FIG. 7B.

FIG. 7A is an explanatory diagram of an example of first delay times, second delay times, and delay time correcting coefficients. A table 700 depicts first delay times, a table 701 depicts second delay times, and a table 702 depicts delay time correcting coefficients. In the tables 700 and 701, conditions are set, where the driving capability value is 8, the input waveform is a rising waveform, the PTV condition is given as three different conditions, the input-through time is given as four different times, and the lumped-constant capacitance is given as full variations of five different capacitances. In the table 701, the input capacitance value of 16 fF is set as an additional condition. For example, when the PTV condition is the FAST condition, the input-through time is 0.6 psec, and the lumped-constant capacitance is 8, a first delay time is determined to be 48 while a second delay time to be 49. This gives a delay time evaluation value of 49/48 or 1.02 through calculation by equation (1). This calculated delay time evaluation value is equivalent to a delay time correcting coefficient. FIG. 7B depicts evaluation values calculated by the ratios between first output-through times and second output-through times.

FIG. 7B is an explanatory diagram of an example of first output-through times, second output-through times, and output-through time correcting coefficients. A table 703 depicts first output-through times, a table 704 depicts second output-through times, and a table 705 depicts output-through time correcting coefficients. In the tables 703 and 704, conditions are set where the driving capability value is 8, the input waveform is a rising waveform, the PTV condition is given as three different conditions, the input-through time is given as four different times, and the lumped-constant capacitance is given as full variations of five different capacitances. In the table 704, the input capacitance value of 16 fF is set as an additional condition. For example, when the PTV condition is the FAST condition, the input-through time is 0.6, and the lumped-constant capacitance is 8, a first output-through time is determined to be 54 while a second output-through time to be 76. This gives an output-through time evaluation value of 76/54 or 1.42 through calculation by equation (2). This calculated output-through time evaluation value is equivalent to an output-through time correcting coefficient. An example of determining a time difference between a first delay time and a second delay time to be an evaluation value will be described.

For example, the CPU 501 determines the absolute value of the difference obtained by subtracting a second delay time from a first delay time to be a delay time evaluation value, and determines the absolute value of the difference obtained by subtracting a second output-through time from a first output-through time to be an output-through time evaluation value. A specific example of this evaluation value determination is omitted in the present embodiment.

For example, the CPU 501 linearly approximates first delay times in the table 700 and second delay times in the table 701, and tables the resulting slopes. From the tabled slope values, the CPU 501 then calculates delay time evaluation values and determines the delay time evaluation values to be delay time correcting coefficients, thus generating a table of delay time correcting coefficients (hereinafter "delay time correcting table"). In the same manner, the CPU 501 further generates a table of output-through time correcting coefficients (hereinafter "output-through time correcting table"). In this manner, the tables may be generated easily.

In another example, the CPU 501 approximates first delay times in the table 700 and second delay times in the table 701 with a polynomial to calculate approximate lines, and then calculates slopes from waveform segments forming 20% to 50% of the approximated lines and tables the resulting slopes. From the tabled slope values, the CPU 501 then calculates delay time evaluation values and determines the delay time evaluation values to be delay time correcting coefficients, thus generating a delay time correcting table. In the same manner, the CPU 501 further generates an output-through time correcting table.

In still another example, the CPU 501 exponentially approximates first delay times in the table 700 and second delay times in the table 701 to calculate approximate lines, and then calculates slopes from waveform segments forming 20% to 50% of the approximates lines and tables the resulting slopes. From the tabled slope values, the CPU 501 then calculates time differences between delay times to generate a delay time correcting table. In the same manner, the CPU 501 further generates an output-through time correcting table.

The storing unit 606 has a function of correlating the time difference calculated by the evaluation value calculating unit 604 with the driving capability value, the lumped-constant capacitance value, and the input capacitance value and storing the time difference as a delay time correcting coefficient in the storage apparatus. Specifically, for example, the CPU 501 correlates the delay time correcting coefficient with respective conditions and stores the correlated delay time correcting coefficient as library data in the storage apparatus, such as the ROM 503 and the magnetic disk 505. This enables automatic calculation of a delay time correcting coefficient and an output-through time correcting coefficient for correcting the delay time into a proper amending time. The user is, therefore, able to correct a delay time of a cell in the circuit-under-design, using the delay time correcting coefficient, and is able to correct an output-through time of the cell, using the output-through time correcting coefficient. Hence, the delay time of the cell is corrected into a proper delay time according to a driving capability of the cell and according to a cell immediately downstream.

Figure 8:
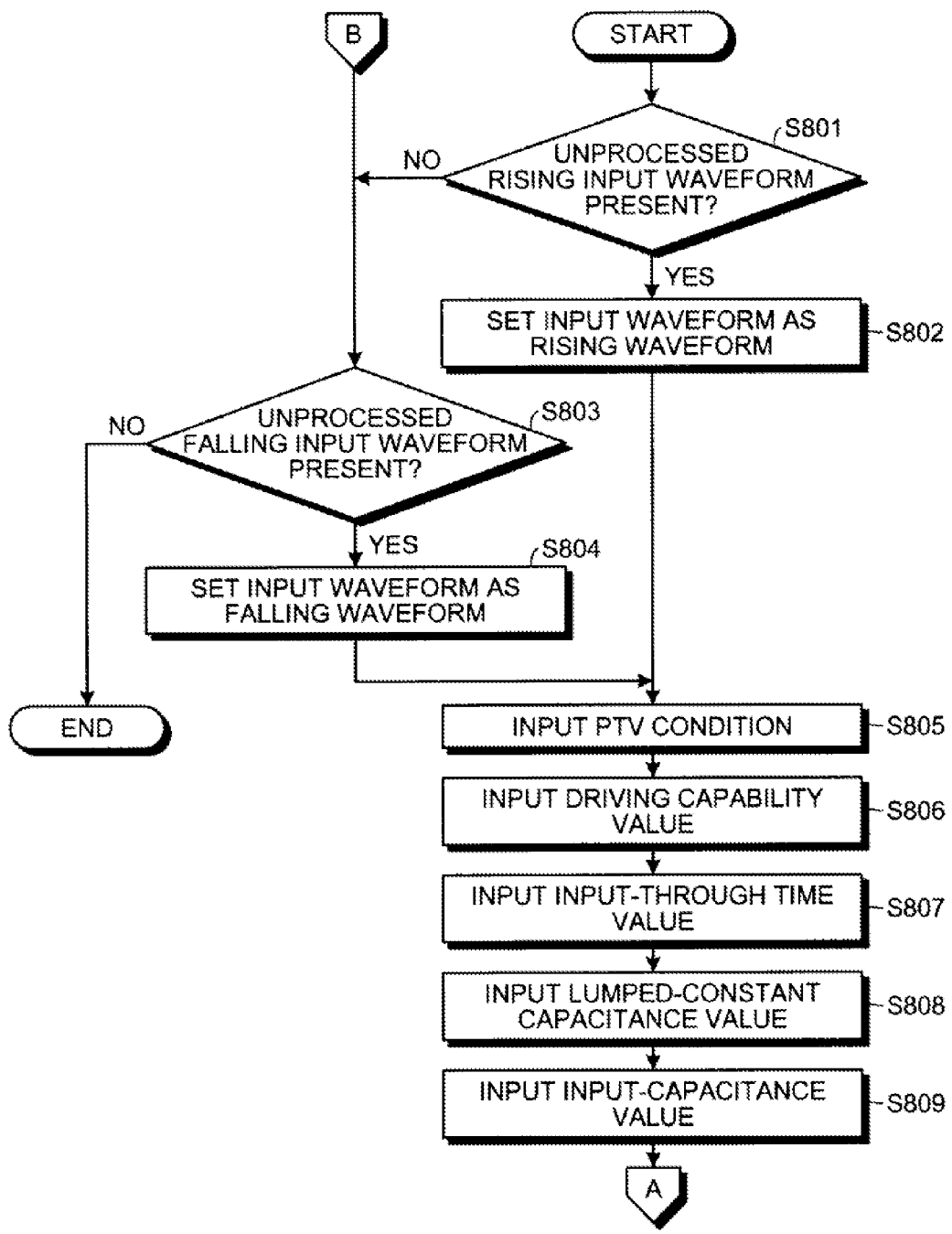
FIGS. 8 to 10 are flowcharts of examples of a design support procedure by the design support apparatus of the first embodiment.
Figure 9:
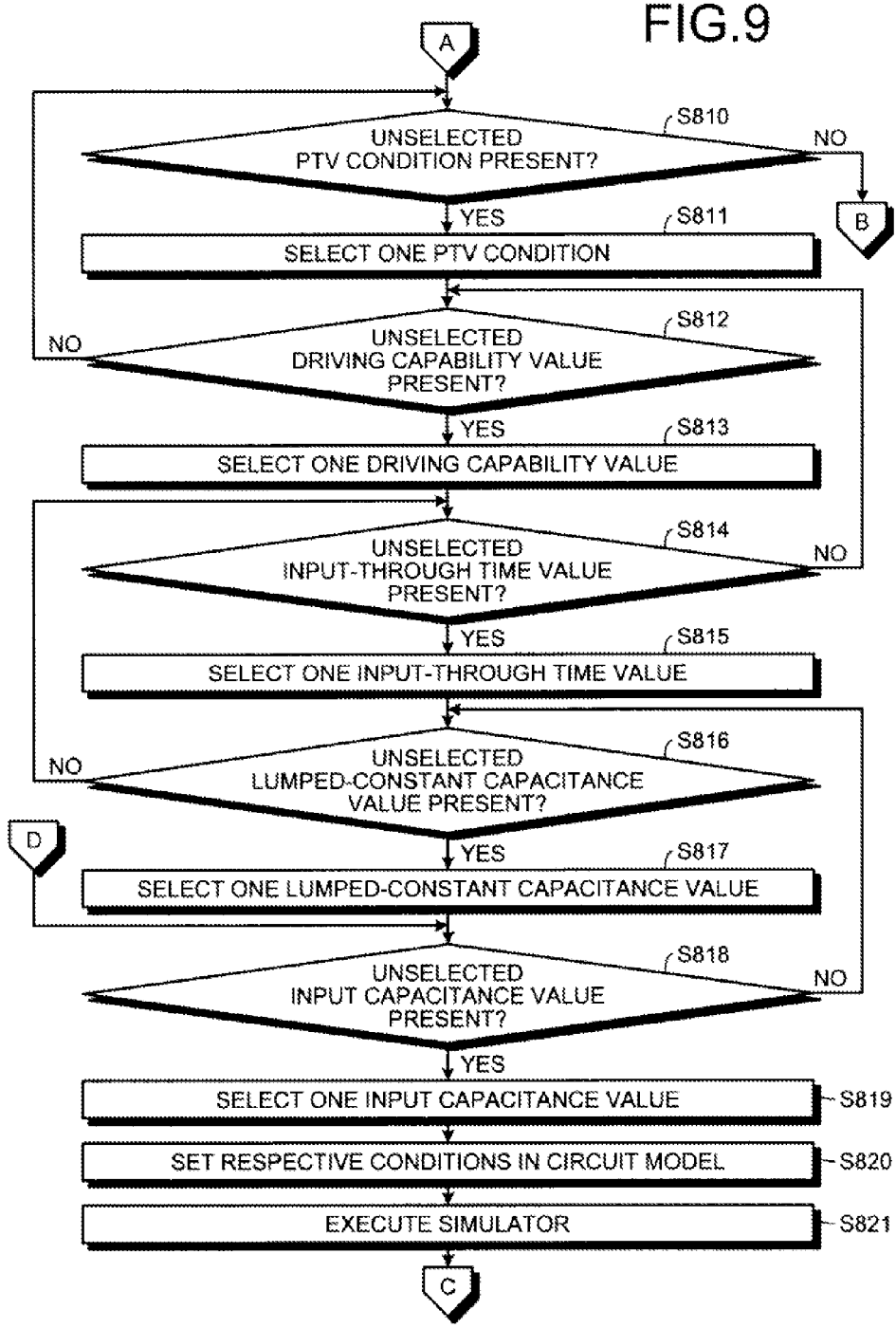
Figure 10:
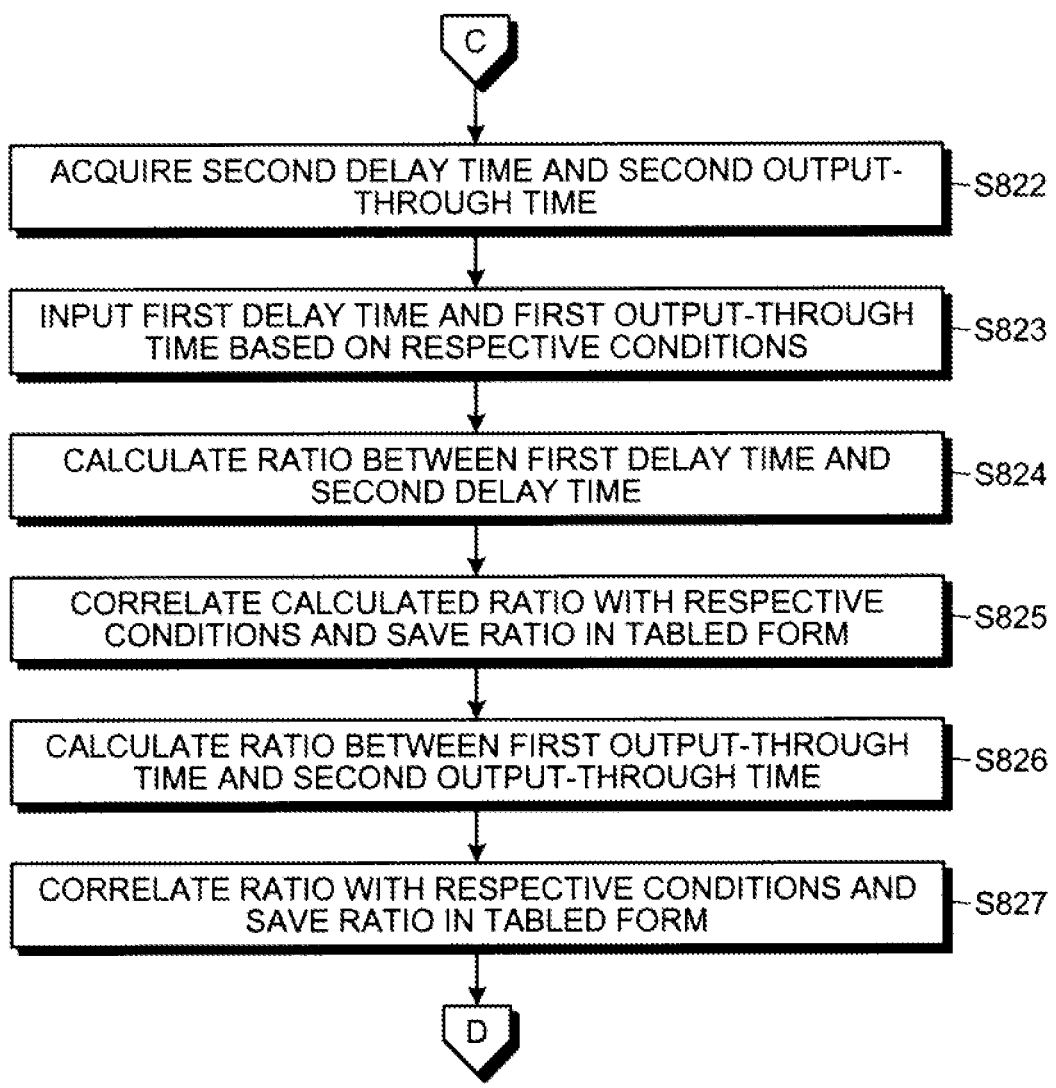

FIGS. 8 to 10 are flowcharts of examples of a design support procedure by the design support apparatus of the first embodiment. As depicted in FIG. 8, whether an unprocessed rising input waveform is present is determined (step S801). If an unprocessed rising input waveform is present (step S801: YES), an input waveform is set as a rising waveform (step S802).

If no unprocessed rising input waveform is present (step S801: NO), whether an unprocessed falling input waveform remains is determined (step S803). If an unprocessed falling input waveform is present (step S803: YES), an input waveform is set as a falling waveform (step S804). Following step S802 or step S804, the circuit model information input unit 601 inputs a PTV condition (step S805), a driving capability value (step S806), and an input-through time (step S807). The circuit model information input unit 601 then inputs a lumped-constant capacitance value (step S808) and an input capacitance value (step S809).

Following step S809, the procedure proceeds to the processing depicted in the flowchart of FIG. 9, where whether an unselected PTV condition is present is determined (step S810). If an unselected PTV condition is present (step S810: YES), one PTV condition is selected (step S811). If no unselected PTV condition is present (step S810: NO), the procedure returns to step S803.

Following step S811, whether an unselected driving capability value is present is determined (step S812). If an unselected driving capability value is present (step S812: YES), one driving capability value is selected (step S813). If no unselected driving capability value is present (step S812: NO), the procedure returns to step S810.

Following step S813, whether an unselected input-through time is present is determined (step S814). If an unselected input-through time is present (step S814: YES), one input-through time is selected (step S815). If the no unselected input-through time is present (step S814: NO), the procedure returns to step S812.

Following step S815, whether an unselected lumped-constant capacitance value is present is determined (step S816). If an unselected lumped-constant capacitance value is present (step S816: YES), one lumped-constant capacitance value is selected (step S817). If the no unselected lumped-constant capacitance value is present (step S816: NO), the procedure returns to step S814.

Following step S817, whether an unselected input capacitance value is present is determined (step S818). If an unselected input capacitance value is present (step S818: YES), one input capacitance value is selected (step S819). If the no unselected input capacitance value is present (step S818: NO), the procedure returns to step S816.

Following step S819, the setting unit 602 sets respective conditions in the circuit model (steps S820), and the simulator is executed (step S821).

Following step S821, the procedure proceeds to the processing depicted in the flowchart of FIG. 10, where the acquiring unit 603 acquires a second delay time and a second output-through time (step S822), and the circuit model information input unit 601 inputs a first delay time and a first output-through time based on respective conditions (step S823). When a delay time and an output-through time based on a PTV condition, an input waveform, a driving capability value, and a lumped-constant capacitance value are stored in the storage apparatus, the first delay time and the first output-through time may be acquired from the storage apparatus based on respective conditions.

The ratio between the first delay time and the second delay time is then calculated (step S824), and the calculated ratio is correlated with respective conditions and is saved in a tabled form (step S825). The ratio between the first output-through time and the second output-through time is also calculated (step S826), and the calculated ratio is correlated with respective conditions and is saved in a tabled form (step S827), after which the procedure returns to step S818. At step S803, if no unprocessed the falling waveform is present (step S803: NO), the procedure ends. While a delay time correcting coefficient and a delay time output-through time are calculated simultaneously in the present design support procedure, the correction coefficient and the output-through time may be calculated individually.

A second embodiment relates to an example of automatic generation of a delay time correcting equation from the delay time correcting table made in the first embodiment and also automatic generation of an output-through time correcting equation from the output-through time correcting table. Correction equations are thus generated easily. Correction of the delay time using a correction equation increases the speed of the correction process as compared to using the correcting table. Elements identical to those described in the first embodiment will be denoted by the same reference numerals used in the first embodiment and will be omitted in further description.

Figure 11:
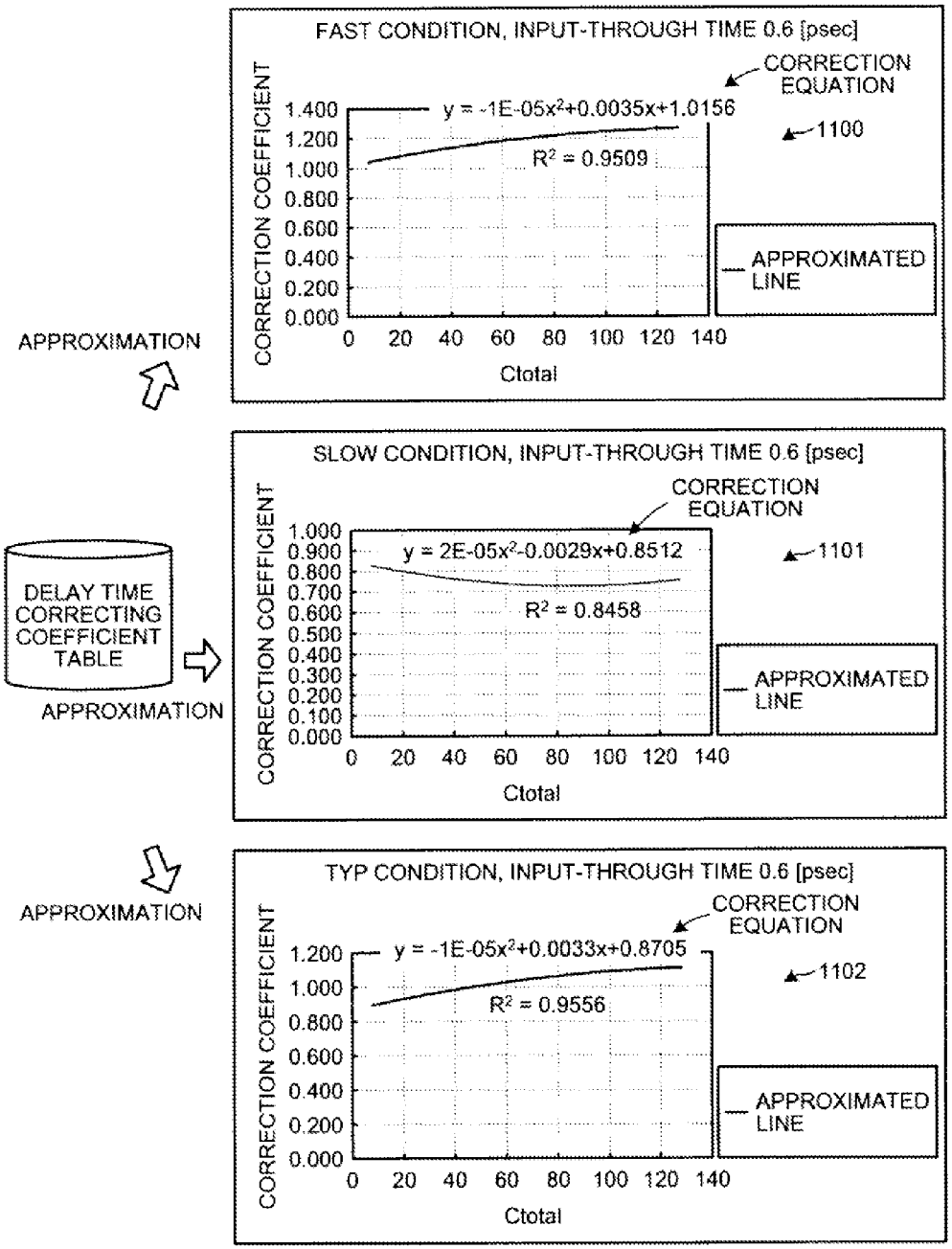
FIG. 11 is an explanatory diagram of an example of a second embodiment.

FIG. 11 is an explanatory diagram of an example of the second embodiment. A delay time correcting equation is described in this example. From the table of delay time correcting coefficients calculated in the first embodiment, a correction coefficient is linearly approximated for each driving capability value, PTV condition, input waveform, input capacitance value, and input-through time to calculate a delay time correcting equation. For example, in each of graphs 1100 to 1102, the vertical axis represents correction coefficient and the horizontal axis represents lumped-constant capacitance value Ctotal. The graph 1100 depicts a correction equation calculated by linearly approximating a delay time correcting coefficient from the table 702 that is determined under the FAST condition as the PTV condition and an input-through time of 0.6. The graph 1101 depicts a correction equation calculated by linearly approximating a delay time correcting coefficient from the table 702 that is determined under the SLOW condition as the PTV condition and an input-through time of 0.6. The graph 1102 depicts a correction equation calculated by linearly approximating a delay time correcting coefficient from the table 702 that is determined under the TYP condition as the PTV condition and an input-through time of 0.6 [psec]. R2 represents a level of similarity between a delay time correcting coefficient and a delay time correcting equation. If R2 is 1, the delay time correcting coefficient coincides with the delay time correcting equation.

In the second embodiment, a delay time correcting equation and an output-through time correcting equation are calculated by functions of the extracting unit 606, the correction equation calculating unit 607, and the storing unit 605 of the design support apparatus. Only the functions of the extracting unit 606, the correction equation calculating unit 607, and the storing unit 605, therefore, will be described.

The extracting unit 606 has a function of extracting from among delay time correcting coefficients stored by the storing unit 605, a delay time correcting coefficient corresponding to the driving capability value and the input capacitance value input by the circuit model information input 601. For example, the CPU 501 extracts the delay time correcting coefficient from the table 702, based on the driving capability value, the input capacitance value, an input waveform, a PTV condition, and an input-through time.

Further, the extracting unit 606 has a function of extracting from among output-through time correcting coefficients stored by the storing unit 605, an output-through time correcting coefficient corresponding to the driving capability value and the input capacitance value input by the circuit model information input 601. For example, the CPU 501 extracts the output-through time correcting coefficient from the table 705, based on the driving capability value, the input capacitance value, an input waveform, a PTV condition, and an input-through time.

The correction equation calculating unit 607 has a function of linearly approximating the delay time correcting coefficient extracted by the extracting unit 606 to calculate a correction equation. More specifically, for example, the CPU 501 linearly approximates the extracted delay time correcting coefficient to calculate the delay time correcting equation. For example, a delay time correcting coefficient may be obtained by substituting a lumped-constant capacitance value Ctotal in the calculated correction equation.

Further, the correction equation calculating unit 607 has a function of linearly approximating the output-through time correcting coefficient extracted by the extracting unit 606 to calculate a correction equation. More specifically, for example, the CPU 501 linearly approximates the extracted output-through time correcting coefficient to calculate the output-through time correcting equation. For example, an output-through time correcting coefficient may be obtained by substituting a lumped-constant capacitance value Ctotal in the calculated correction equation.

The storing unit 605 has a function of storing the delay time correcting equation calculated by the correction equation calculating unit 607 to the storage apparatus. For example, the CPU 501 correlates the delay time correcting equation with a driving capability value, an input capacitance value, an input waveform, a PTV condition, and an input-through time and stores the correlated delay time correcting equation as library data in the storage apparatus, such as the RAM 503 and the magnetic disk 505.

Further, the storing unit 605 has a function of storing the output-through time correcting equation calculated by the correction equation calculating unit 607 to the storage apparatus. For example, the CPU 501 correlates the output-through time correcting equation with a driving capability value, an input capacitance value, an input waveform, a PTV condition, and an input-through time and stores the correlated output-through time correcting equation as library data in the storage apparatus, such as the RAM 503 and the magnetic disk 505.

In this manner, whatever a lumped-constant capacitance value for a cell in the circuit-under-design may be, the user corrects the delay time of the cell in the circuit-under-design, using a delay time correcting equation, to be able to easily modify the delay time of the cell into a proper delay time. The user also corrects an output-through time of the cell in the circuit-under-design, using an output-through time correcting equation, to be able to easily modify the output-through time of the cell into a proper output-through time. This improves the accuracy of the estimation of the delay time and of the output-through time of a cell, thereby improving verification accuracy.

Figure 12:
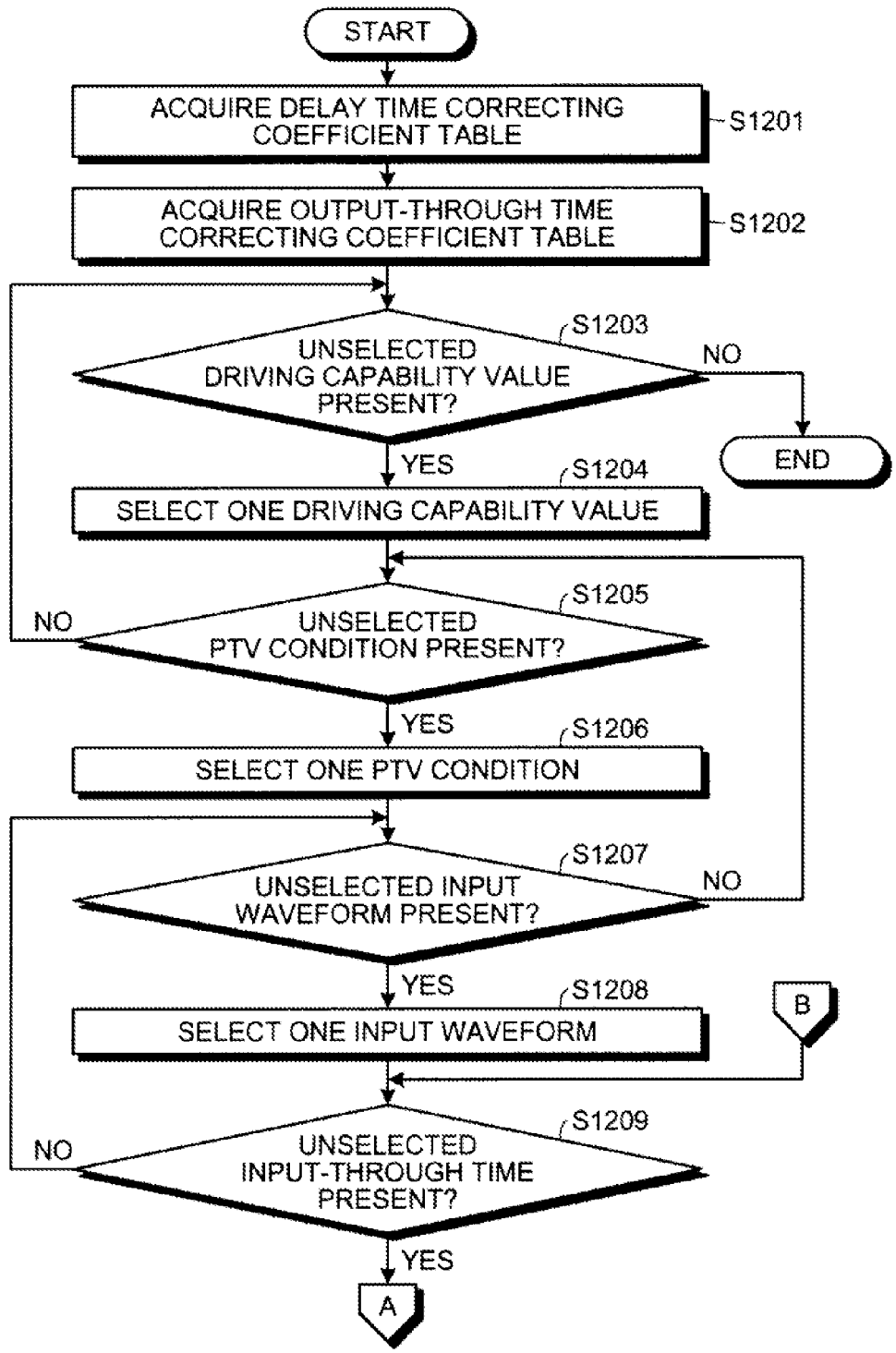
FIGS. 12 and 13 are flowcharts of examples of a design support procedure by the design support apparatus of the second embodiment.
Figure 13:
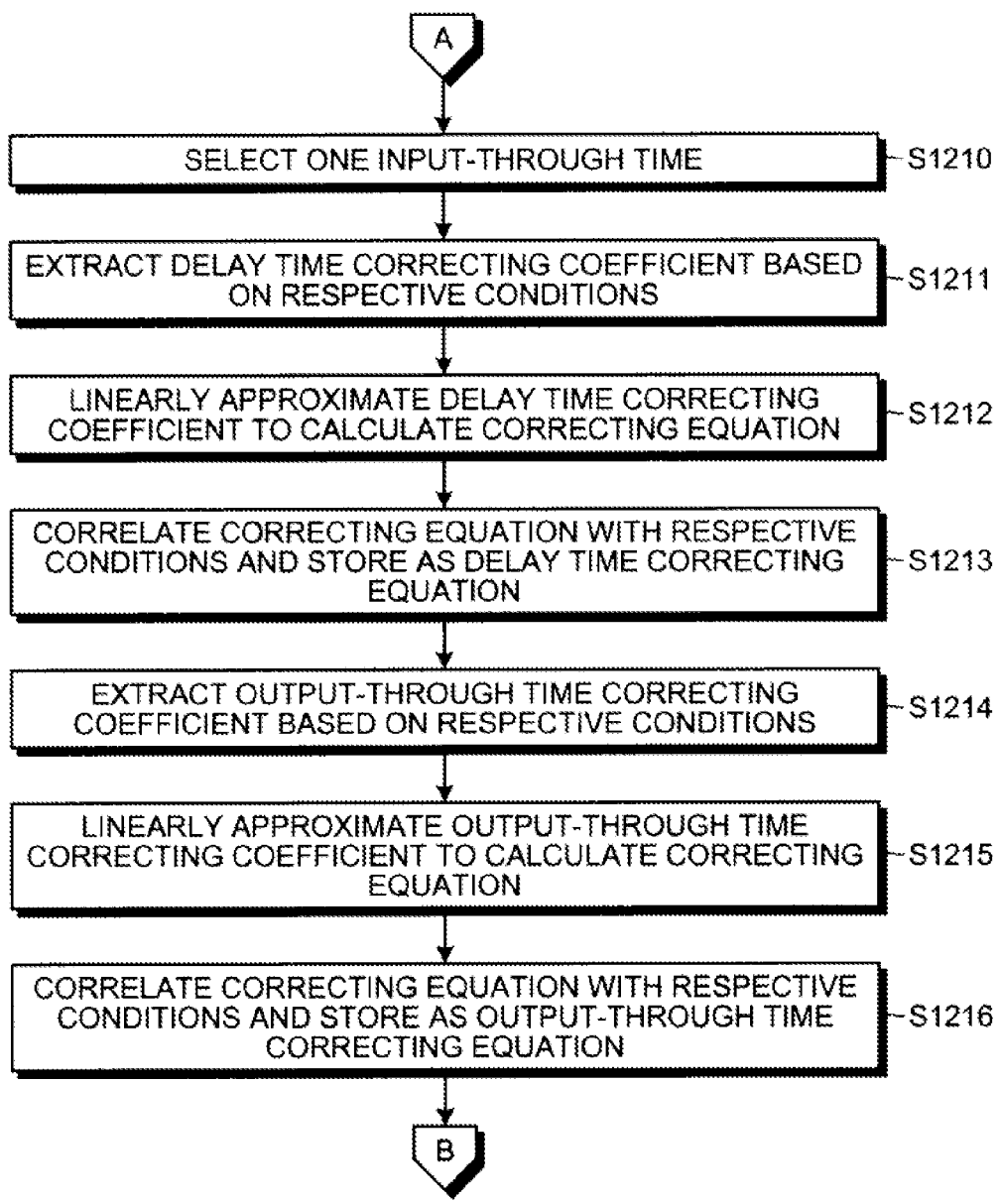

FIGS. 12 and 13 are flowcharts of examples of a design support procedure by the design support apparatus of the second embodiment. In FIG. 12, the calculation procedure for a delay time correcting equation and an output-through time correcting equation is described with an assumption that the delay time correcting coefficient table and the output-through time correcting coefficient table are stored in advance in the storage apparatus. The design support procedure of FIG. 12 is described as the procedure carried out when the input capacitance value is an arbitrary input capacitance value. The delay time correcting coefficient table, e.g., the table 702, is acquired (step S1201). The output-through time correcting coefficient table, e.g., the table 705, is acquired (step S1202).

Subsequently, whether an unselected driving capacity value is present in the acquired delay time correcting coefficient table and in the output-through time correcting coefficient table is determined (step S1203). If an unselected driving capacity value is present (step S1203: YES), one driving capacity value is selected (step S1204).

Following step S1204, whether an unselected PTV condition is present in the acquired delay time correcting coefficient table and in the acquired output-through time correcting coefficient table is determined (step S1205). If an unselected PTV condition is present (step S1205: YES), one PTV condition is selected (step S1206). On the other hand, if no PTV condition is present (step S1205: NO), the procedure returns to step S1203.

Following step S1206, whether an unselected input waveform is present in the acquired delay time correcting coefficient table and in the acquired output-through time correcting coefficient table is determined (step S1207). If an unselected input waveform is present (step S1207: YES), one input waveform is selected (step S1208). On the other hand, if no input waveform is present (step S1207: NO), the procedure returns to step S1205.

Following step S1208, whether an unselected input-through time is present in the acquired delay time correcting coefficient table and in the acquired output-through time correcting coefficient table is determined (step S1209). If an unselected input-through time is present (step S1209: YES), one input-through time is selected (step S1210). On the other hand, if no input-through time is present (step S1209: NO), the procedure returns to step S1207.

As depicted in FIG. 13, following step S1210 depicted, a delay time correcting coefficient is extracted based on the respective selected conditions (step S1211), and is linearly approximated to calculate a correction equation (step S1212) that is correlated with the respective conditions and is stored to the storage apparatus as a delay time correcting equation (step S1213). Subsequently, an output-through time correcting coefficient is extracted based on the respective selected conditions (step S1214), and is linearly approximated to calculate a correction equation (step S1215) that is correlated with the respective conditions and is stored to the storage apparatus as an output-through time correcting equation (step S1216), after which the procedure returns to step S1209.

If no unselected driving capacity value is present at step S1203 depicted in FIG. 12 (step S1203: NO), the procedure ends.

A third embodiment relates to an example of correction of the delay time of an arbitrary cell in the circuit-under-design, based on the delay time correcting coefficient table generated by the functions of the first embodiment. Elements identical to those described in the first and the second embodiments will be denoted by the same reference numerals used in the first and the second embodiments and will be omitted in further description.

Figure 14:
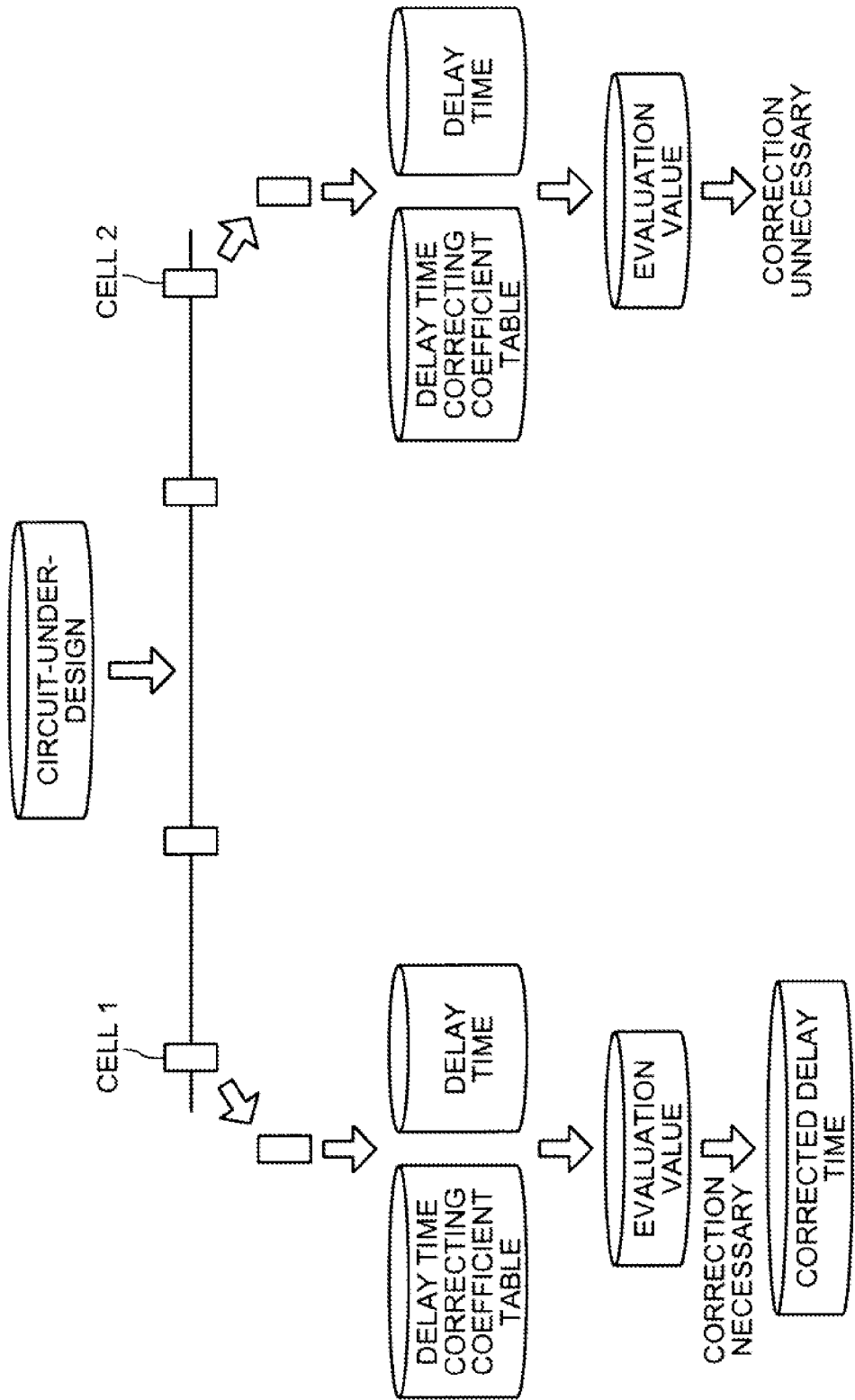
FIG. 14 is an explanatory diagram of an example of a third embodiment.

FIG. 14 is an explanatory diagram of an example of the third embodiment. The circuit-under-design is read out from the storage apparatus, and an arbitrary cell in the circuit-under-design is determined to be a subject cell. The function of the subject cell, a driving capability value of the subject cell, and an input capacitance of a cell immediately downstream from the subject cell are specified. A delay time stored in the storage apparatus for each function and driving capability value is read out based on the function and the driving capability value of the subject cell.

From the delay time correcting table, a delay time correcting coefficient is read out based on the driving capability value of the subject cell and the input capacitance of the cell immediately downstream. An evaluation value is then calculated based on the delay time correcting coefficient and the delay time prior to correction. Whether the delay time is to be corrected is determined based on the evaluation value. If the delay time is to be corrected, a corrected delay time is calculated using the delay time correcting coefficient and the delay time prior to correction.

In the case of a cell 1, an evaluation value is calculated from a delay time correcting coefficient in the delay time correcting coefficient table and a delay time of the cell 1. Based on the evaluation value, a determination is made that the delay time of the cell 1 is to be corrected using the delay time correcting coefficient retrieved from the delay time correcting coefficient table.

In the case of a cell 2, an evaluation value is calculated from a delay time correcting coefficient and a delay time of the cell 2. Based on the evaluation value, a determination is made that the delay time of the cell 2 does not need to be corrected. In this manner, a delay time and an output-through time of a subject cell may be corrected based on a proper delay time correcting coefficient and a proper output-through time correcting coefficient.

FIG. 15 is an explanatory diagram of an example of cell-related information. A table 1500 depicts an example of cell-related information including function 1501, cell name 1502, driving capability 1503, and input capacitance 1504. For example, when the function 1501 is BUFFER, the cell name 1502 includes entries of BUFFER 1, BUFFER 2, BUFFER 4, BUFFER 8, BUFFER 16, and BUFFER 32. These buffers belong to the same field of function 1501, but differ from each other in the fields of driving capability 1503 and input capacitance 1504. The table 1500 is stored as part of the library in the storage apparatus accessible by the CPU 501.

FIG. 16 is an explanatory diagram of an example of circuit information of the circuit-under-design. Circuit information 1600 of the circuit-under-design includes a path P, which includes an IOBUF 1, BUFs 1 to 5, and an IOBUF 2. The IOBUF 1 is the BUFFER 8, each of the BUFs 1 to 5 is the BUFFER 2, and the IOBUF 2 is the BUFFER 32.

Line capacitance is represented as cline. The IOBUF 1 has a line capacitance of 90 [fF]. An input capacitance value Ctr of a cell immediately downstream from the IOBUF 1 will be described. The cell immediately downstream from the IOBUF 1 is the BUF 1, which is the BUFFER 2. The table 1500 is referenced to obtain the entry in the input capacitance 1504 corresponding to BUFFER 2 listed as an entry under the cell name 1502. The input capacitance value of the cell immediately downstream from the IOBUF 1 is thus found to be 10 [fF].

The path P consists of a Path-1 to a Path-4. A delay time of the path P is, therefore, calculated by summing respective delay times of the Path-1 to the Path-4. The delay time of the Path-1 is calculated from the delay time and the output-through time of the IOBUF 1, the line capacitance cline, the input capacitance value of the BUF 1 as the cell immediately downstream, and an external input-through time, which will be described hereinafter.

In the third embodiment, a lumped-constant capacitance for the IOBUF 1 is described as a load capacitance given as the sum of a cline 1 and the input capacitance value of the BUF 1. A lumped-constant capacitance for the BUF 1 is the sum of the line capacitance from cline 1 to cline 5 and the respective input capacitance of cells immediately downstream, i.e., the input capacitances of the BUF 2 to the BUF 5. A lumped-constant capacitance for the BUF 2 is the sum of cline 6 and the input capacitance of the IOBUF 2. The input capacitance for the IOBUF 2 is 0. To calculate the delay time of the Path-4, an external load capacitance, which will be described hereinafter, is used as a load capacitance of the BUF 5.

The circuit information 1600 is stored in the storage apparatus accessible by the CPU 501. Constraint conditions will be described with reference to FIGS. 17A and 17B.

FIG. 17A is an explanatory diagram of an example of a PTV condition. PTV signifies Process, Temperature, and Voltage. A PTV condition table 1700 includes PTV condition 1701, Process, Temperature, and Voltage. The PTV condition 1701 includes entries of TPY condition (under which each cell operates at normal speed), FAST condition (under which each cell operates at the highest speed), and SLOW condition (under which each cell operates at the lowest speed). The PTV condition 1701 may include another condition other than the TPY condition, FAST condition, and SLOW condition. Furthermore, values in the PTV condition table 1700 are listed as an example.

The TPY condition is a condition under which Process follows the TPY condition (normal condition), Temperature is 25° C. (normal temperature), and Voltage is 1.2 V. The FAST condition is a condition under which Process follows the FAST condition (fast condition), Temperature is −40° C. (low temperature), and Voltage is 1.3 V. The SLOW condition is a condition under which Process follows the SLOW condition (slow condition), Temperature is 120° C. (high temperature), and Voltage is 1.1 V. The PTV condition table 1700 is stored in the storage apparatus accessible by the CPU 501.

FIG. 17B is an explanatory diagram of an example of a constraint condition other than the PTV condition. A table 1702 includes information of external input-through time, external load capacitance value, and operating frequency information. When a subject cell, for which delay time is to be calculated, is connected to an input terminal, the external input-through time is used as an input-through time of the subject cell. The circuit information 1600 indicates that the IOBUF 1 is connected to an input terminal. When a subject cell, for which delay time is to be calculated, is connected to an output terminal, the external load capacitance value is used as a lumped-constant capacitance for the subject cell. The circuit information 1600 indicates that the IOBUF 2 is connected to an output terminal. The operating frequency information includes frequencies of 2 GHz, 1 GHz, 100 MHz, and 10 MHz. In the third embodiment, 1 GHz is selected for correcting the delay time of a cell.

FIG. 18A is an explanatory diagram of an example of a delay time table. A table 1800 is a delay time table. In the table 1800, delay times and input-through times under the TYP condition, the FAST condition, and the SLOW condition are listed for each cell name.

The delay time table is a table that indicates the dependent relation between the input-through time, the lumped-constant capacitance Ctotal, and the delay time. For example, according to a sub-table for the TYP condition and the BUFFER 8, when the input-through time is 1.00 [psec] and the lumped-constant capacitance Ctotal is 1.00 [fF], the delay time is 60.00 [psec]. Likewise, when the input-through time is 100.00 [psec] and the lumped-constant capacitance Ctotal is 100.00 [fF], the delay time is 195.00 [psec]. Hence, an increase in the lumped-constant capacitance Ctotal results in an increase in the delay time, and an increase in the input-through time also results in an increase in the delay time. The delay time table is stored as part of the library in the storage apparatus accessible by the CPU 501.

FIG. 18B is an explanatory diagram of an example of an output-through time table. A table 1801 is an output-through time table. The output-through time table 1801 indicates the dependent relation between the input-through time, the lumped-constant capacitance Ctotal, and the output-through time. For example, according to a sub-table for the BUFFER 8, when the input-through time is 1.00 [psec] and the lumped-constant capacitance Ctotal is 1.00 [fF], the output-through time is determined to be 10.00 [psec].

Likewise, when the input-through time is 100.00 [psec] and the lumped-constant capacitance Ctotal is 100.00 [fF], the output-through time is determined to be 120.00 [psec]. Hence, an increase in the lumped-constant capacitance Ctotal results in an increase in the output-through time, and an increase in the input-through time also results in an increase in the output-through time. The output-through time table is stored as part of the library in the storage apparatus accessible by the CPU 501.

Figure 19:
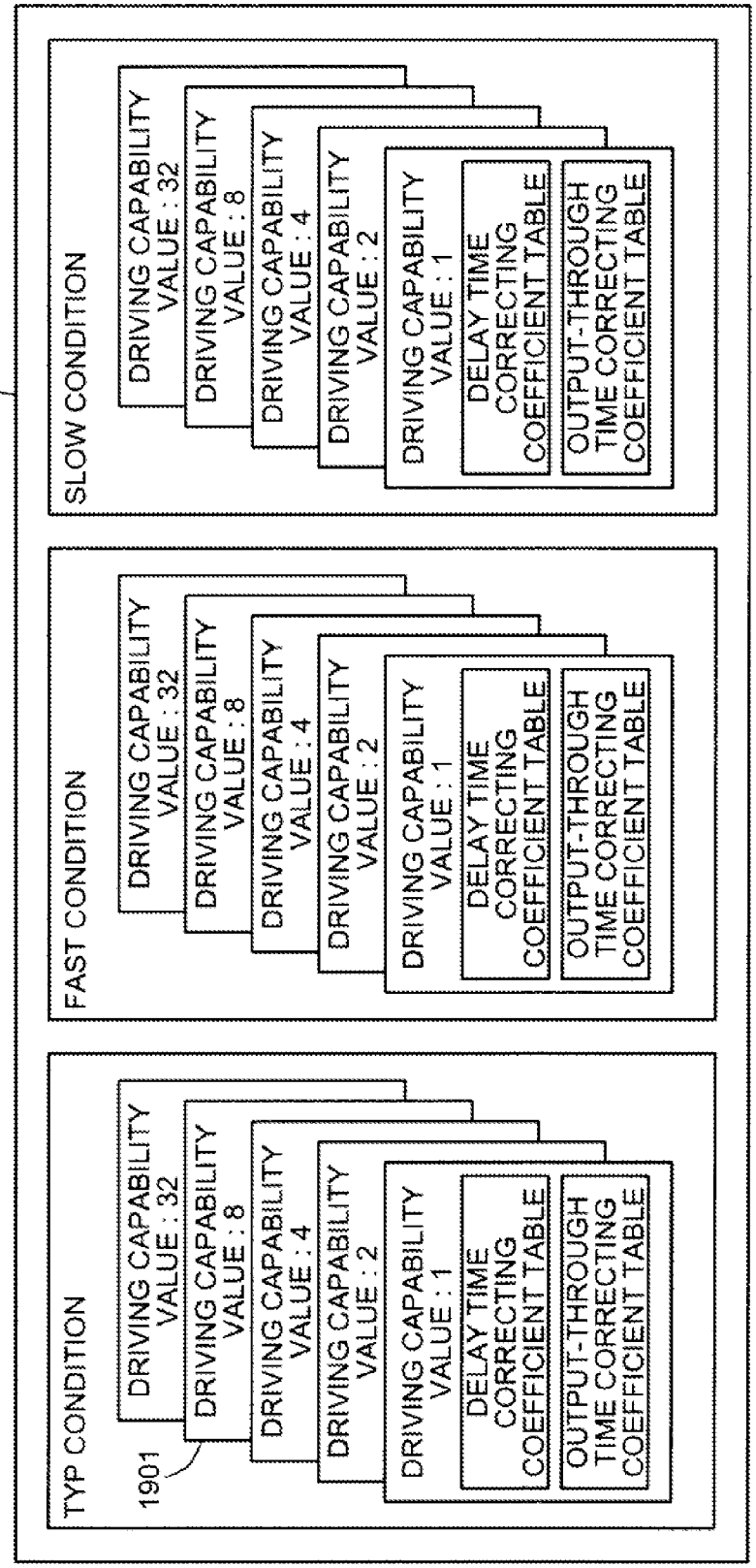
FIG. 19 is an explanatory diagram of an example of a delay time correcting coefficient table and an output-through time correcting coefficient table.

FIG. 19 is an explanatory diagram of an example of the delay time correcting coefficient table and the output-through time correcting coefficient table. A table 1900 includes a delay time correcting coefficient table and an output-through time correcting coefficient table for each PTV condition and driving capability value. For example, the table 1900 includes correcting coefficient tables corresponding to respective driving capacitance values under the TYP condition. A table 1901 is a table for the TYP condition and the driving capability value of 8 in the table 1900. Delay time correcting coefficient tables and output-through time correcting coefficient tables are stored as part of the library in the storage apparatus accessible by the CPU 501.

FIG. 20 is an explanatory diagram of an example of the table 1901. Under the TYP condition, the table 1901 includes a delay time correcting coefficient table 2001 and an output-through time correcting coefficient table 2002. The delay time correcting coefficient table 2001 holds a list of delay time correcting coefficients based on input capacitance of a cell immediately downstream, input-through time, and lumped-constant capacitance. Similar to the delay time correcting coefficient table 2001, the output-through time correcting coefficient table 2002 holds a list of output-through time correcting coefficients based on input capacitance of a cell immediately downstream, input-through time, and lumped-constant capacitance.

FIG. 21 is an explanatory diagram of an example of a reference value. A table 2100 includes operating frequency 2100 and reference value 2102. A reference value is equivalent to a given threshold. The design support apparatus determines whether the delay time is to be corrected, based on whether an evaluation value is at least equal to the reference value.

A table 2103 includes operating frequency 2104, determination item 2105, and reference value 2106. The determination item 2105 has an entry of any one among correction unnecessary and correction equation. The reference value 2106 corresponding to "correction unnecessary" is the reference value for determining whether to correct the delay time. The reference value 2106 corresponding to "correction equation" is the reference value for determining whether to correct the delay time using a correction equation.

A table 2107 includes operating frequency 2108, determination item 2109, and reference value 2110. The determination item 2109 has an entry of any one among correction unnecessary, correction equation, and table. The reference value 2110 corresponding to "correction unnecessary" as the determination item 2109 is the reference value for determining whether to correct the delay time. The reference value 2110 corresponding to "correction equation" as the determination item 2109 is the reference value for determining whether to correct the delay time using a correction equation. The reference value 2110 corresponding to "table" as the determination item 2109 is the reference value for determining whether to correct the delay time using a table or to convert the delay time into a value indicative of propagation of an indefinite value. In third to sixth embodiments, a reference value is determined from the table 2100. In a seventh embodiment, a reference value is determined from the table 2103. In an eighth embodiment, a reference value is determined from the table 2107. The tables 2100, 2103, and 2107 are, for example, generated by the user after calculation of delay time correcting coefficients in the first embodiment, and are stored in the storage apparatus accessible by the CPU 501.

The functions of the subject cell information input unit 608, the retrieving unit 609, the evaluation value calculating unit 604, the corrected-time calculating unit 610, and the output unit 614 of the design support apparatus 600 will be described in detail in the third embodiment.

The subject cell information input unit 608 has a function of inputting a driving capability value of an arbitrary subject cell described in the circuit information of the circuit-under-design, the input capacitance value of a cell immediately downstream from the subject cell, and the delay time of the subject cell. Specifically, for example, the user selects the IOBUF 1 as the subject cell from the circuit information 1600. The user then inputs the driving capability value of the subject cell, the input capacitance value of a cell immediately downstream from the subject cell, and the delay time of the subject cell, which are received by the CPU 501. The user further inputs a PTV condition, which is received by the CPU 501.

In another example, the CPU 501 selects the IOBUF 1 as the subject cell from the circuit information 1600; retrieves from the table 1500, the driving capability value of the subject cell and the input capacitance value of the cell immediately downstream from the subject cell; and retrieves from the table 1800, the delay time of the subject cell. The CPU 501 then, for example, selects an arbitrary condition included in the field of the PTV condition 1701 from the table 1700. Because the IOBUF 1 is the BUFFER 8, 8 is input as the driving capability value, while 10 is input as the input capacitance value of the cell immediately downstream from the IOBUF 1. In the third embodiment, the selected PTV condition is assumed to be the TYP condition. The sub-table for the BUFFER 8 under the TYP condition is thus selected in the table 1800, and a delay time retrieved from this sub-table is input as the delay time of the subject cell.

The retrieving unit 609 has a function of retrieving the delay time correcting coefficient corresponding to the driving capacity value of a subject cell and the input capacitance value of a cell immediately downstream that are input by the subject cell information input unit 608 from among the delay time correcting coefficients stored in the storage apparatus by the storing unit 605. Specifically, for example, the CPU 501 selects the delay time correcting coefficient from the table 1900, based on a PTV condition, the driving capacity value of the subject cell, and the input capacitance value of the cell immediately downstream.

More specifically, for example, because the PTV condition is given as the TYP condition in the third embodiment, all tables under the TYP condition are retrieved from the table 1900. Because the driving capacitance value of the IOBUF 1 is 8, the table 1901 is then retrieved. Then, from the delay time correcting coefficient table of the table 1901, a delay time correcting coefficient corresponding to an input capacitance of 10 for the cell immediately downstream, is retrieved. The retrieved delay time correcting coefficient is temporarily stored in the storage apparatus, such as the RAM 503 and the magnetic disk 505.

The corrected-time calculating unit 610 calculates a corrected delay time of a subject cell based on a delay time of the subject cell input by the subject cell information input unit 608 and a delay time correcting coefficient retrieved by the retrieving unit 609.

For example, the CPU 501 selects an arbitrary delay time from among input delay times of the subject cell and selects from among retrieved delay time correcting coefficients, a delay time correcting coefficient corresponding to the delay time of the subject cell. When the delay time correcting coefficient is a ratio, the selected delay time of the subject cell is multiplied by the selected delay time correcting coefficient to generate the corrected delay time. When the delay time correcting coefficient is a time difference, the selected delay time correcting coefficient is added to the selected delay time of the subject cell to produce the corrected delay time.

For example, when an arbitrary delay time is selected from among delay times of a subject cell, a total load capacitance of the subject cell is calculated by summing line capacitance cline and input capacitance values of cells immediately downstream. In the case of the IOBUF 1, specifically, the CPU 501 acquires the line capacitance cline 90 [fF] of the IOBUF 1 and the input capacitance 10 [fF] of the cell immediately downstream and sums 90 [fF] and 10 [fF] to obtain 100 [fF] as the total load capacitance of the IOBUF 1. The CPU 501 then determines the total load capacitance of the IOBUF 1 as a lumped-constant capacitance value, and selects delay times corresponding to the total load capacitance 100 [fF] from among input delay times of the subject cell. The selected delay times of the subject cell in this case are 180 [psec], 190 [psec], and 195 [psec].

Subsequently, for example, the CPU 501 selects a delay time corresponding to the worst input-through time condition of 100 [psec] from among the selected delay times. The selected delay time of the subject cell is, therefore, 195 [psec]. The CPU 501 then selects from among delay time correcting coefficients retrieved by the retrieving unit 609, a delay time correcting coefficient corresponding to the lumped-constant capacitance value 100 [fF] and the input-through time 100 [psec]. The selected delay time correcting coefficient is 1.55.

Subsequently, for example, the CPU 501 multiplies the selected delay time of the subject cell by the selected delay time correcting coefficient to produce a corrected delay time, which is, in this case, 302.25 [psec]. The corrected delay time is stored to the storage apparatus, such as the RAM 503 and the magnetic disk 505.

The evaluation value calculating unit 604 has a function of calculating a relative evaluation value for a delay time and a corrected delay time of a subject cell. Specifically, for example, the CPU 501 calculates a time difference between the calculated corrected delay time and the delay time of the subject cell. In this case, 195 [psec] is subtracted from 302.25 [psec] to obtain 107.25 [psec].

Subsequently, for example, the CPU 501 calculates the ratio of the calculated time difference to a time span of one period of the above operating frequency. In the third embodiment, the operating frequency is assumed to be 1 GHz, which gives the time span of one period of 1000 [psec]. The percentage of the calculated time difference is thus calculated at 107.25/1000, which is multiplied by 100 to obtain 10.73[%].

The determining unit 611 has a function of determining whether to correct the delay time of a subject cell, based on whether a relative evaluation value calculated by the evaluation value calculating unit 604 for the delay time of the subject cell and a corrected delay time is equal to or more than a given threshold. Specifically, for example, the CPU 501 acquires the reference value 2102 based on the operating frequency 2101, from the table 2100, in which case the reference value 2102 is 1. The reference value is equivalent to the given threshold. Specifically, for example, the CPU determines to correct the delay time of the subject cell when the calculated percentage is equal to or more than the given threshold, and determines not to correct the delay time of the subject cell when the calculated percentage is less than the given threshold. In this case, the calculated percentage is 10.73[%] versus the reference value 1. Correction of the delay time of the subject cell is, therefore, determined.

The corrected-time calculating unit 610 calculates a corrected delay time of a subject cell based on a delay time of the subject cell input by the subject cell information input unit 608 and a delay time correcting coefficient retrieved by the retrieving unit 609. Specifically, for example, when the delay time correcting coefficient is a ratio, the CPU 501 multiplies all input delay times of the subject cell by the retrieved delay time correcting coefficient to calculate corrected delay times of the subject cell. In another example, when the delay time correcting coefficient is a time difference, for example, the CPU 501 adds the retrieved delay time correcting coefficient to all input delay times of the subject cell to calculate corrected delay times of the subject cell.

Figure 22:
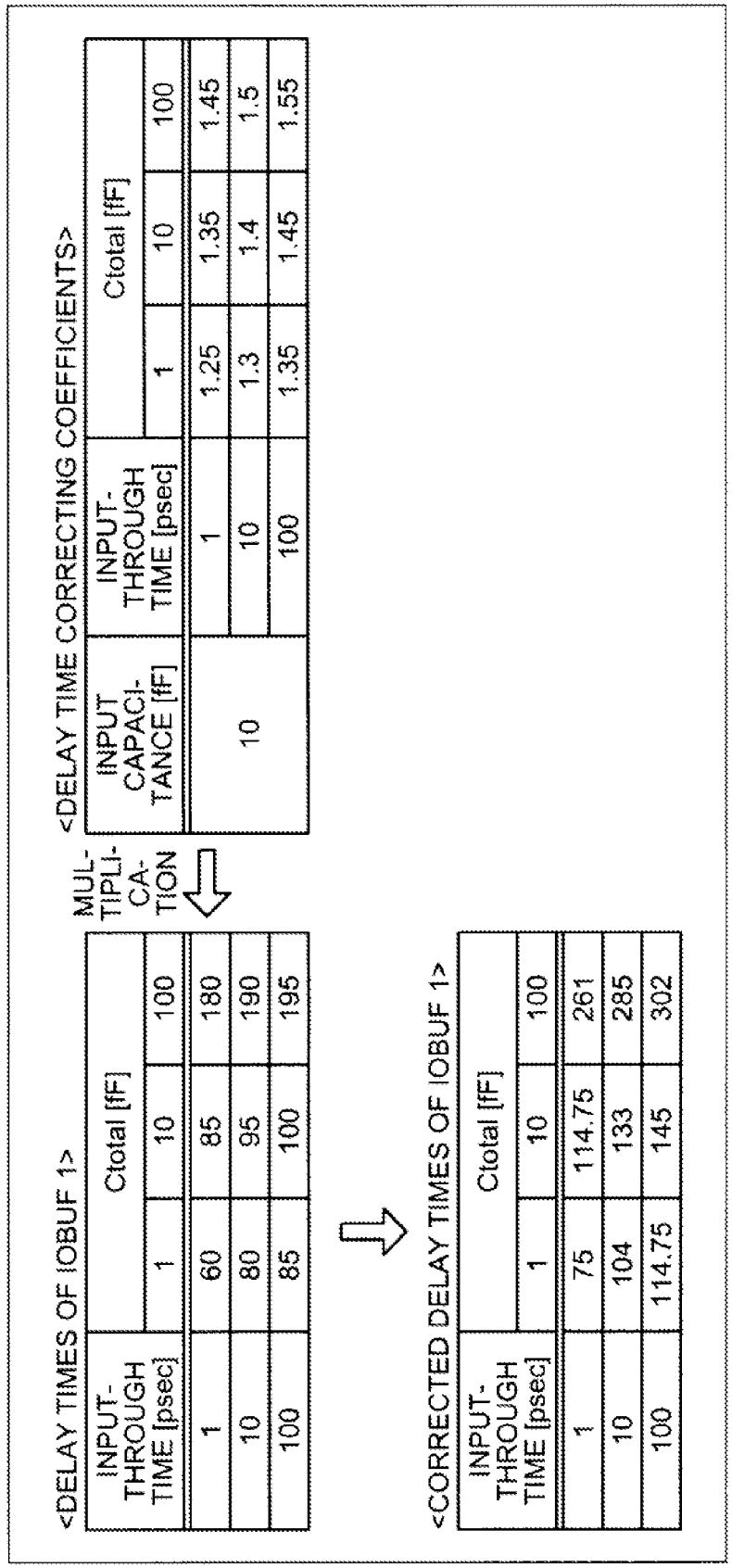
FIG. 22 is an explanatory diagram of an example of corrected delay times.

FIG. 22 is an explanatory diagram of an example of corrected delay times. FIG. 22 depicts corrected delay times of the IOBUF 1. The corrected delay times are calculated by multiplying the delay times of the subject cell by the delay time correcting coefficient retrieved by the retrieving unit 609.

The output unit 614 has a function of outputting a corrected delay time of a subject cell calculated by the corrected delay time calculating unit 610. Specifically, for example, the CPU 501 outputs the corrected delay time for the subject cell correlated with a PTV condition. The form of output includes display on the display 508, printout at the printer 513, and transmission to an external apparatus through the I/F 509. The corrected delay time may be stored in the storage apparatus, such as the RAM 503, the magnetic disk 505, and the optical disk 507.

In this manner, a delay time of a cell in the circuit-under-design is corrected into a proper delay time. This improves accuracy in the estimation of a delay time in the circuit-under-design, and allows the user to verify a cell that outputs a nonlinear output waveform, thus improves verification accuracy.

In addition, a cell requiring delay time correction is automatically specified to correct the delay time of the cell into a proper delay time. This improves estimation accuracy for a delay time of a cell, thus improves verification accuracy.

Figure 23:
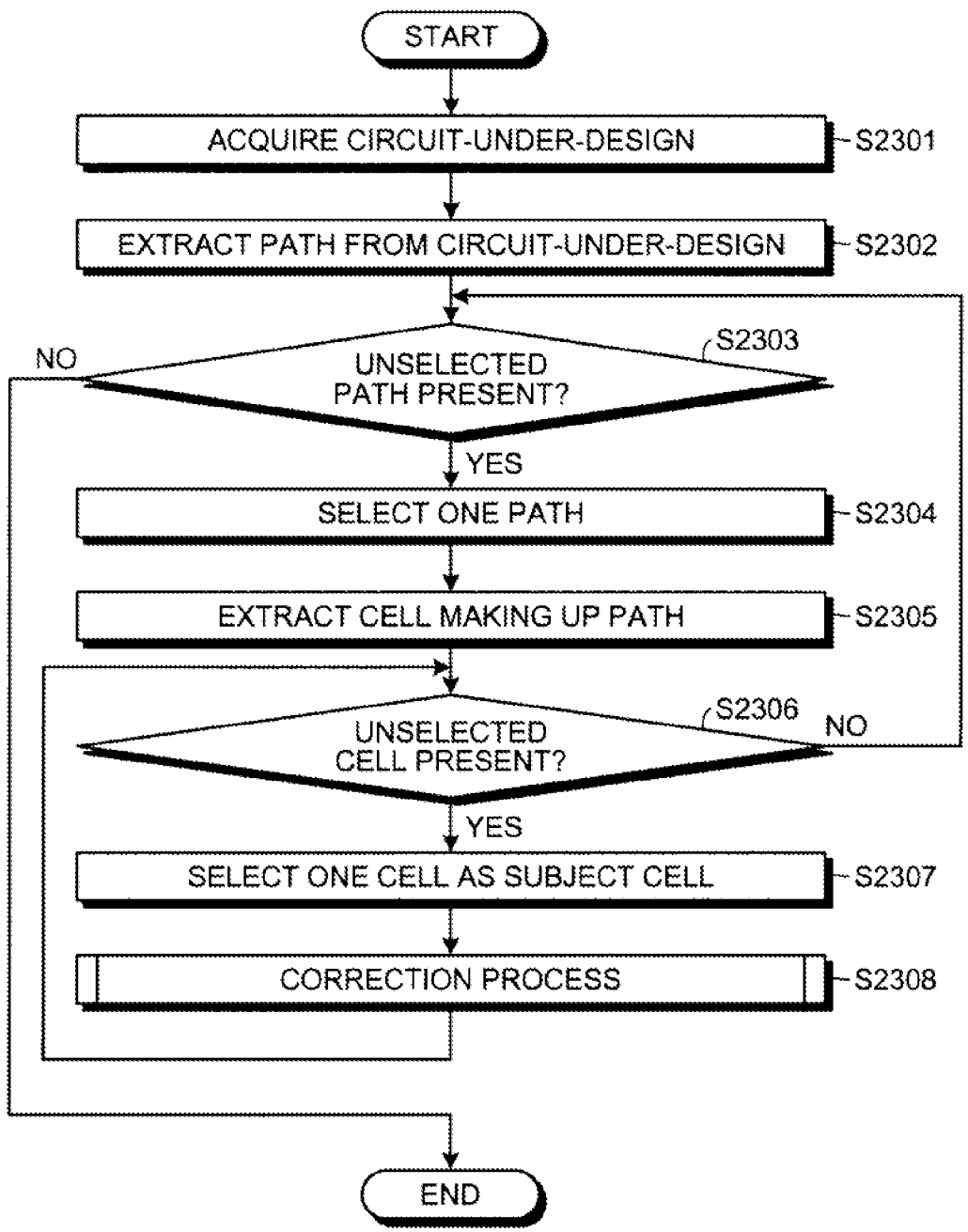
FIG. 23 is a flowchart of an example of a design support procedure by the design support apparatus of the third embodiment.

FIG. 23 is a flowchart of an example of a design support procedure by the design support apparatus of the third embodiment. A circuit-under-design is acquired (step S2301), and a path is extracted from the circuit-under-design (step S2302). Whether an unselected path is present is determined (step S2303).

If an unselected path is present (step S2303: YES), one path is selected (step S2304), and cells making up the selected path are extracted (step S2305). Whether an unselected cell is present is determined (step S2306). If an unselected cell is present (step S2306: YES), one cell is selected as a subject cell (step S2307), and a correction process is executed (step S2308), after which the procedure returns to step S2306.

If no unselected cell is present at step S2306 (step S2306: NO), the procedure returns to step S2303.

If no unselected path is present at step S2303 (step S2303: NO), the procedure ends.

Figure 24:
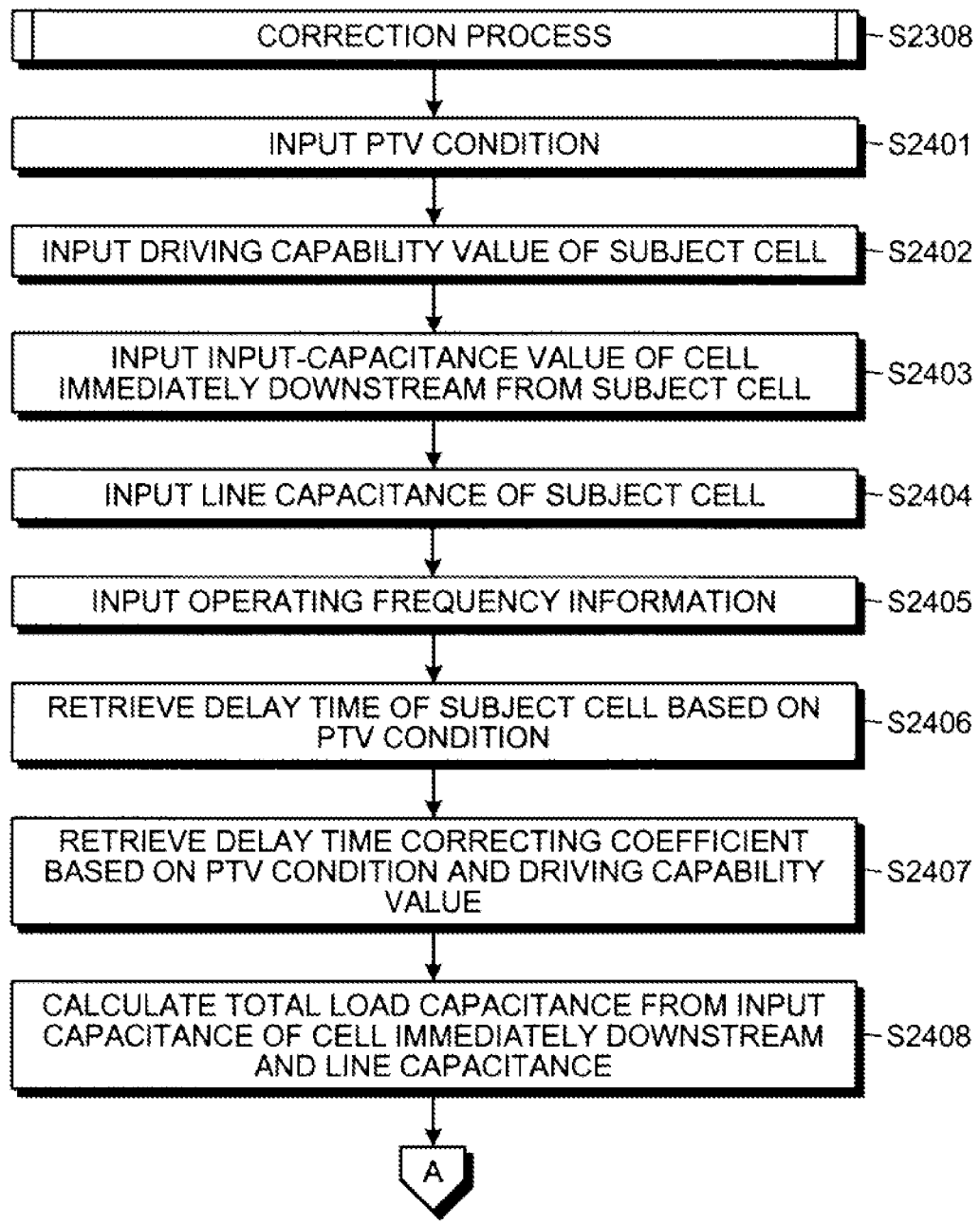
FIGS. 24 and 25 are flowcharts of a correction process (step S2308) depicted in FIG. 23.
Figure 25:
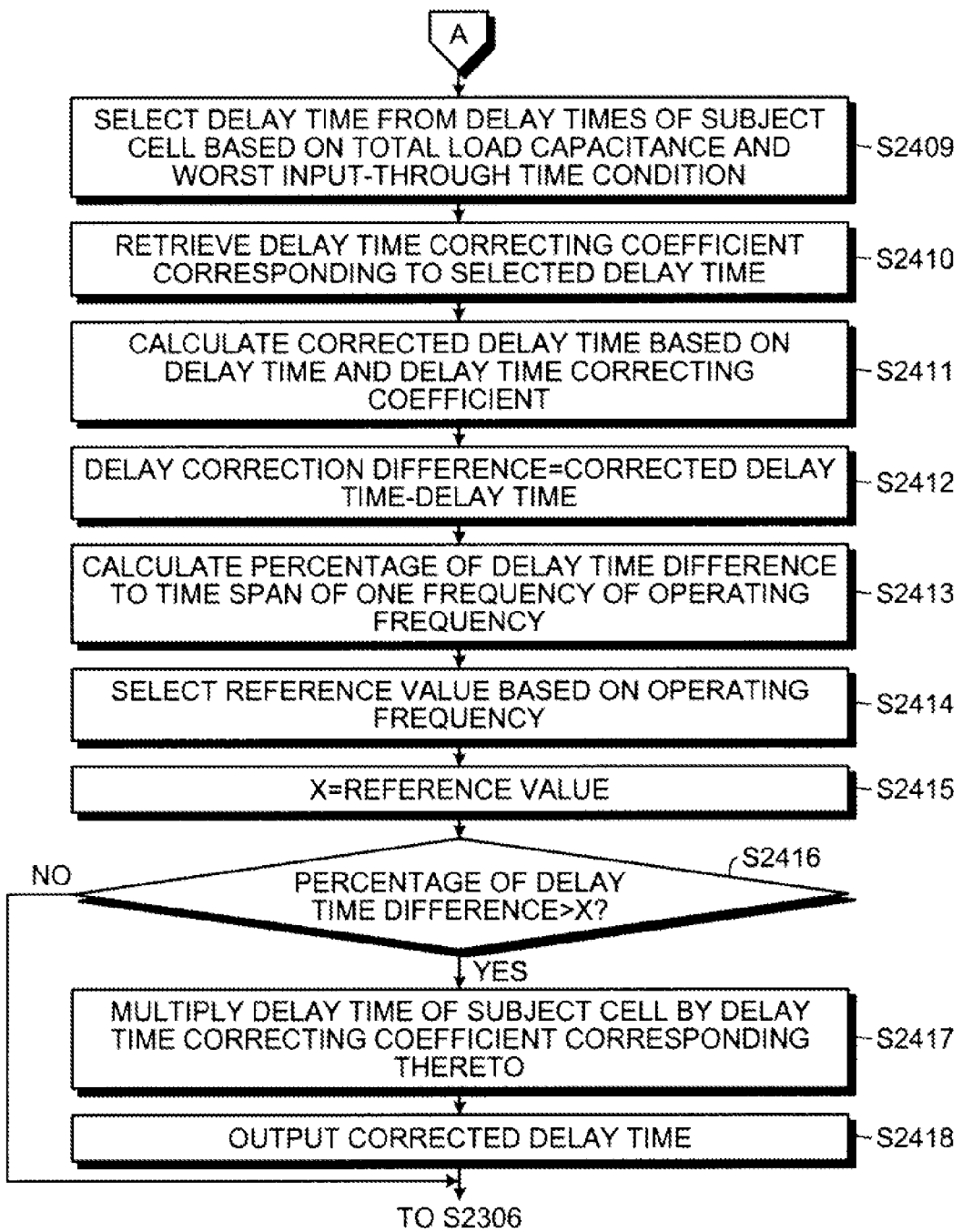

FIGS. 24 and 25 are flowcharts of the correction process (step S2308) depicted in FIG. 23. The subject cell information input unit 608 inputs a PTV condition (step S2401), and inputs a driving capacitance value of the subject cell (step S2402). The subject cell information input unit 608 further inputs an input capacitance value of a cell immediately downstream from the subject cell (step S2403), a line capacitance of the subject cell (step S2404), and operating frequency information (step S2405). A delay time of the subject cell is then retrieved from the delay time table, based on the PTV condition (step S2406).

Subsequently, based on the PTV condition and the driving capability value, a delay time correcting coefficient is retrieved from the delay time correcting coefficient table (step S2407), and a total load capacitance is calculated using the input capacitance value of the cell immediately downstream and the line capacitance (step S2408). The total load capacitance is equivalent to a lumped-constant capacitance Ctotal. The procedure then proceeds to the flowchart depicted in FIG. 25, where a delay time is selected from among delay times of the subject cell, based on the total load capacitance and the worst input-through time condition (step S2409). The worst input-through time condition means the largest input-through time. Hence, one delay time is selected from among delay times of the subject cell.

The retrieving unit 609 retrieves the delay time correcting coefficient corresponding to the selected delay time (step S2410), and the corrected-time calculating unit 610 calculates a corrected delay time, based on the delay time and the delay time correcting coefficient (step S2411). The correction coefficient calculating unit 612 then carries out calculation using the equation: delay correction difference=corrected delay time-delay time (step S2412) to calculate the percentage of a delay correction difference to a time span of one period of the operating frequency (step S1413).

A reference value is then selected based on the operating frequency (step S2414), and X=reference value is set (step S2415). The reference value is equivalent to a given threshold, and is selected from the table 2100. Subsequently, the determining unit 611 determines whether (percentage of delay correction difference)>X is satisfied (step S2416). If satisfaction of (percentage of delay correction difference)>X is determined (step 2416: YES), the corrected-time calculating unit 610 multiplies each delay time of the subject cell by each delay time correcting coefficient corresponding thereto (step S2417). In this case, the delay time correcting coefficient is the ratio between the first delay time and the second delay time of the first embodiment. Each corrected delay time is thus output (step S2418), after which the procedure returns to step S2306. If (percentage of delay correction difference) >X is determined to not be satisfied at step S2416 (step 2416: NO), the procedure proceeds to step S2306.

Although only the delay time of a subject cell is corrected using a delay time correcting coefficient in the third embodiment, only the output-through time of the subject cell may be corrected. When the delay time of the subject cell and the delay time correcting coefficient are replaced with the output-through time of the subject cell and an output-through time correcting coefficient, respectively, and via the functional units described in the third embodiment, the design support apparatus is able to correct the output-through time of the subject cell. The description of a specific process of correcting only the output-through time of the subject cell is therefore omitted.

A fourth embodiment relates to an example of using a delay time correcting equation to correct the delay time of an arbitrary subject cell selected from circuit information of the circuit-under-design, i.e., relates to an example of correcting the delay time of an arbitrary subject cell in the circuit-under-design, based on a delay time correcting equation generated in the second embodiment.

Figure 26:
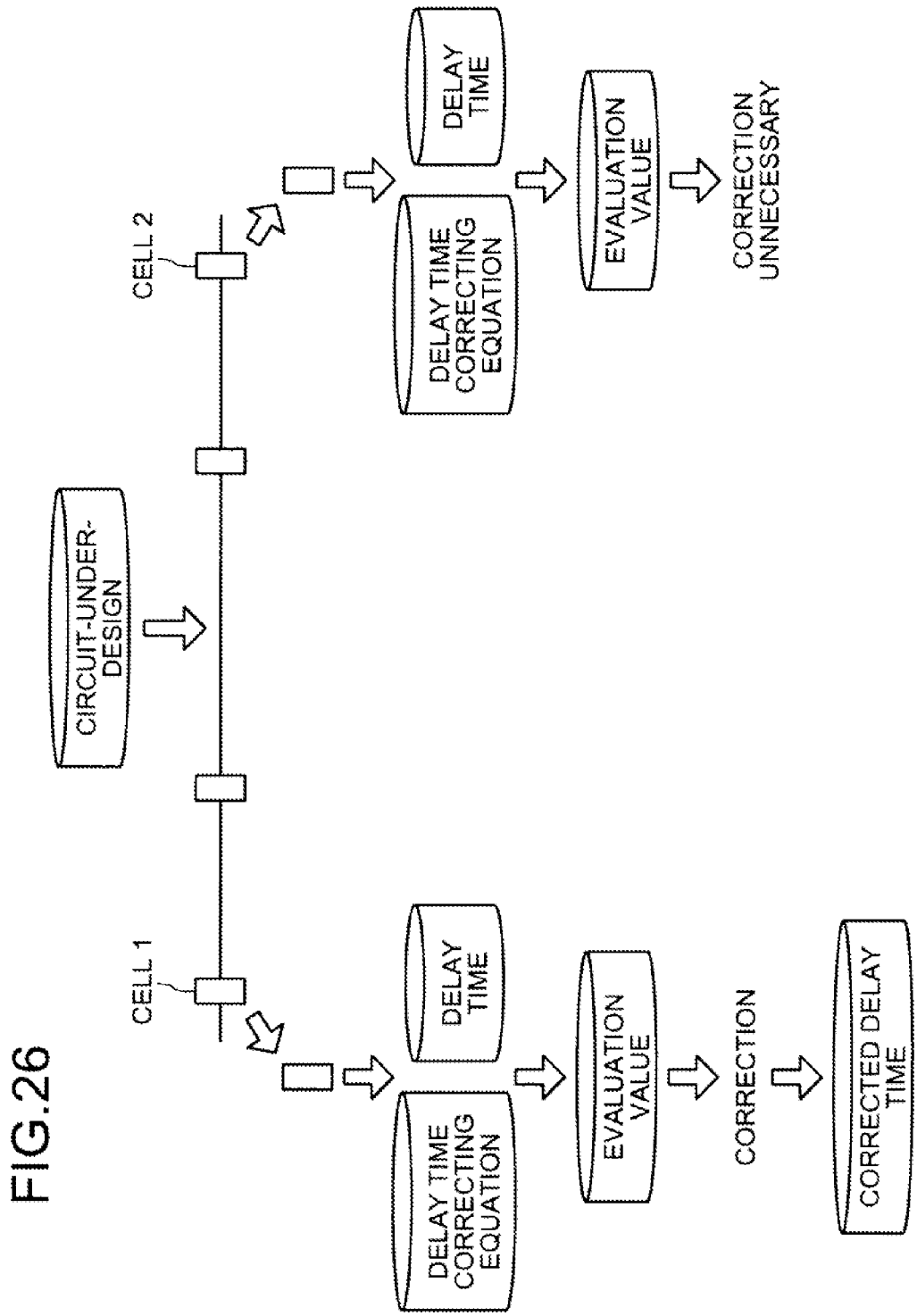
FIG. 26 is an explanatory diagram of an example of a fourth embodiment.

FIG. 26 is an explanatory diagram of an example of the fourth embodiment. The circuit-under-design is read out from the storage apparatus, and an arbitrary cell in the circuit-under-design is determined to be a subject cell. A function, a driving capability value, and an input capacitance of a cell immediately downstream from the subject cell are then specified. A delay time stored in the storage apparatus for each function and driving capability value of the subject cell is read out, based on the function and the driving capability value of the subject cell.

A delay time correcting coefficient is then read out from the delay time correcting table, based on the driving capability value of the subject cell and the input capacitance value of the cell immediately downstream. An evaluation value is then calculated base on the delay time correcting coefficient and the delay time of the subject cell, and whether to correct the delay time is determined based on the evaluation value. When delay time correction is determined, a corrected delay time is calculated using the delay time correcting coefficient and the delay time of the subject cell.

In the case of the cell 1, an evaluation value is calculated from a delay time correcting equation and a delay time of the cell 1. Based on the evaluation value, a determination is made that the delay time of the cell 1 is to be corrected based on a delay time correcting coefficient calculated using the delay time correcting equation.

In the case of the cell 2, an evaluation value is calculated from a delay time correcting equation and a delay time of the cell 2. Based on the evaluation value, a determination is made that the delay time of the cell 2 does not need to be corrected. In this manner, a delay time and an output-through time of a subject cell may be corrected based on a proper delay time correcting coefficient and a proper output-through time correcting coefficient.

The fourth embodiment is different from the third embodiment in the functions of the retrieving unit 609, the correction coefficient calculating unit 612, and the determining unit 611. The function of the correction coefficient calculating unit 612 will therefore be described in detail, while the functions of other units will not be described in detail.

The retrieving unit 609 has a function of retrieving from among delay time correcting equations stored in the storage apparatus by the storing unit 605, a delay time correcting equation corresponding to a driving capacity value of a subject cell and an input capacitance value of a cell immediately downstream that are input respectively by the subject cell information input unit 608. Specifically, for example, the CPU 501 accesses the storage apparatus to retrieve the delay time correcting equation based on the driving capacity value of the subject cell and the input capacitance value of the cell immediately downstream.

The correction coefficient calculating unit 612 has a function of calculating a delay time correcting coefficient from a delay time correcting equation retrieved by the retrieving unit 609. Specifically, for example, the CPU 501 substitutes lumped-constant capacitance values in the acquired correction equation to calculate delay time correcting coefficients or substitutes an arbitrary lumped-constant capacitance value in the correction equation to calculate a delay time correcting coefficient.

The corrected-time calculating unit 610 calculates a corrected delay time of the subject cell, based on a delay time of the subject cell input by the subject cell information input unit 608 and a delay time correcting coefficient calculated by the correction coefficient calculating unit 612. The function of the corrected-time calculating unit 610 is the same as the function described in the third embodiment, and is therefore omitted in further description. The function of the evaluation value calculating unit 604 is the same as the function described in the third embodiment, and is therefore omitted in further description. The evaluation value calculating unit 604 thus calculates a percentage similar to the percentage described in the third embodiment as a relative evaluation value.

The determining unit 611 determines whether to correct the delay time using a correction equation, based on whether a relative evaluation value for a delay time of the subject cell and a corrected delay time is at least equal to a given threshold related to the correction equation. Specifically, for example, the CPU 501 selects the reference value 2102 from the table 2100, based on an operating frequency, and determines whether the calculated percentage is at least equal to the reference value. The CPU 501 determines correction of the delay time of the subject cell if the calculated percentage is equal to or more than the reference value, and determines no correction of the delay time of the subject cell if the calculated percentage is less than the reference value.

In this manner, whatever a lumped-constant capacitance value for a cell in the circuit-under-design may be, a delay time may be corrected easily, using a delay time correcting equation, to modify the delay time of the cell into a proper delay time. Likewise, an output-through time may be corrected easily, using an output-through time correcting equation, to modify the output-through time of the cell into a proper output-through time. This improves accuracy of estimation of a delay time of a cell.

In addition, a cell for which the delay time is to be corrected is automatically specified, and whatever a lumped-constant capacitance value for the cell may be, a delay time of the cell in the circuit-under-design is corrected easily. Only a cell with an improper delay time or output-through time is thus corrected for delay time or output-through time to improve accuracy of estimation of a delay time and an output-through time of a cell.

Only the function of calculating a correction coefficient from a correction equation in the fourth embodiment differs greatly from the third embodiment, while other functions differ to a lesser extent. The description of a design support procedure by the design support apparatus of the fourth embodiment will therefore be omitted.

A fifth embodiment relates to an example of using a delay time correcting coefficient to correct the delay time of an arbitrary subject cell selected from circuit information of the circuit-under-design and using an output-through time correcting coefficient to correct an output-through time of the subject cell.

Figure 27:
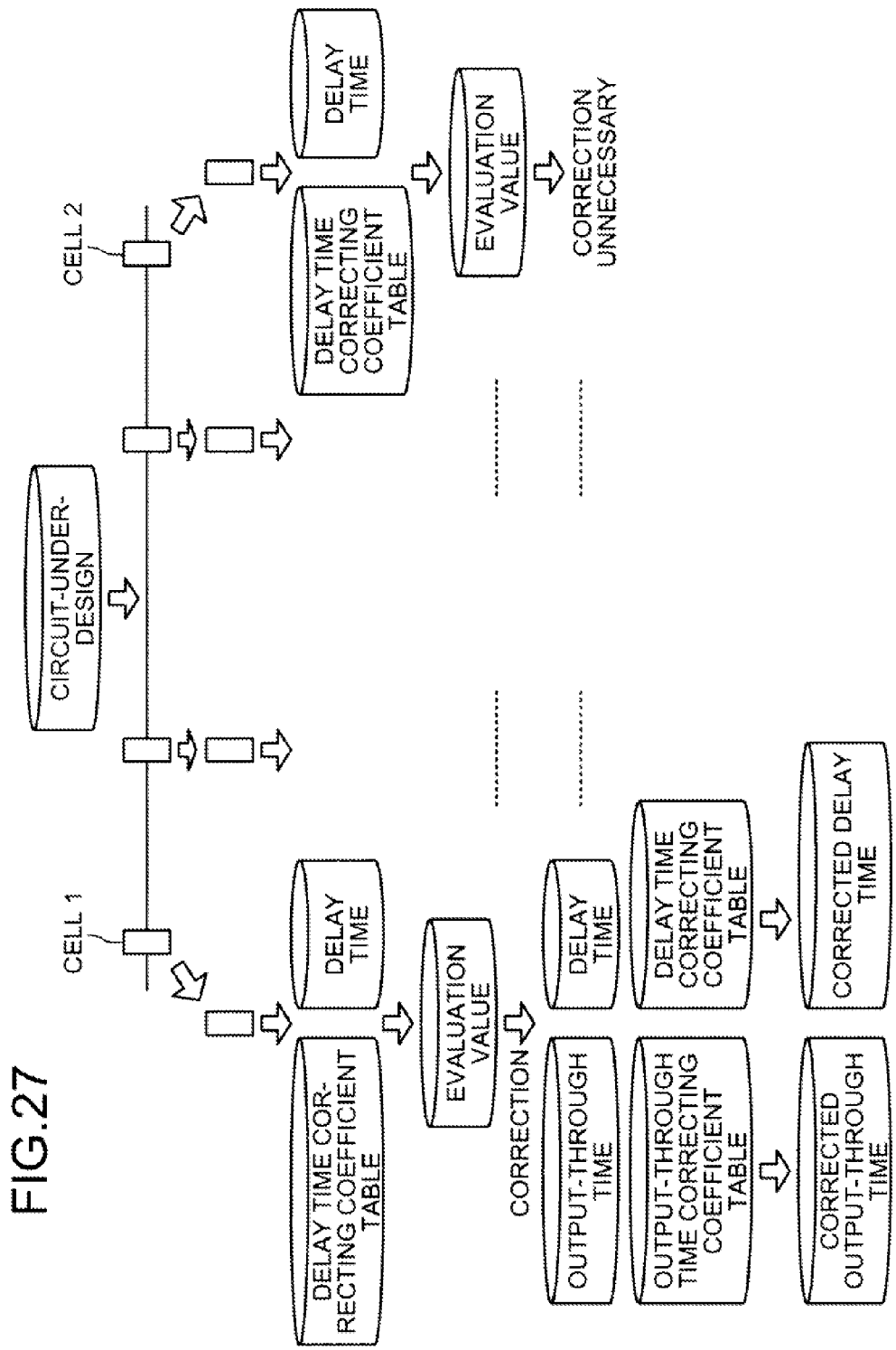
FIG. 27 is an explanatory diagram of an example of a fifth embodiment.

FIG. 27 is an explanatory diagram of an example of the fifth embodiment. An arbitrary cell is selected as a subject cell from the circuit-under-design, and an evaluation value is calculated from a delay time of the subject cell and a delay time correcting coefficient. Based on the evaluation value, whether to correct the delay time of the subject cell is determined. If the delay time of the subject cell is to be corrected, a corrected delay time is calculated based on the delay time of the subject cell and the delay time correcting coefficient. A corrected output-through time is also calculated based on an output-through time of the subject cell and an output-through time correcting coefficient.

In a case of the cell 1, an evaluation value is calculated from a delay time correcting coefficient in the delay time correcting coefficient table and a delay time of the cell 1. Based on the evaluation value, a determination is made that the delay time of the cell 1 is to be corrected using the delay time correcting coefficient and that the output-through time of the cell 1 is to be corrected using an output-through time correcting coefficient from the output-through time correcting coefficient table.

In the case of the cell 2, an evaluation value is calculated from a delay time correcting coefficient in the delay time correcting coefficient table and a delay time of the cell 2. Based on the evaluation value, a determination is made that the delay time and an output-through time of the cell 2 do not need to be corrected.

In the fifth embodiment, an output-through time of a subject cell is corrected, in addition to the function of correcting a delay time of the subject cell as described in the third embodiment.

The subject cell information input unit 608 has a function of inputting a driving capability value of an arbitrary subject cell in circuit information of the circuit-under-design, an input capacitance value of a cell immediately downstream from the subject cell, a delay time of the subject cell, and an output-through time of the subject cell. The function of inputting the driving capability value of the subject cell, the input capacitance value of the cell immediately downstream from the subject cell, and the delay time of the subject cell is the same as the function described in the third embodiment.

The function of inputting an output-through time of the subject cell will be therefore described. Specifically, for example, the user inputs a sub-table for the BUFFER 8 under the TYP condition in the table 1800 as delay times of the subject cell, or specifically, for example, the CPU 501 selects a sub-table for the BUFFER 8 under the TYP condition in the table 1801 as output-through times of the subject cell.

The retrieving unit 609 retrieves a delay time correcting coefficient corresponding to a driving capacity value of the subject cell and an input capacitance value of the cell immediately downstream that are respectively input by the subject cell information input unit from among the delay time correcting coefficients stored in the storage apparatus by the storing unit 605. The retrieving unit 609 also retrieves an output-through time correcting coefficient corresponding to the driving capacity value of the subject cell and the input capacitance value of the cell immediately downstream that are input by the subject cell information input unit from among the output-through time correcting coefficients stored in the storage apparatus by the storing unit 605.

For example, when the subject cell is the IOBUF 1 in the circuit information 1600, the retrieved delay time correcting coefficient is the same as the delay time correcting coefficient retrieved in the third embodiment. The function of retrieving the output-through time correcting coefficient will therefore be described. Specifically, for example, the CPU 501 selects an output-through time correcting coefficient from the table 1900, based on a PTV condition, the driving capability value of the subject cell, and the input capacitance value of the cell immediately downstream.

For example, because the PTV condition in the fifth embodiment is the TYP condition as in the third embodiment, all tables under the TYP condition are retrieved from the table 1900. Because the IOBUF 1 has a driving capability value of 8, the table 1901 is retrieved. From the output-through time correcting coefficient table of the table 1901, an output-through time correcting coefficient corresponding to an input capacitance value of 10 for the cell immediately downstream is retrieved. The retrieved output-through time correcting coefficient is temporarily stored in the storage apparatus, such as the RAM 503 and the magnetic disk 505.

In the fifth embodiment, a corrected delay time is calculated using the delay time correcting coefficient, and an evaluation value is calculated using the delay time of the subject cell and the corrected delay time. Whether to correct the delay time and the output-through time of the subject cell is then determined based on evaluation values. Hence, the functions of the evaluation value calculating unit and the determining unit 611 are the same as the functions described in the third embodiment, and therefore will be omitted in further description.

In another example of the fifth embodiment, however, the output-through time of the cell in the circuit-under-design is corrected using the output-through time correcting coefficient, and a relative evaluation value for a corrected output-through time of the subject cell and the output-through time of the subject cell is calculated. Whether to correct the output-through time and the delay time of the subject cell then may be determined based on the evaluation value. The functions of the evaluation value calculating unit 604 and the determining unit 611 will be described.

The evaluation value calculating unit 604 calculates a relative evaluation value for the output-through time of the subject cell input by the subject cell information input unit 608 and the output-through time correcting coefficient retrieved by the retrieving unit 609.

The determining unit 611 determines whether to correct the delay time and the output-through time of the subject cell, based on whether the evaluation value calculated by the evaluation value calculating unit 604 is at least equal to a given reference value.

In another case, for example, the corrected delay time is calculated using the delay time correcting coefficient, and an evaluation value for the delay time is calculated using the delay time of the subject cell and the corrected delay time. The corrected output-through time is calculated using the output-through time correcting coefficient to calculate an evaluation value, and an evaluation value for the output-through time is calculated using the output-through time of the subject cell and the corrected delay time. Whether to correct the delay time then may be determined based on the evaluation value for the delay time and the evaluation value for the output-through time.

If the determining unit 611 determines correction of the delay time and the output-through time of the subject cell, the corrected-time calculating unit 610 calculates the corrected delay time, based on the delay time of the subject cell and the delay time correcting coefficient, and also calculates the corrected output-through time, based on the output-through time of the subject cell and the output-through time correcting coefficient. An example of calculation of the corrected delay time, based on the delay time of the subject cell and the delay time correcting coefficient is the same as the calculation in the third embodiment, and is therefore omitted in further description.

FIG. 28 is an explanatory diagram of an example of corrected output-through times. Output-through time correcting coefficients depicted in FIG. 28 are ratios as described in the first embodiment. A corrected output-through time is, therefore, calculated by multiplying an output-through time of a subject cell by an output-through time correcting coefficient.

Figure 29:
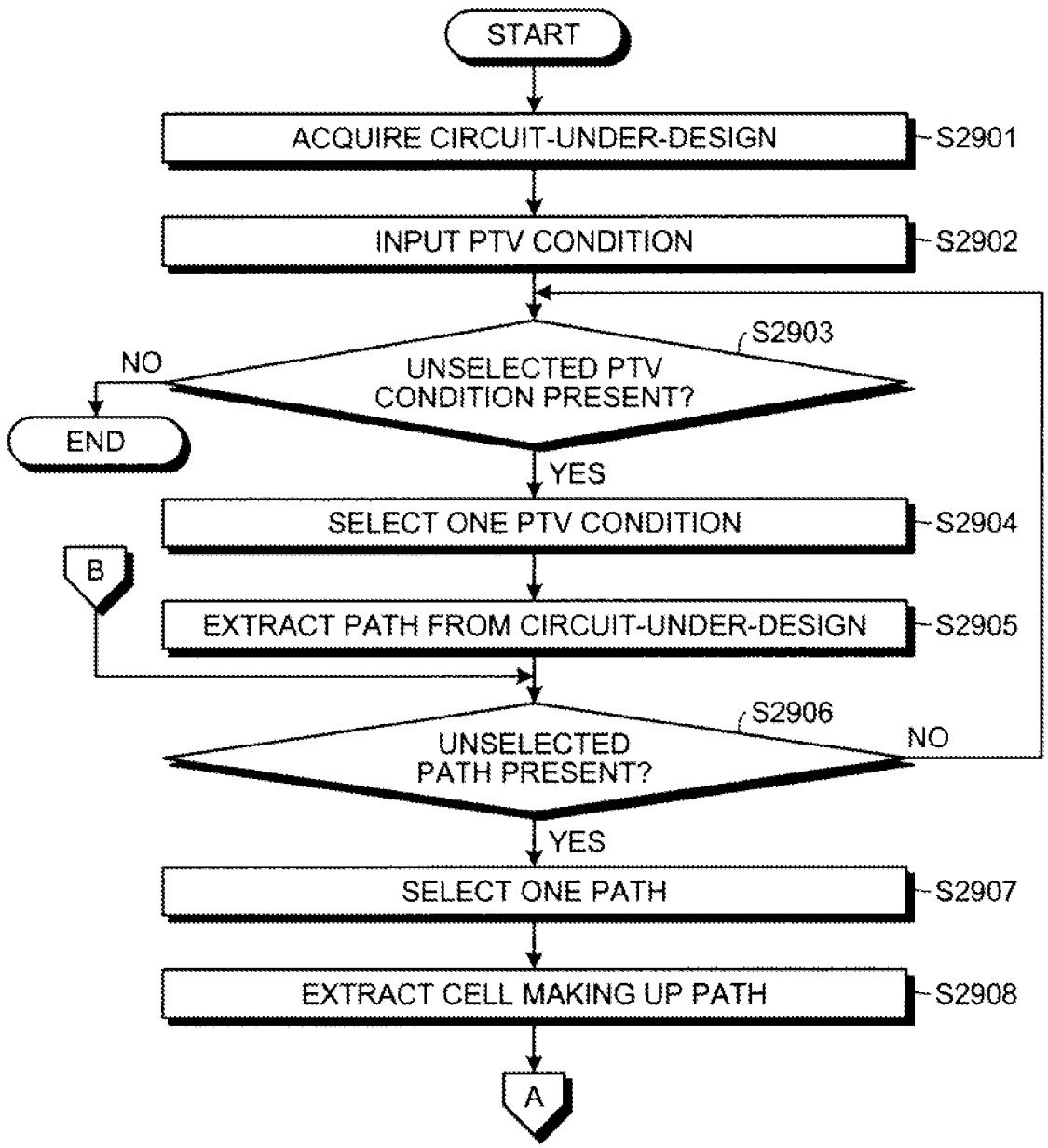
FIGS. 29 and 30 are flowcharts of a design support procedure by the design support apparatus of the fifth embodiment.
Figure 30:
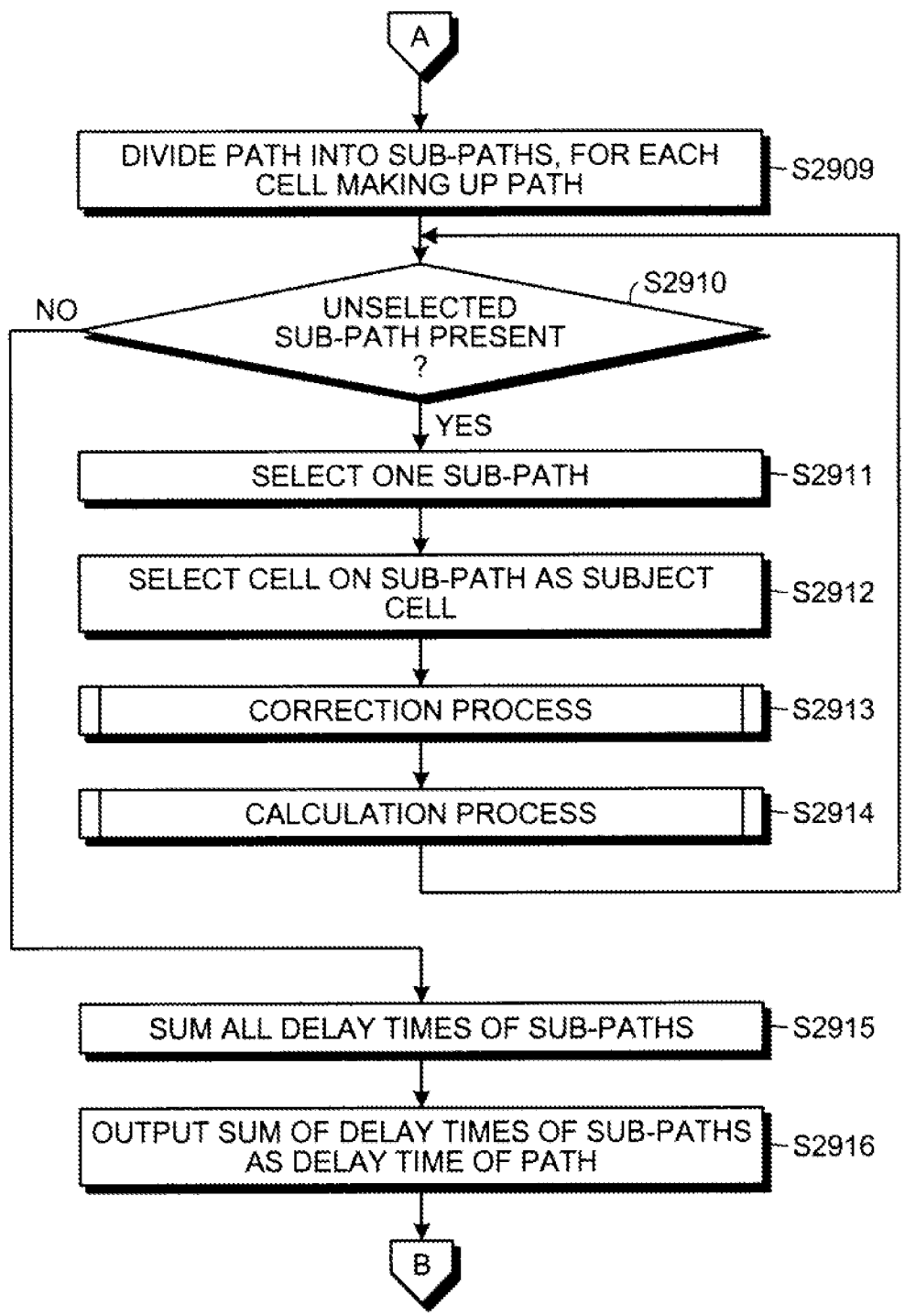

FIGS. 29 and 30 are flowcharts of examples of a design support procedure by the design support apparatus of the fifth embodiment. In these flowcharts, a delay time of an arbitrary path in the circuit-under-design is calculated. As depicted in FIG. 29, a circuit-under-design is acquired (step S2901), and the subject cell information input unit 608 inputs a PTV condition (step S2902). Whether an unselected PTV condition is present is determined (step S2903).

If an unselected PTV condition is present (step S2903: YES), one PTV condition is selected (step S2904). A path is then extracted from the circuit-under-design (step S2905), and whether an unselected path is present is determined (step S2906). If an unselected path is present (step S2906: YES), one path is selected (step S2907). If no unselected path is present (step S2906: NO), the procedure returns to step S2903.

Following step S2907, cells making up the path are extracted (step S2908). The procedure then proceeds to the processing depicted in the flowchart of FIG. 30, where the path is divided into sub-paths, for each of cells making up the path (step S2909), and whether an unselected sub-path is present is determined (step S2910). If an unselected sub-path is present (step S2910: YES), one sub-path is selected (step S2911), and a cell on the selected sub-path is selected as a subject cell (step S2912). Subsequently, the correction process is carried out (step S2913), and the calculating process is carried out (step S2914), after which the procedure returns to step S2910.

If no unselected sub-path is present (step S2910: NO), all delay times of sub-paths are summed (step S2915) and the sum of the delay times of sub-paths is output as a delay time of the path (step S2916), after which the procedure returns to step S2906.

If no unselected PTV condition is present at step S2903 of FIG. 29 (step S2903: NO), the procedure ends.

Figure 31:
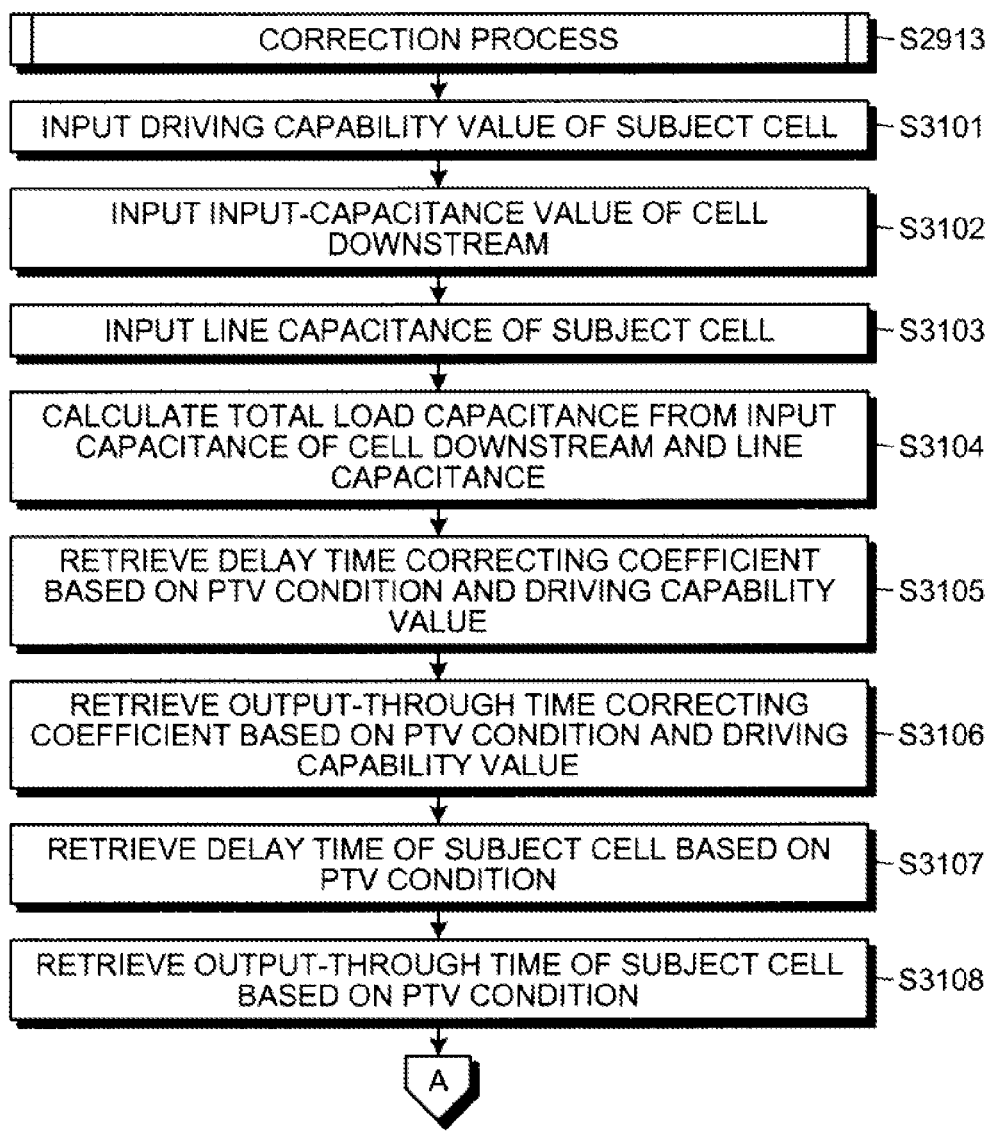
FIGS. 31 and 32 are flowcharts of a correction process (step S2913) depicted in FIG. 30.
Figure 32:
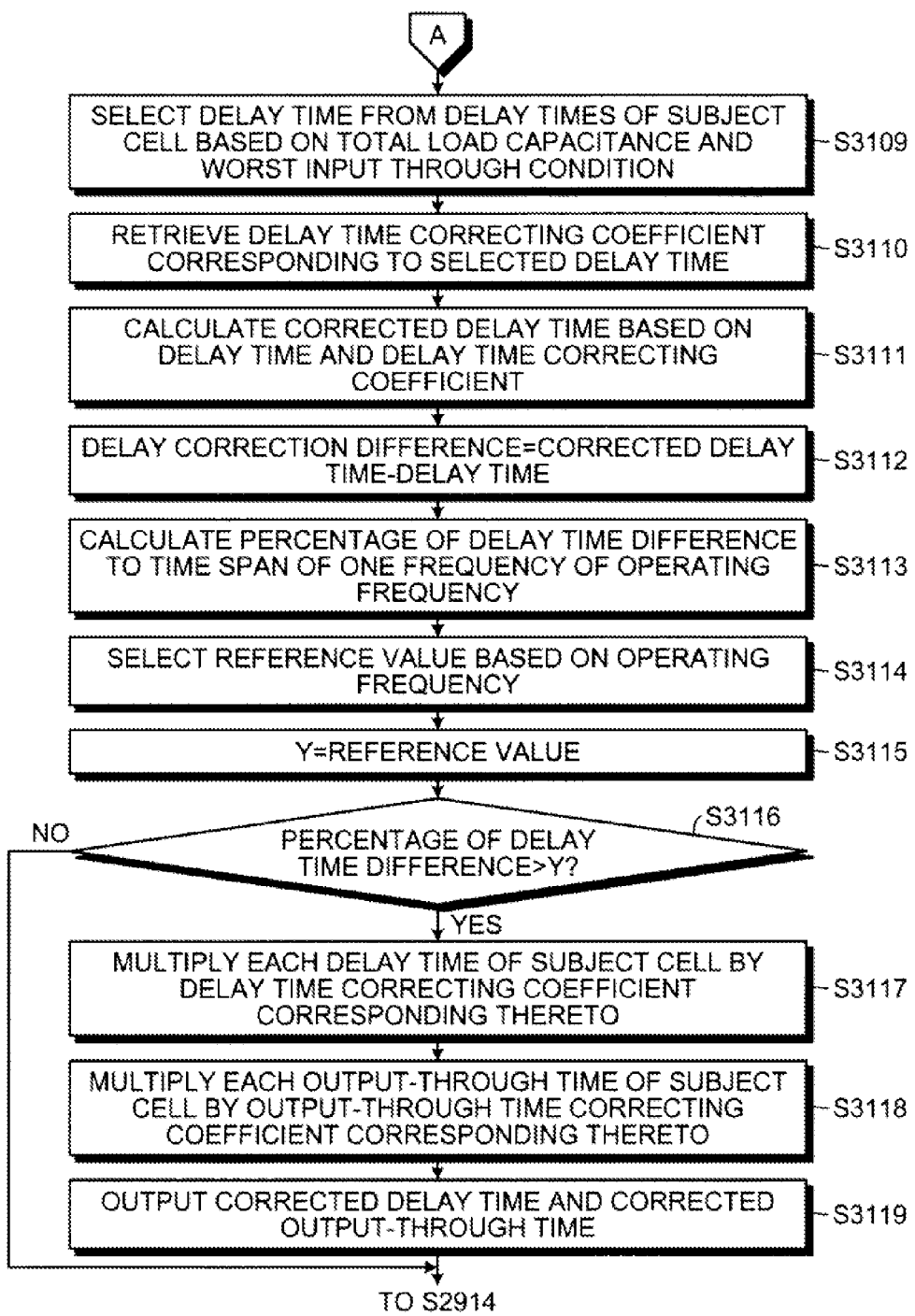

FIGS. 31 and 32 are flowcharts of the correction process (step S2913) of FIG. 30. As depicted in FIG. 31, the subject cell information input unit 608 inputs a driving capability value of a subject cell (step S3101), and then inputs the input capacitance of a cell immediately downstream from the subject cell (step S3102). The subject cell information input unit 608 further inputs the line capacitance of the subject cell (step S3103), and calculates a total load capacitance using the input capacitance of the cell immediately downstream and the line capacitance (step S3104). The total load capacitance is equivalent to a lumped-constant capacitance Ctotal.

The retrieving unit 609 then retrieves a delay time correcting coefficient, based on a PTV condition and the driving capability value (step S3105), and also retrieves an output-through time correcting coefficient based on the PTV condition and the driving capability value (step S3106). The retrieving unit 609 then retrieves delay times of the subject cell, based on the PTV condition (step S3107) and retrieves output-through times of the subject cell, based on the PTV condition (step S3108). The user may input a delay time and an output-through time of the subject cell to the design support apparatus, which receives the user input.

Following step S3108, the procedure proceeds to the processing depicted in the flowchart of FIG. 32, where a delay time is retrieved from among delay times of the subject cell, based on the total load capacitance and the worst input-through time condition (step S3109). Subsequently, the retrieving unit 609 retrieves a delay time correcting coefficient corresponding to the selected delay time (step S3110). The corrected-time calculating unit 6100 calculates a corrected delay time, based on the delay time and the delay time correcting coefficient (step S3111), and the correction coefficient calculating unit 612 executes calculation using the equation: delay correction difference=corrected delay time-delay time (step S3112).

Following this, the percentage of the delay correction difference to a time span of one period of an operating frequency is calculated (step S3113). A reference value is selected based on the operating frequency (step S3114), and Y=reference value is set (step S3115). The reference value is equivalent to a given threshold, and is selected from the table 2100. Subsequently, the determining unit 611 determines whether (percentage of delay correction difference)>Y is satisfied (step S3116). If (percentage of delay correction difference)>Y is satisfied (step S3116: YES), each delay time of the subject cell is multiplied by the delay time correcting coefficient corresponding thereto (step S3117).

Each output-through time of the subject cell is then multiplied by the output-through time correcting coefficient corresponding thereto (step S3118). The output unit 614 outputs the corrected delay time and a corrected output-through time (step S3119), after which the procedure returns to step S2914. If (percentage of delay correction difference)>Y is not satisfied at step S3116 (step 3116: NO), the procedure proceeds to step S2914.

Figure 33:
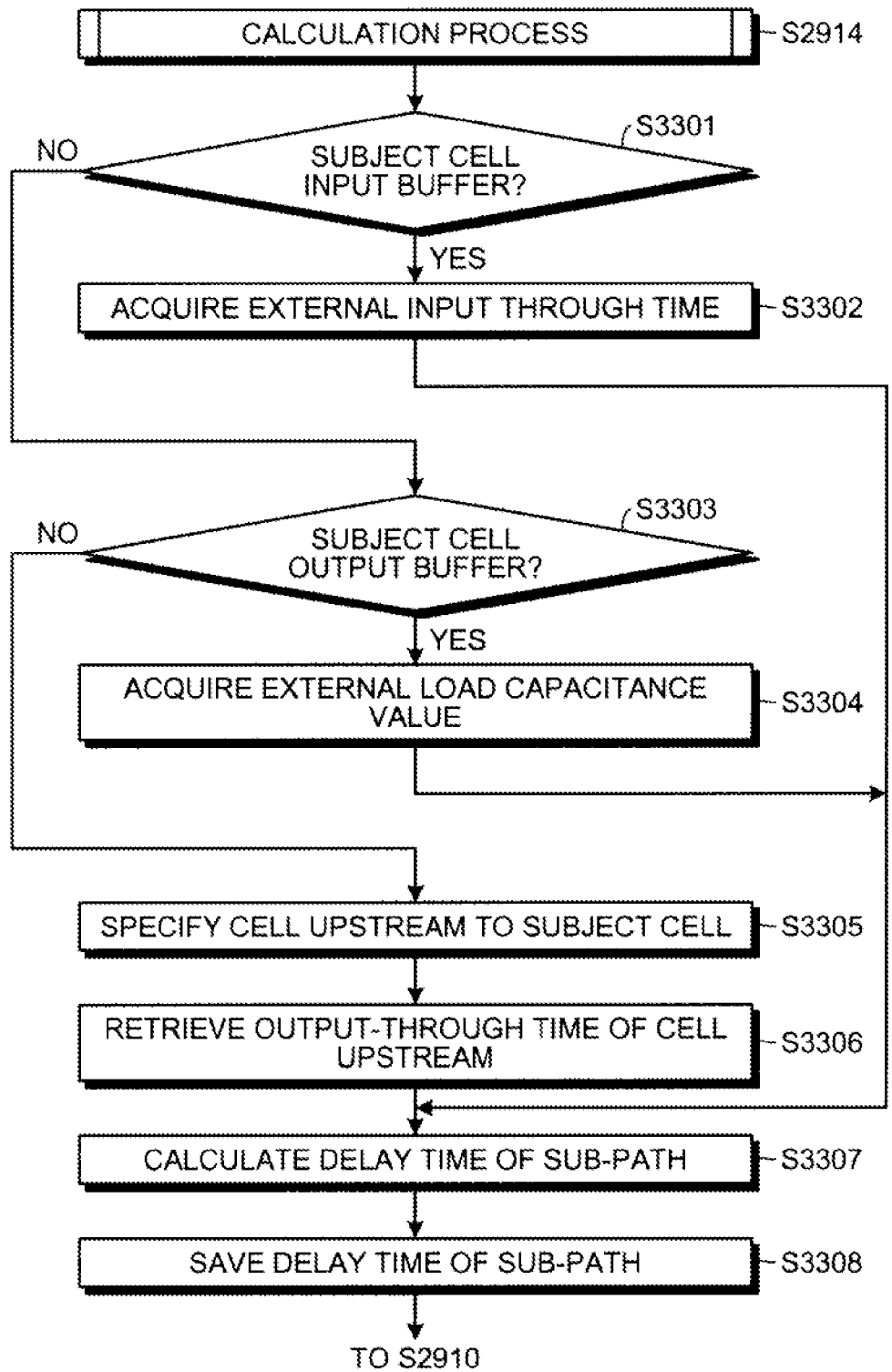
FIG. 33 is a flowchart of a calculating process (step S2914) depicted in FIG. 30.

FIG. 33 is a flowchart of the calculating process (step S2914) of FIG. 30. Whether a subject cell is an input buffer is determined (step S3301). If the subject cell is the input buffer (step S3301: YES), an external input-through time is acquired (step S3302). In this process, the external input-through time is acquired from the table 1702.

If the subject cell is not an input buffer (step S3301: NO), whether the subject cell is an output buffer is determined (step S3303). If the subject cell is an output buffer (step S3303: YES), an external load capacitance value is acquired (step S3304). In this process, the external load capacitance value is acquired from the table 1702.

If the subject cell is not an output buffer (step S3303: NO), a cell immediately upstream from the subject cell is specified from the circuit-under-design (step S3305). An output-through time of the cell immediately upstream is then retrieved, and the retrieved output-through time is determined to be an input-through time of the subject cell (step S3306). If the retrieved output-through time of the cell immediately upstream has been corrected, it is a corrected output-through time. A delay time of a sub-path is then calculated based on the input-through time, a corrected delay time, a corrected output-through time, and a total load capacitance of the subject cell (step S3307). The calculated delay time of the sub-path is saved (step S3308), after which the procedure proceeds to step S2910.

In a sixth embodiment, a delay time correcting coefficient is calculated from a delay time correcting equation to correct the delay time of an arbitrary subject cell in the circuit-under-design, based on the calculated delay time correcting coefficient. Likewise, an output-through time correcting coefficient is calculated from an output-through time correcting equation to correct an output-through time of the subject cell, based on the calculated output-through time correcting coefficient.

Figure 34:
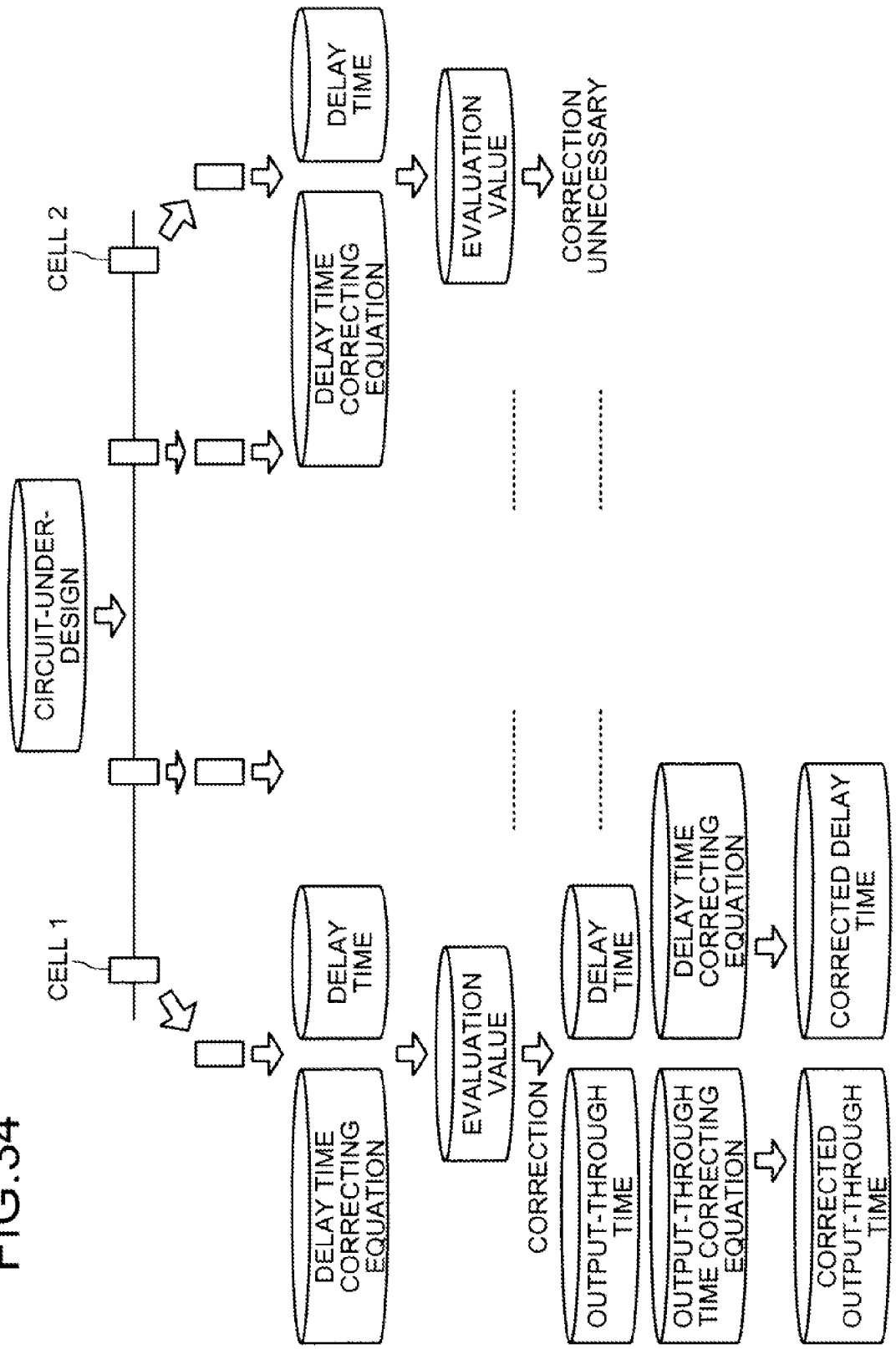
FIG. 34 is an explanatory diagram of an example of a sixth embodiment.

FIG. 34 is an explanatory diagram of an example of the sixth embodiment. An arbitrary cell is selected as a subject cell from the circuit-under-design. A correction coefficient is calculated from a delay time correcting equation, and an evaluation value is calculated based on the delay time correcting coefficient and a delay time of the subject cell. Subsequently, whether to correct the delay time and an output-through time of the subject cell is determined based on the evaluation value.

If correction is determined, the delay time correcting coefficient is calculated from the delay time correcting equation, and an output-through time correcting coefficient is calculated from an output-through time correcting equation. Subsequently, a corrected delay time is calculated based on the calculated delay time correcting coefficient and the delay time of the subject cell, and a corrected output-through time is calculated based on the calculated output-through time correcting coefficient and the output-through time of the subject cell.

In the case of the cell 1, an evaluation value is calculated from a delay time correcting equation and a delay time of the cell 1. Based on the evaluation value, a determination is made that the delay time of the cell 1 is to be corrected based on a delay time correcting coefficient calculated using the delay time correcting equation, and that an output-through time of the cell 1 is to be corrected based on an output-through time correcting coefficient calculated using an output-through time correcting equation.

In the case of the cell 2, an evaluation value is calculated from a delay time correcting equation and a delay time of the cell 2. Based on the evaluation value, a determination is made that the delay time and an output-through time of the cell 2 do not need to be corrected. In this manner, a delay time and an output-through time of a subject cell are corrected based on a proper delay time correcting coefficient and an output-through time correcting coefficient.

The function of the subject cell information input unit 608 is the same as the function described in the fifth embodiment, and therefore will be omitted in further description.

The retrieving unit 609 retrieves a delay time correcting equation corresponding to a driving capacity value of the subject cell and an input capacitance value of a cell immediately downstream that respectively are input by the subject cell information input unit, from among delay time correcting equations stored to the storage apparatus by the storing unit 605. The retrieving unit 609 also retrieves an output-through time correcting equation corresponding to the driving capacity value of the subject cell and the input capacitance value of the cell immediately downstream that are respectively input by the subject cell information input unit, from among output-through time correcting equations stored to the storage apparatus by the storing unit 605. The function of the retrieving unit 609 of retrieving a delay time correcting equation in the sixth embodiment is the same as the function described in the forth embodiment, and therefore will be omitted in further description. The function of retrieving an output-through time correcting equation is different from the above function only in the object to be retrieved, and will therefore be omitted in further description.

Functions of the evaluation value calculating unit 604 and the determining unit 611 are the same as the functions described in the fourth embodiment, and therefore will be omitted in further description.

If the determining unit 611 determines correction of the delay time and an output-through time of the subject cell, the correction coefficient calculating unit 612 calculates a delay time correcting coefficient corresponding to the delay time of the subject cell using the delay time correcting equation, and calculates an output-through time correcting coefficient corresponding to an output-through time of the subject cell using the output-through time correcting equation. The specific process carried out by the correction coefficient calculating unit 612 is the same as the process described in the fourth embodiment, and will therefore be omitted in further description.

When the determining unit 611 determines correction of the delay time and the output-through time of the subject cell, the corrected-time calculating unit 610 calculates a corrected delay time based on the delay time correcting coefficient calculated by the correction coefficient calculating unit 612 and the delay time of the subject cell.

The corrected-time calculating unit 610 also calculates a corrected output-through time based on the output-through time correcting coefficient calculated by the correction coefficient calculating unit 612 and the output-through time of the subject cell. An example of calculation of the corrected delay time based on the delay time of the subject cell and the delay time correcting coefficient is the same as the calculation in the third embodiment, and therefore will be omitted in further description.

In a seventh embodiment, elements identical to those described in the first to the sixth embodiments will be denoted by the same reference numerals used in the first to the sixth embodiments and will be omitted in further description.

Figure 35:
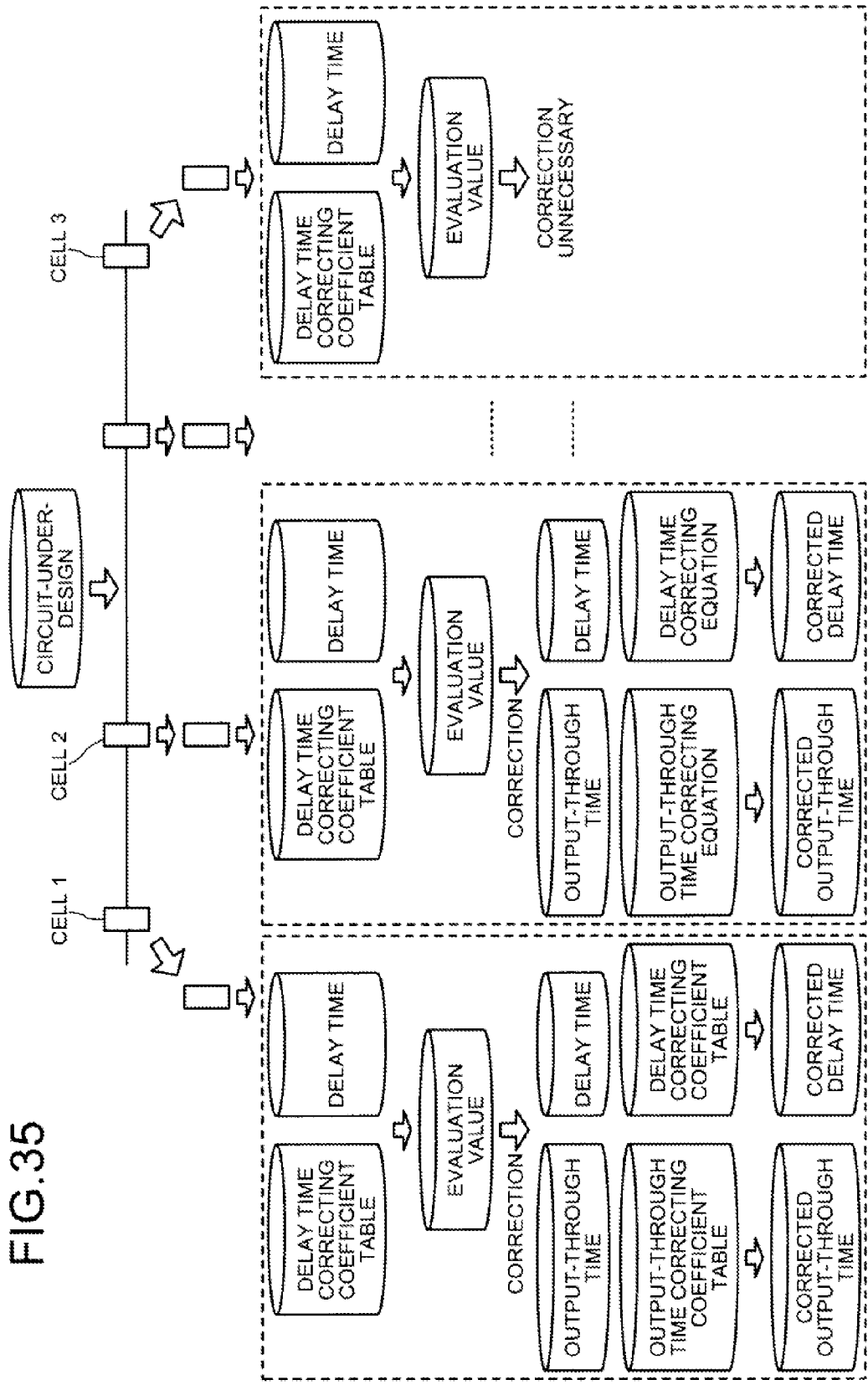
FIG. 35 is an explanatory diagram of an example of a seventh embodiment.

FIG. 35 is an explanatory diagram of an example of the seventh embodiment. In the seventh embodiment, an arbitrary cell is selected as a subject cell, from circuit information of the circuit-under-design. An evaluation value is then calculated based on a delay time of the subject cell and a delay time correcting coefficient, and whether to correct the delay time and an output-through time of the subject cell is determined based on the evaluation value.

If correction is determined, whether the delay time of the subject cell is to be corrected using a delay time correcting coefficient stored in the storage apparatus or using a delay time correcting coefficient calculated from a delay time correcting equation is determined based on an evaluation value. Whether the output-through time of the subject cell is to be corrected using an output-through time correcting coefficient stored in the storage apparatus or using an output-through time correcting coefficient calculated from an output-through time correcting equation is also determined based on an evaluation value.

In the case of the cell 1, an evaluation value is calculated from a delay time correcting coefficient and a delay time of the cell 1. Based on the evaluation value, a determination is made that the delay time of the cell 1 is to be corrected based on a delay time correcting coefficient retrieved from the delay time correcting coefficient table, and that an output-through time of the cell 1 is to be corrected based on an output-through time correcting coefficient retrieved from the output-through time correcting coefficient table.

In the case of the cell 2, an evaluation value is calculated from a delay time correcting coefficient and a delay time of the cell 2. Based on the evaluation value, a determination is made that the delay time of the cell 2 is to be corrected based on a delay time correcting coefficient calculated from a delay time correcting equation, and that an output-through time of the cell 2 is to be corrected based on an output-through time correcting coefficient calculated from an output-through time correcting equation.

In the case of a cell 3, an evaluation value is calculated from a delay time correcting coefficient and a delay time of the cell 3. Based on the evaluation value, a determination is made that the delay time and an output-through time of the cell 3 do not need to be corrected. In this manner, a delay time and an output-through time of a subject cell are corrected based on a proper delay time correcting coefficient and an output-through time correcting coefficient.

In the seventh embodiment, the functions of the subject cell information input unit 608, the retrieving unit 609, the corrected-time calculating unit 610, the correction coefficient calculating unit 612, the output unit 614, the evaluation value calculating unit 604 are the same as the functions described in the fifth embodiment or the sixth embodiment, and will therefore be omitted in further description. Only the determining unit 611 will be described in the seventh embodiment.

The determining unit 611 determines whether to correct the delay time and the output-through time of the subject cell based on whether an evaluation value calculated by the evaluation value calculating unit 604 is at least equal to a given reference value. If the delay time and the output-through time of the subject cell are to be corrected, the determining unit 611 determines whether correction is to be carried out using a correction equation, based on whether the evaluation value is at least equal to a threshold related to the correction equation. As described in the third embodiment, the evaluation value calculated by the evaluation value calculating unit 604 is a percentage. Evaluation value is therefore referred to as percentage herein.

Specifically, for example, the CPU 501 accesses the storage apparatus to read out a reference value corresponding to the determination for "correction unnecessary" from the table 2103, based on operating frequency information, and determines whether a percentage is at least equal to the reference value. If the percentage is determined to be equal to or more than the reference value, correction is determined. If the percentage is determined to be less than the reference value, no correction is determined. As described in the third embodiment, the percentage is 10.73[%] when the subject cell is the IOBUF 1, in which case, therefore, correction is determined.

More specifically, for example, the CPU 501 accesses the storage apparatus to read out a reference value corresponding the determination for "correction equation" from the table 2103, based on the operating frequency 2104. The reference value corresponding to the determination for "correction equation" in the table 2103 is a threshold related to the correction equation. The CPU 501 then determines whether the percentage is at least equal to the reference value. If the percentage is determined to be less than the reference value, correction using the correction equation is determined. If the percentage is determined to be equal to or more than the reference value, correction using a correction coefficient in the delay time correcting coefficient table and a correction coefficient in the output-through time correcting coefficient table is determined.

As described in the third embodiment, the percentage is 10.73[%] when the subject cell is the IOBUF 1, in which case, therefore, correction using the correction coefficient in the delay time correcting coefficient table and the correction coefficient in the output-through time correcting coefficient table is determined.

If the determining unit 611 determines correction using the correction equation, the delay time and the output-through time of the subject cell are corrected through the functions of the correction coefficient calculating unit 612 and the corrected-time calculating unit 610.

If the determining unit 611 determines correction using the correction coefficient in the delay time correcting coefficient table and the correction coefficient in the output-through time correcting coefficient table, the delay time and the output-through time of the subject cell are corrected through the function of the corrected-time calculating unit 610.

In this manner, a cell requiring correction is specified automatically, and whatever a lumped-constant capacitance value for the cell may be, the cell in the circuit-under-design is corrected easily. Hence, a cell having a proper output-through time is not corrected while a cell having an improper output-through time is corrected, enabling improvement of the accuracy of estimation of an output-through time of a cell. Detailed description of a design support procedure of the seventh embodiment will be omitted.

In an eighth embodiment, elements identical to those described in the first to the seventh embodiments will be denoted by the same reference numerals used in the first to the seventh embodiments and will be omitted in further description.

Figure 36:
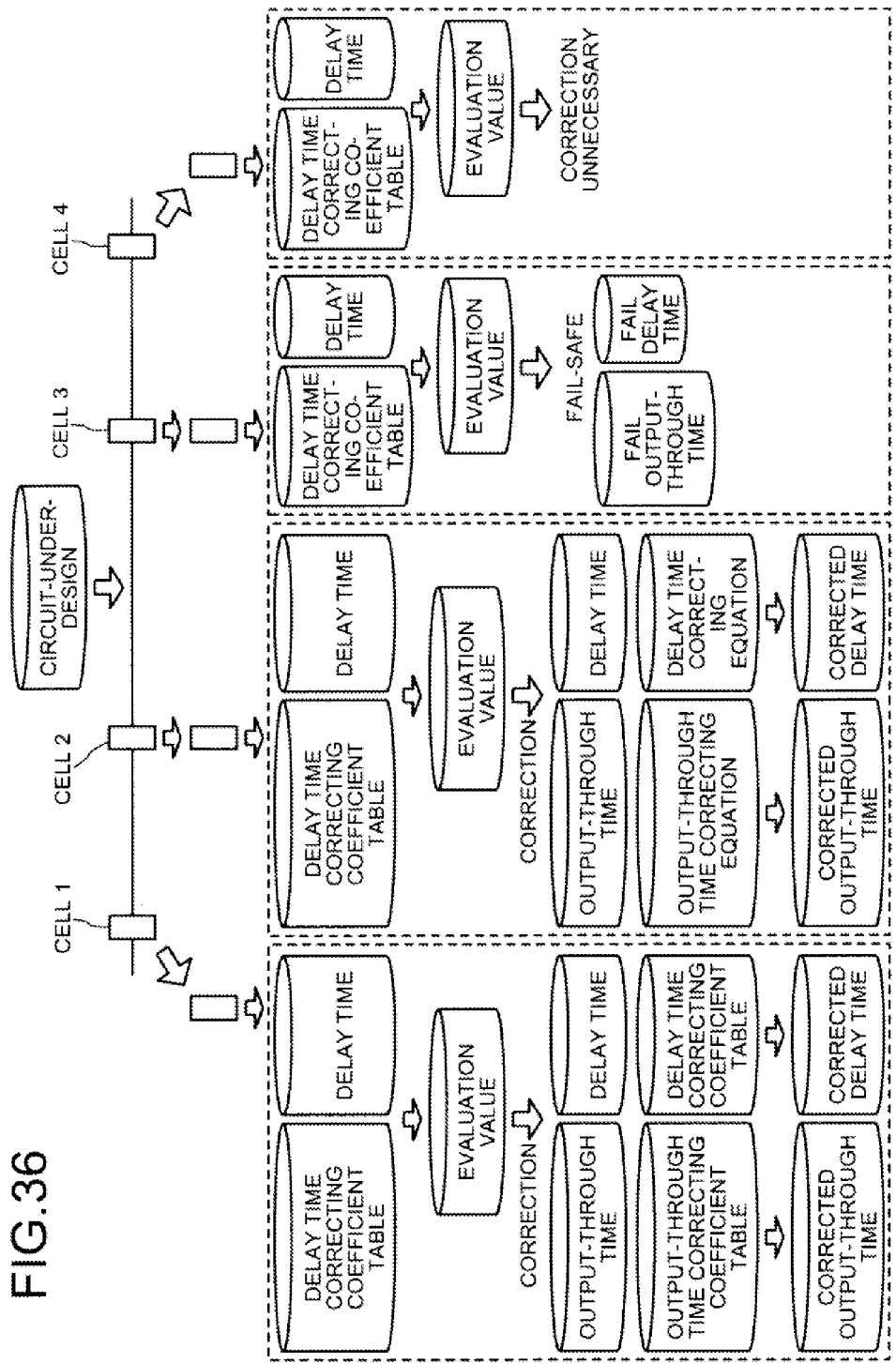
FIG. 36 is an explanatory diagram of an example of an eighth embodiment.

FIG. 36 is an explanatory diagram of an example of the eighth embodiment. In the eighth embodiment, an arbitrary cell is selected as a subject cell from circuit information of the circuit-under-design. An evaluation value is then calculated based on a delay time of the subject cell and a delay time correcting coefficient, and whether to correct the delay time and an output-through time of the subject cell is determined based on the evaluation value.

If correction is determined, whether the delay time of the subject cell is to be corrected using a delay time correcting coefficient stored in the storage apparatus or using a delay time correcting coefficient calculated from a delay time correcting equation is determined based on an evaluation value. Whether the output-through time of the subject cell is to be corrected using an output-through time correcting coefficient stored in the storage apparatus or using an output-through time correcting coefficient calculated from an output-through time correcting equation is also determined based on an evaluation value.

In the case of the cell 1, an evaluation value is calculated from a delay time correcting coefficient and a delay time of the cell 1. Based on the evaluation value, a determination is made that the delay time of the cell 1 is to be corrected based on a delay time correcting coefficient retrieved from a delay time correcting coefficient table, and that an output-through time of the cell 1 is to be corrected based on an output-through time correcting coefficient retrieved from an output-through time correcting table.

In the case of the cell 2, an evaluation value is calculated from a delay time correcting coefficient and a delay time of the cell 2. Based on the evaluation value, a determination is made that the delay time of the cell 2 is to be corrected based on a delay time correcting coefficient calculated from a delay time correcting equation, and that an output-through time of the cell 2 is to be corrected based on an output-through time correcting coefficient calculated from an output-through time correcting equation.

In the case of the cell 3, an evaluation value is calculated from a delay time correcting coefficient and a delay time of the cell 3. Based on the evaluation value, a determination is made that the cell 3 outputs a waveform propagating an indefinite value. The delay time and an output-through time of the cell 3 are thus converted into values to which an indefinite value is propagated.

In the case of a cell 4, an evaluation value is calculated from a delay time correcting coefficient and a delay time of the cell 4. Based on the evaluation value, a determination is made that a delay time and an output-through time of the cell 4 do not need to be corrected.

In the eighth embodiment, a function of determining whether a subject cell outputs a waveform propagating an indefinite value based on an evaluation value is added to the function of the determining unit 611 described in the seventh embodiment.

The determining unit 611 also determines whether to correct the delay time of the subject cell based on whether an evaluation value calculated by the evaluation value calculating unit 604 is at least equal to a threshold related to indefinite value propagation, and determines whether to correct the output-through time of the subject cell based on whether the evaluation value calculated by the evaluation value calculating unit 604 is at least equal to the threshold related to indefinite value propagation.

For example, the CPU 501 reads out the reference value 2110 corresponding to the determination for "table" from the table 2107, based on the operating frequency 2108. The reference value 2110 corresponding to the determination for "table" in the table 2107 is the threshold related to indefinite value propagation. The CPU 501, for example, determines whether a percentage is at least equal to the threshold. If determined that the percentage is equal to or more than the reference value, the CPU 501 determines that the subject cell outputs an indefinite value, and that the subject cell is therefore not correctable. If determined that the percentage is less than the reference value, the CPU 501 determines that the delay time of the subject cell is to be corrected using a correction coefficient in the delay time correcting coefficient table, and that the output-through time of the subject cell is to be corrected using an correction coefficient in the output-through time correcting coefficient table. As described in the third embodiment, the percentage is 10.73[%] when the subject cell is the IOBUF 1. This results in a determination that the delay time of the subject cell is to be corrected using a correction coefficient in the delay time correcting coefficient table, and that the output-through time of the subject cell is to be corrected using a correction coefficient in the output-through time correcting coefficient table.

The converting unit 613 has a function of converting the delay time of the subject cell into a value to which an indefinite value is propagated or converting the output-through time of the subject cell into a value to which an indefinite value is propagated when the determining unit 611 determines that the subject cell outputs an indefinite value and that the subject cell is therefore not correctable. Specifically, for example, the CPU 501 converts the delay time value and the output-through time value of the subject cell into the maximum values that may be set as the delay time and the output-through time, respectively.

The output unit 614 has a function of outputting the delay time of the subject cell converted by the converting unit 613, and also has a function of outputting the output-through time of the subject cell converted by the converting unit 613. Specifically, for example, the CPU 501 correlates the converted delay time of the subject cell and the output-through time of the subject cell with a PTV condition and outputs the correlated converted delay time and output-through time. Forms of output includes display on the display 508, printout on the printer 513, and transmission to an external apparatus through the I/F 509. The converted delay time and output-through time may be stored in the storage apparatus, such as the RAM 503, the magnetic disk 505, and the optical disk 507.

In this manner, a cell outputting an indefinite value is automatically specified, and a delay time and an output-through time of the cell are each automatically converted into a value enabling verification of indefinite value propagation. A cell not outputting an indefinite value is automatically specified, and a delay time and an output-through time of the cell are corrected, enabling modification of the delay time and the output-through time of the cell into a proper delay time and an output-through time. This improves the accuracy of estimation of the delay time and the output-through time of the cell. In addition, whether a cell outputting an indefinite value is present may be determined before verification. Description of a design support procedure by the design support apparatus of the eighth embodiment is omitted in the eighth embodiment.

As described above, according to the embodiments, a relative evaluation value on a first delay time of a circuit model based on a driving capability value and a lumped-constant capacitance value and a second delay time of the circuit model based on the driving capability value, the lumped-constant capacitance value, and an input capacitance value is calculated to determine the calculated evaluation value to be a delay time correcting coefficient.

As a result, a delay time correcting coefficient capable of correcting the delay time into a proper delay time is automatically calculated. This enables a user to correct the delay time of a cell in a circuit-under-design using a delay time correcting coefficient, and thus modify the delay time of the cell into a proper delay time according to the driving capability value of the cell and a cell immediately downstream. Hence, the accuracy of delay time estimation is improved.

A delay time of a cell in the circuit-under-design is corrected using a delay time correcting coefficient to automatically calculate a corrected delay time of the cell. As a result, a delay time of each cell in the circuit-under-design is corrected into a proper delay time. This improves the accuracy of estimation of the delay time of the cell. The user is able to verify a nonlinear output waveform, enabling improved verification accuracy.

Whether a delay time of a cell in the circuit-under-design is to be corrected using a delay time correcting coefficient is determined, and if correction is determined, the delay time of the cell is corrected. This enables automatic specification of a cell requiring correction to correct the delay time of the cell into a proper delay time. This improves the accuracy of estimation of the delay time of the cell, and thus improves verification accuracy.

A delay time correcting coefficient is linearly approximated for each driving capacity value and input capacitance value to calculate a correction equation. As a result, whatever a lumped-constant capacitance value for a cell in the circuit-under-design may be, the user corrects the delay time of the cell in the circuit-under-design using the delay time correcting equation to be able to easily modify the delay time of the cell into a proper delay time. This improves the accuracy of estimation of the delay time of the cell, and thus improves verification accuracy.

A lumped-constant capacitance value is given to a delay time correcting equation calculated by linearly approximating a delay time correcting coefficient to enable easy calculation of a delay time correcting coefficient corresponding to a delay time of a cell in the circuit-under-design. As a result, whatever a lumped-constant capacitance value for the cell in the circuit-under-design may be, the delay time of the cell is corrected automatically through correction using the correction equation. This enables correction of the delay time of the cell into a proper delay time and improves the accuracy of estimation of the delay time of the cell.

A determination is made on whether to correct the delay time of a cell in the circuit-under-design using a delay time correcting coefficient calculated based on a delay time correcting equation. If correction is determined, the delay time of the cell is corrected. As a result, a cell requiring correction is automatically specified, and whatever a lumped-constant capacitance value for the cell in the circuit-under-design may be, the cell is corrected easily. Hence, a cell having a proper delay time is not corrected in delay time while a cell having an improper delay time is corrected in delay time. This improves the accuracy of estimation of the delay time of the cell.

Whether a cell in the circuit-under-design propagates an indefinite value is determined. If the cell is determined to not propagate an indefinite value, a delay time of the cell is corrected. If the cell is determined to propagate an indefinite value, the delay time of the cell is converted into a value enabling verification of indefinite value propagation.

As a result, a cell outputting an indefinite value is automatically specified to automatically convert a delay time of the specified cell into a value enabling verification of indefinite value propagation, while a cell not outputting an indefinite value is automatically specified to correct the specified cell. This enables correction of the delay time of the cell into a proper delay time, improving the accuracy of estimation of the delay time of the cell, and determining the presence or absence of a cell outputting an indefinite value before verification.

As described above, according to the embodiments, a relative evaluation value on a first output-through time of a circuit model based on a driving capability value and a lumped-constant capacitance value and a second output-through time of the circuit model based on the driving capability value, the lumped-constant capacitance value, and an input capacitance value is calculated to determine the calculated evaluation value to be an output-through time correcting coefficient.

As a result, an output-through time correcting coefficient capable of correcting an output-through time into a proper output-through time is automatically calculated. This allows a user to correct an output-through time of a cell in the circuit-under-design using an output-through time correcting coefficient, and thus modify the output-through time of the cell into a proper output-through time according to the driving capability value of the cell and a cell immediately downstream. Hence, the accuracy of output-through time estimation is improved. The user is able to verify a nonlinear output waveform, enabling improvement of the verification accuracy.

An output-through time of a cell in the circuit-under-design is corrected using an output-through time correcting coefficient to automatically calculate a corrected output-through time of the cell. As a result, an output-through time of each cell in the circuit-under-design is corrected into a proper output-through time. This improves the accuracy of estimation of the output-through time of the cell. The user is able to verify a nonlinear output waveform, enabling improved verification accuracy.

Whether an output-through time of a cell in the circuit-under-design is to be corrected using an output-through time correcting coefficient is determined, and if correction is determined, the output-through time of the cell is corrected. This enables automatic specification of a cell requiring correction to correct the output-through time of the cell into a proper output-through time. This improves the accuracy of estimation of the output-through time of the cell, thus improves verification accuracy. A cell having a proper output-through time is not corrected.

An output-through time correcting coefficient is linearly approximated for each driving capacity value and input capacitance value to calculate a correction equation. As a result, whatever a lumped-constant capacitance value for a cell in the circuit-under-design may be, the user corrects an output-through time of the cell in the circuit-under-design using the output-through time correcting equation to be able to easily modify the output-through time of the cell into a proper output-through time. This improves the accuracy of estimation of the output-through time of the cell, and thus improves verification accuracy.

A lumped-constant capacitance value is given to an output-through time correcting equation calculated by linearly approximating an output-through time correcting coefficient to be able to easily calculate an output-through time correcting coefficient corresponding to an output-through time of a cell in the circuit-under-design. As a result, whatever a lumped-constant capacitance value for the cell in the circuit-under-design may be, the output-through time of the cell is modified easily into a proper output-through time through correction using the output-through time correcting equation. This improves the accuracy of estimation of the output-through time of the cell, and improves verification accuracy.

A determination is made on whether to correct an output-through time of a cell in the circuit-under-design using an output-through time correcting coefficient calculated based on an output-through time correcting equation. If correction is determined, the output-through time of the cell is corrected. As a result, a cell requiring correction is automatically specified, and whatever a lumped-constant capacitance value for the cell in the circuit-under-design may be, the cell is corrected easily. Hence, a cell having a proper output-through time is not corrected in output-through time while a cell having an improper output-through time is corrected in output-through time. This improves the accuracy of estimation of the output-through time of the cell.

Whether a cell in the circuit-under-design propagates an indefinite value is determined. If the cell is determined to not propagate an indefinite value, an output-through time of the cell is corrected. If the cell is determined to propagate an indefinite value, the output-through time of the cell is converted into a value enabling verification of indefinite value propagation.

As a result, a cell outputting an indefinite value is automatically specified to automatically convert an output-through time of the specified cell into a value enabling verification of indefinite value propagation, while a cell not outputting an indefinite value is automatically specified to amend the specified cell. This enables correction the output-through time of the cell into a proper output-through time, improving the accuracy of estimation of the output-through time of the cell, and determining the presence or absence of a cell outputting an indefinite value before verification.

The design support method described in the present embodiments may be implemented by executing a prepared program on a computer such as a personal computer and a workstation. The program is stored on a computer-readable recording medium such as a hard disk, a flexible disk, a CD-ROM, an MO, and a DVD, read out from the recording medium, and executed by the computer. The program may be a transmission medium that may be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing therein a design support program that causes a processor, which has access to a simulator simulating a circuit model, to execute a process comprising:

inputting a driving capability value, a lumped-constant capacitance value, and an input capacitance value that is part of the lumped-constant capacitance value, each value being defined in the circuit model, and further inputting a first delay time of the circuit model, based on the driving capability value and the lumped-constant capacitance value;

setting in the circuit model, the driving capability value, the lumped-constant capacitance value, and the input capacitance value that are input at the inputting;

acquiring from the simulator, a second delay time of the circuit model resulting from simulation by the simulator, by providing to the simulator, the circuit model having values set therein at the setting;

calculating a relative evaluation value for the first delay time input at the inputting and the second delay time acquired at the acquiring; and storing to a storage apparatus, the calculated relative evaluation value as a delay time correcting coefficient, the calculated relative evaluation value being correlated with the driving capability value, the lumped-constant capacitance value, and the input capacitance value.

2. The non-transitory computer-readable recording medium according to claim 1 and storing therein the design support program causing the processor to execute the process further comprising:
  inputting a driving capability value of an arbitrary subject cell described in circuit information of a circuit-under-design, an input capacitance value of a cell immediately downstream from the subject cell, and a delay time of the subject cell;
  retrieving from among delay time correcting coefficients stored to the storage apparatus at the storing, a delay time correcting coefficient corresponding to the driving capability value of the subject cell and the input capacitance value of the cell immediately downstream;
  calculating a corrected delay time of the subject cell, based on the input delay time of the subject cell and the retrieved delay time correcting coefficient; and
  outputting the corrected delay time of the subject cell.

3. The non-transitory computer-readable recording medium according to claim 2 and storing therein the design support program causing the processor to execute the process further comprising determining whether to correct the delay time of the subject cell, based on a given threshold, wherein
  the calculating includes calculating a relative evaluation value for the delay time of the subject cell and the corrected delay time,
  the determining includes determining whether to correct the delay time of the subject cell, based on whether the relative evaluation value for the delay time of the subject cell and the corrected delay time is at least equal to the given threshold, and
  the calculating includes calculating the corrected delay time of the subject cell, based on the retrieved delay time correcting coefficient, if at the determining correction of the delay time of the subject cell is determined.

4. The non-transitory computer-readable recording medium according to claim 2 and storing therein the design support program causing the processor to execute the process further comprising converting the delay time of the subject cell into a value to which an indefinite value is propagated, wherein
  the determining includes determining whether to correct the delay time of the subject cell, based on whether a relative evaluation value for the delay time of the subject cell and the corrected delay time is at least equal to a given threshold related to indefinite value propagation,
  the converting includes converting the delay time of the subject cell into the value to which an indefinite value is propagated, if the delay time of the subject cell is determined to not be correctable at the determining, and
  the outputting includes outputting a conversion result obtained at the converting.

5. The non-transitory computer-readable recording medium according to claim 1 and storing therein the design support program causing the processor to execute the process further comprising:
  extracting a delay time correcting coefficient corresponding to the driving capability value and the input capacitance value, from among delay time correcting coefficients stored at the storing; and
  calculating a delay time correcting equation by linearly approximating the extracted delay time correcting coefficient, wherein the storing includes storing the calculated delay time correcting equation to the storage unit.

6. The non-transitory computer-readable recording medium according to claim 5 and storing therein the design support program causing the processor to execute the process further comprising:
  inputting a driving capability value of an arbitrary subject cell described in circuit information of a circuit-under-design, an input capacitance value of a cell immediately downstream from the subject cell, a delay time of the subject cell, and a lumped-constant capacitance value including the input capacitance value of the cell immediately downstream;
  retrieving from among delay time correcting equations stored to the storage apparatus at the storing, a delay time correcting equation corresponding to the driving capability value of the subject cell and the input capacitance value of the cell immediately downstream;
  calculating a delay time correcting coefficient by substituting the lumped-constant capacitance value into the retrieved delay time correcting equation;
  calculating a corrected delay time of the subject cell, based on the input delay time of the subject cell and the calculated delay time correcting coefficient; and
  outputting the corrected delay time of the subject cell.

7. The non-transitory computer-readable recording medium according to claim 6 and storing therein the design support program causing the processor to execute the process further comprising determining whether to correct the delay time using a correction equation, based on whether a relative evaluation value for the delay time of the subject cell and the corrected delay time is at least equal to a given threshold related to the correction equation, wherein
  the calculating the delay time correcting coefficient includes substituting the lumped-constant capacitance value into the delay time correcting equation to calculate the delay time correcting coefficient, if correction using the correction equation is determined at the determining, and
  the calculating the corrected delay time includes correcting the delay time of the subject cell, based on the delay time of the subject cell and the delay time correcting coefficient calculated at the calculating the delay time correcting coefficient by substituting the lumped-constant capacitance value.

8. A non-transitory computer-readable recording medium storing therein a design support program that causes a processor, which has access to a simulator simulating a circuit model, to execute a process comprising:
  inputting a driving capability value, a lumped-constant capacitance value, and an input capacitance value that is part of the lumped-constant capacitance value, each value being defined in the circuit model, and further inputting a first output-through time of the circuit model, based on the driving capability value and the lumped-constant capacitance value;
  setting in the circuit model, the driving capability value, the lumped-constant capacitance value, and the input capacitance value that are input at the inputting;
  acquiring from the simulator, a second output-through time of the circuit model resulting from simulation by the simulator, by providing to the simulator, the circuit model having values set therein at the setting;
  calculating a relative evaluation value for the first delay time input at the inputting and the second output-through time acquired at the acquiring; and storing to a storage apparatus, the calculated relative evaluation value as an output-through time correcting coefficient, the calculated relative evaluation value being correlated with the driving capability value, the lumped-constant capacitance value, and the input capacitance value.

9. The non-transitory computer-readable recording medium according to claim 8 and storing therein the design support program causing the processor to execute the process further comprising:
   inputting a driving capability value of an arbitrary subject cell described in circuit information of a circuit-under-design, an input capacitance value of a cell immediately downstream from the subject cell, and an output-through time of the subject cell;
   retrieving from among output-through time correcting coefficients stored to the storage apparatus at the storing, an output-through time correcting coefficient corresponding to the driving capability value of the subject cell and the input capacitance value of the cell immediately downstream;
   calculating a corrected output-through time of the subject cell, based on the input output-through time of the subject cell and the retrieved output-through time correcting coefficient; and
   outputting the corrected output-through time of the subject cell.

10. The non-transitory computer-readable recording medium according to claim 9 and storing therein the design support program causing the processor to execute the process further comprising determining whether to correct the output-through time of the subject cell, based on a given threshold, wherein
   the calculating includes calculating a relative evaluation value for the output-through time of the subject cell and the corrected output-through time,
   the determining includes determining whether to correct the output-through time of the subject cell, based on whether the relative evaluation value for the output-through time of the subject cell and the corrected output-through time is at least equal to the given threshold, and
   the calculating includes calculating the corrected output-through time of the subject cell, based on the retrieved output-through time correcting coefficient, if at the determining correction of the output-through time of the subject cell is determined.

11. The non-transitory computer-readable recording medium according to claim 9 and storing therein the design support program causing the processor to execute the process further comprising converting the output-through time of the subject cell into a value to which an indefinite value is propagated, wherein
   the determining includes determining whether to correct the output-through time of the subject cell, based on whether a relative evaluation value for the output-through time of the subject cell and the corrected output-through time is at least equal to a given threshold related to indefinite value propagation,
   the converting includes converting the output-through time of the subject cell into the value to which an indefinite value is propagated, if the output-through time of the subject cell is determined to not be correctable at the determining, and
   the outputting includes outputting a conversion result obtained at the converting.

12. The non-transitory computer-readable recording medium according to claim 8 and storing therein the design support program causing the processor to execute the process further comprising:
   extracting an output-through time correcting coefficient corresponding to the driving capability value and the input capacitance value, from among output-through time correcting coefficients stored at the storing; and
   calculating an output-through time correcting equation by linearly approximating the extracted output-through time correcting coefficient, wherein
   the storing includes storing the calculated output-through time correcting equation to the storage unit.

13. The non-transitory computer-readable recording medium according to claim 12 and storing therein the design support program causing the processor to execute the process further comprising:
   inputting a driving capability value of an arbitrary subject cell described in circuit information of a circuit-under-design, an input capacitance value of a cell immediately downstream from the subject cell, an output-through time of the subject cell, and a lumped-constant capacitance value including the input capacitance value of the cell immediately downstream;
   retrieving from among output-through time correcting equations stored to the storage apparatus at the storing, an output-through time correcting equation corresponding to the driving capability value of the subject cell and the input capacitance value of the cell immediately downstream;
   calculating an output-through time correcting coefficient by substituting the lumped-constant capacitance value into the retrieved output-through time correcting equation;
   calculating a corrected output-through time of the subject cell, based on the input output-through time of the subject cell and the calculated output-through time correcting coefficient; and
   outputting the corrected output-through time of the subject cell.

14. The non-transitory computer-readable recording medium according to claim 13 and storing therein the design support program causing the processor to execute the process further comprising determining whether to correct the output-through time using a correction equation, based on whether a relative evaluation value for the output-through time of the subject cell and the corrected output-through time is at least equal to a given threshold related to the correction equation, wherein
   the calculating the output-through time correcting coefficient includes substituting the lumped-constant capacitance value into the output-through time correcting equation to calculate the output-through time correcting coefficient, if correction using the correction equation is determined at the determining, and
   the calculating the corrected output-through time includes correcting the output-through time of the subject cell, based on the output-through time of the subject cell and the output-through time correcting coefficient calculated at the calculating the output-through time correcting coefficient by substituting the lumped-constant capacitance value.

15. A design support apparatus having access to a simulator simulating a circuit model and comprising:
   a circuit model information input unit that inputs a driving capability value, a lumped-constant capacitance value, and an input capacitance value that is part of the lumped-constant capacitance value, each value being defined in the circuit model, the circuit model information input unit further inputting a first delay time of the circuit model, based on the driving capability value and the lumped-constant capacitance value;
a setting unit that sets in the circuit model, the driving capability value, the lumped-constant capacitance value, and the input capacitance value that are input by the circuit model information input unit;
an acquiring unit that provides the circuit model having values set therein by the setting unit to the simulator to acquire from the simulator, a second delay time of the circuit model resulting from simulation by the simulator;
an evaluation value calculating unit that calculates a relative evaluation value for the first delay time input by the circuit model information input unit and the second delay time acquired by the acquiring unit; and
a storing unit that correlates the calculated relative evaluation value with the driving capability value, the lumped-constant capacitance value, and the input capacitance value to store in a storage apparatus, the correlated relative evaluation value as a delay time correcting coefficient.

16. A design support apparatus having access to a simulator simulating a circuit model and comprising:
a circuit model information input unit that inputs a driving capability value, a lumped-constant capacitance value, and an input capacitance value that is part of the lumped-constant capacitance value, each value being defined in the circuit model, the circuit model information input unit further inputting a first output-through time of the circuit model, based on the driving capability value and the lumped-constant capacitance value;
a setting unit that sets in the circuit model, the driving capability value, the lumped-constant capacitance value, and the input capacitance value that are input by the circuit model information input unit;
an acquiring unit that provides the circuit model having values set therein by the setting unit to the simulator to acquire from the simulator, a second output-through time of the circuit model resulting from simulation by the simulator;
an evaluation value calculating unit that calculates a relative evaluation value for the first delay time input by the circuit model information input unit and the second output-through time acquired by the acquiring unit; and
a storing unit that correlates the calculated relative evaluation value with the driving capability value, the lumped-constant capacitance value, and the input capacitance value to store in a storage apparatus, the correlated relative evaluation value as an output-through time correcting coefficient.

* * * * *